United States Patent
Yang et al.

(10) Patent No.: US 11,690,209 B2
(45) Date of Patent: Jun. 27, 2023

(54) FIN-BASED WELL STRAPS FOR IMPROVING MEMORY MACRO PERFORMANCE

(71) Applicant: Taiwan Semiconductor Manufacturing Co., Ltd., Hsin-Chu (TW)

(72) Inventors: Chih-Chuan Yang, Hsinchu (TW); Kuo-Hsiu Hsu, Taoyuan County (TW); Feng-Ming Chang, Hsinchu County (TW); Wen-Chun Keng, Hsinchu (TW); Lien Jung Hung, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/984,983

(22) Filed: Aug. 4, 2020

(65) Prior Publication Data
US 2021/0098469 A1 Apr. 1, 2021

Related U.S. Application Data

(60) Provisional application No. 62/907,565, filed on Sep. 28, 2019.

(51) Int. Cl.
*H10B 10/00* (2023.01)
(52) U.S. Cl.
CPC ............. *H10B 10/12* (2023.02); *H10B 10/18* (2023.02)
(58) Field of Classification Search
CPC ........... H01L 21/823431; H01L 21/845; H01L 27/0886; H01L 27/0924; H01L 27/10826; H01L 27/10879; H01L 27/1211; H01L 29/41791; H01L 29/66795; H01L 29/785–7851; H01L 2924/13067; H01L 29/66636
See application file for complete search history.

(56) References Cited

U.S. PATENT DOCUMENTS

| | | |
|---|---|---|
| 8,796,666 B1 | 8/2014 | Huang et al. |
| 8,822,243 B2 | 9/2014 | Yan et al. |
| 8,987,142 B2 | 3/2015 | Lee et al. |
| 9,093,530 B2 | 4/2015 | Huang et al. |
| 9,053,279 B2 | 6/2015 | Chang et al. |
| 9,099,530 B2 | 8/2015 | Lin et al. |
| 9,153,478 B2 | 10/2015 | Liu et al. |
| 9,501,601 B2 | 11/2016 | Chang et al. |
| 9,548,303 B2 | 1/2017 | Lee et al. |
| 9,876,114 B2 | 1/2018 | Huang |
| 2009/0289307 A1 | 11/2009 | Fukui |

(Continued)

FOREIGN PATENT DOCUMENTS

TW 200707738 A 2/2007

*Primary Examiner* — Nelson Garces
(74) *Attorney, Agent, or Firm* — Haynes and Boone, LLP

(57) ABSTRACT

An integrated circuit device includes a FinFET disposed over a doped region of a first type dopant, wherein the FinFET includes a first fin structure and first source/drain (S/D) features, the first fin structure having a first width; and a fin-based well strap disposed over the doped region of the first type dopant, wherein the fin-based well strap includes a second fin structure and second S/D features, the second fin structure having a second width that is larger than the first width, wherein the fin-based well strap connects the doped region to a voltage.

20 Claims, 40 Drawing Sheets

(56) References Cited

U.S. PATENT DOCUMENTS

| | | |
|---|---|---|
| 2015/0011090 A1 | 1/2015 | Liang et al. |
| 2015/0228649 A1 | 8/2015 | Singh et al. |
| 2016/0181247 A1 | 6/2016 | Anderson et al. |
| 2019/0109193 A1* | 4/2019 | Liaw .................... H01L 29/165 |
| 2019/0288069 A1* | 9/2019 | Liaw ................... H01L 27/0924 |
| 2020/0161315 A1* | 5/2020 | Shen ................... H01L 27/1116 |

* cited by examiner

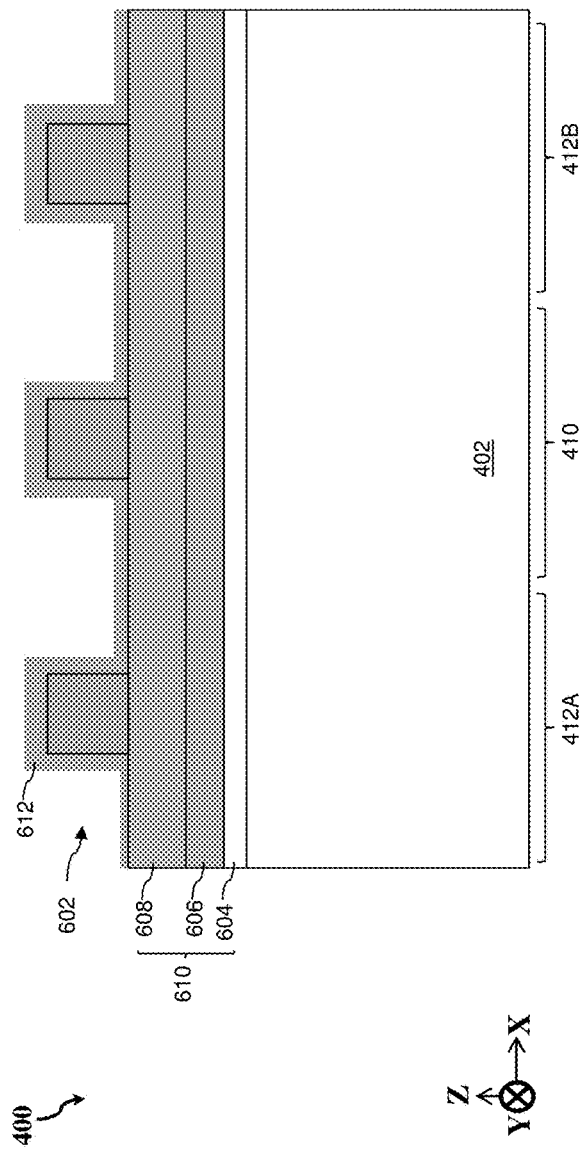
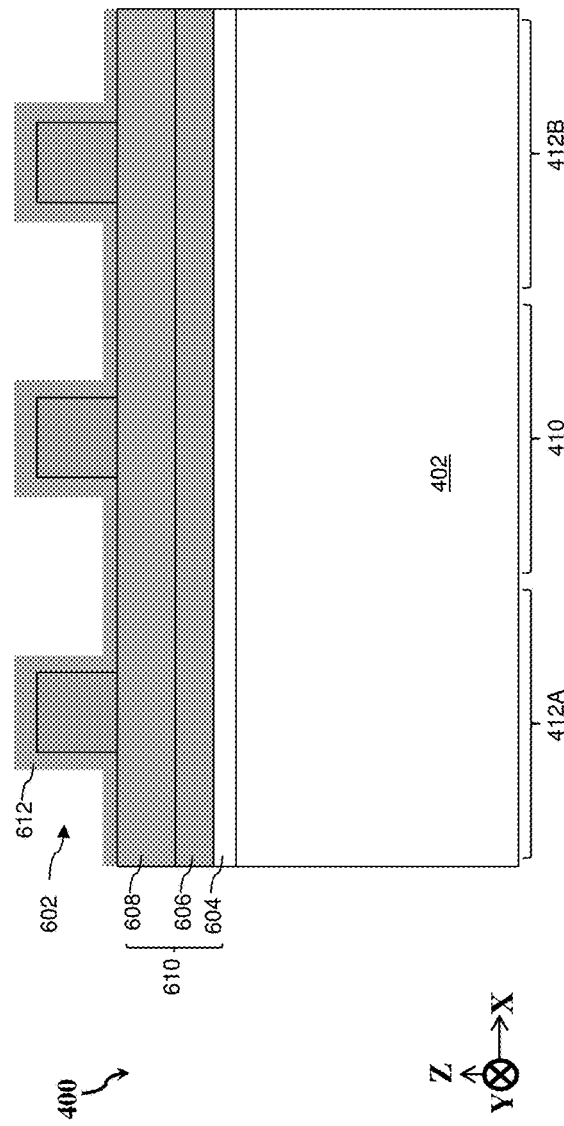
FIG. 7A
FIG. 7B

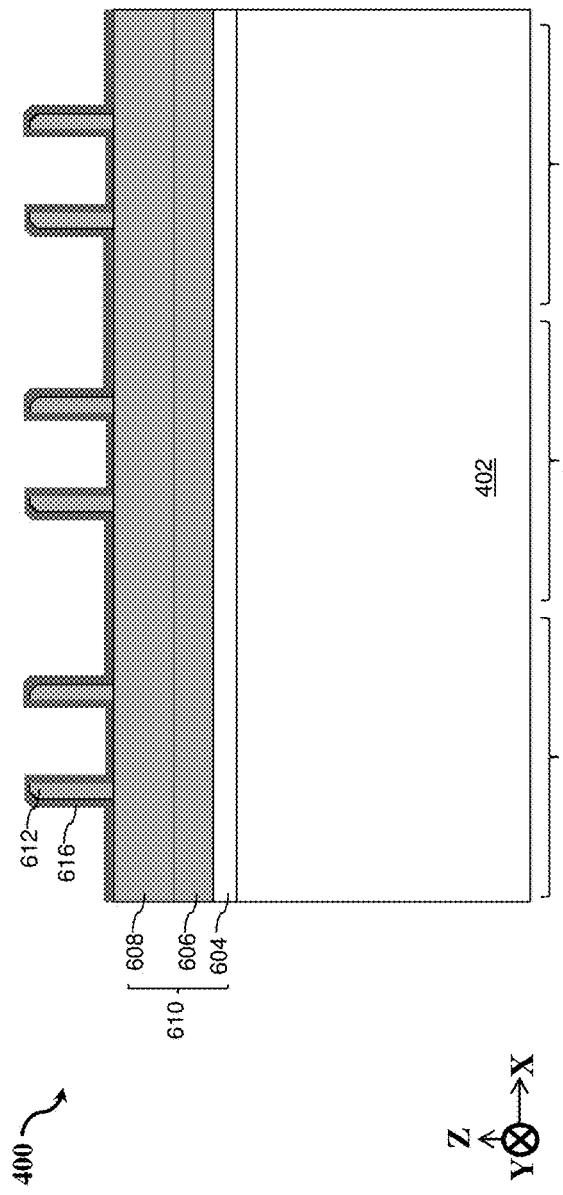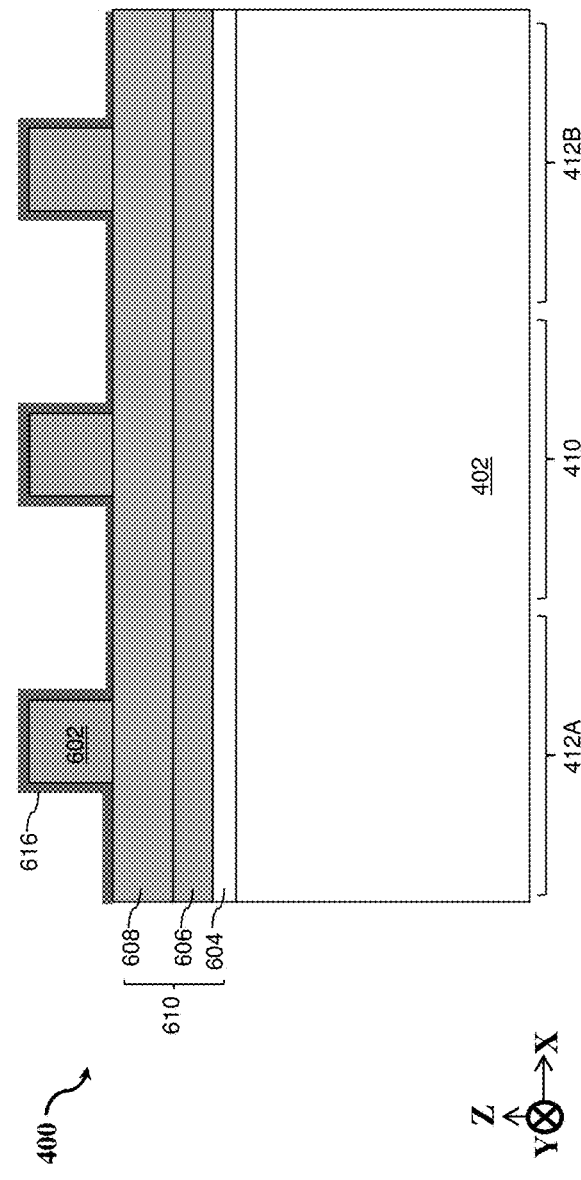

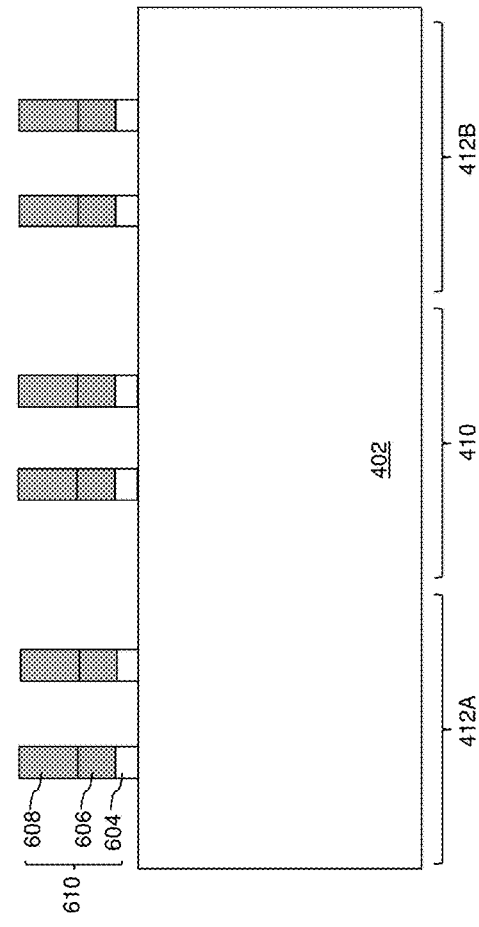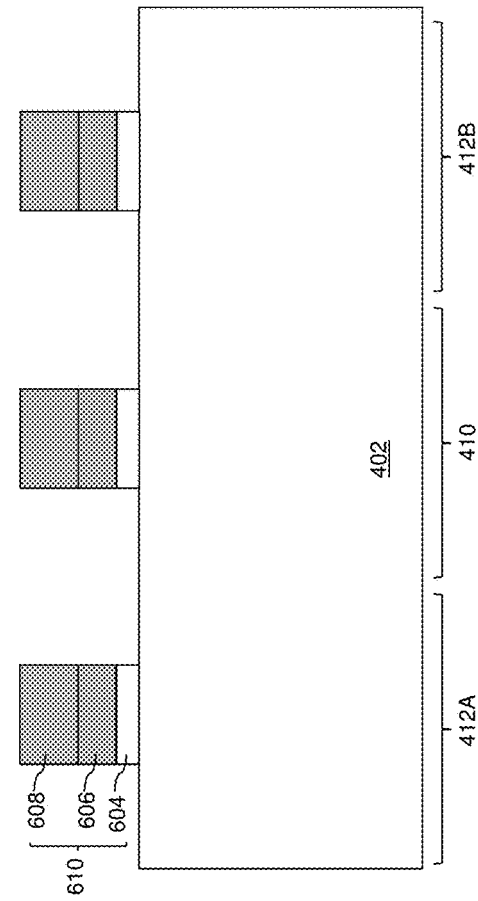

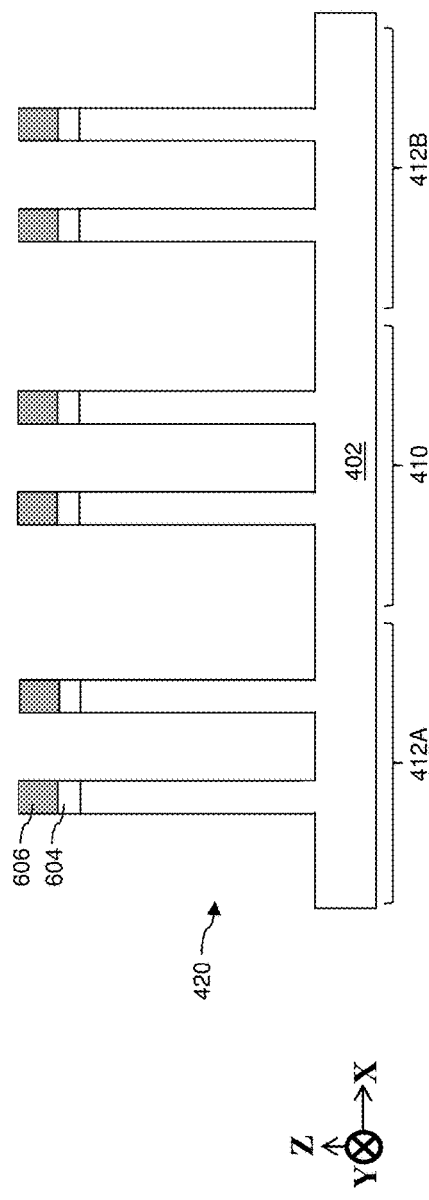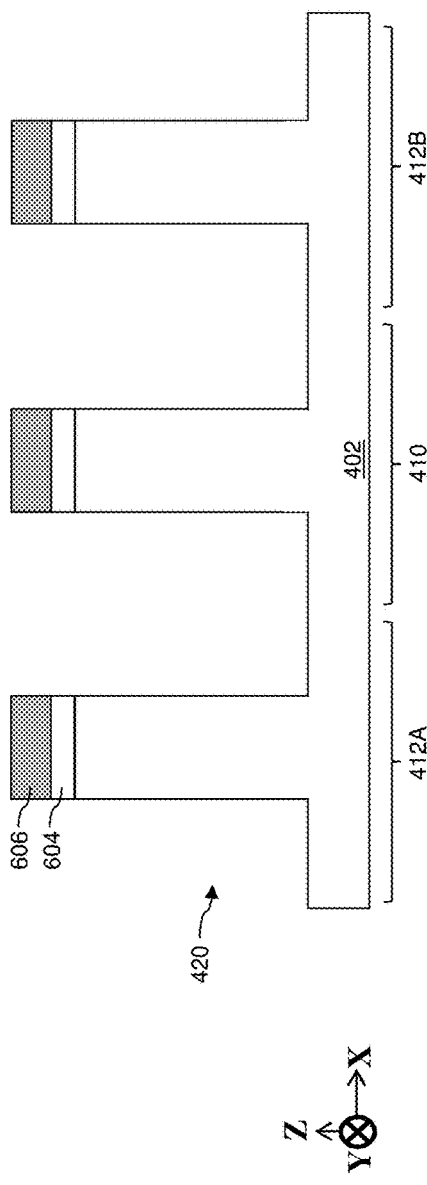

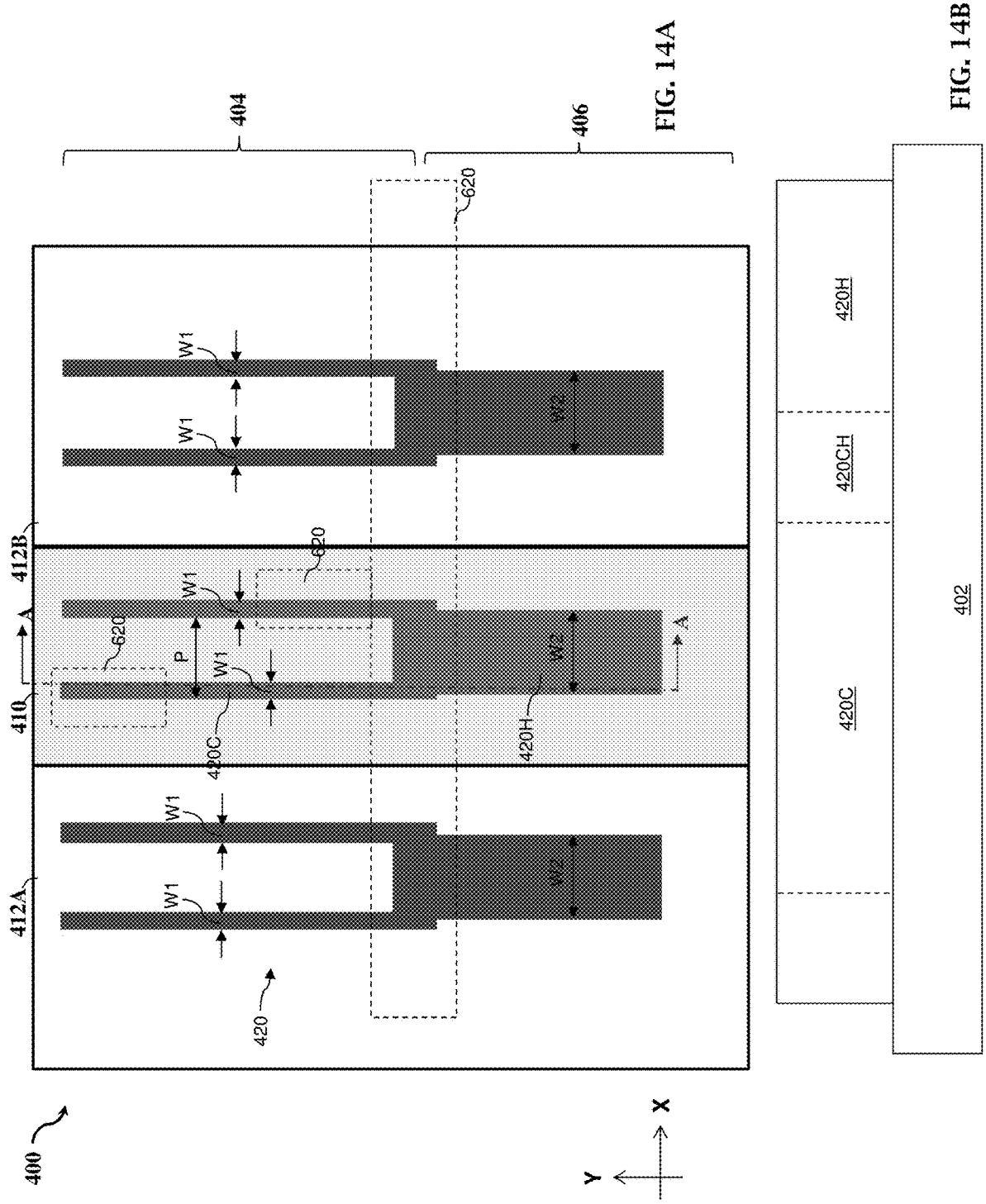

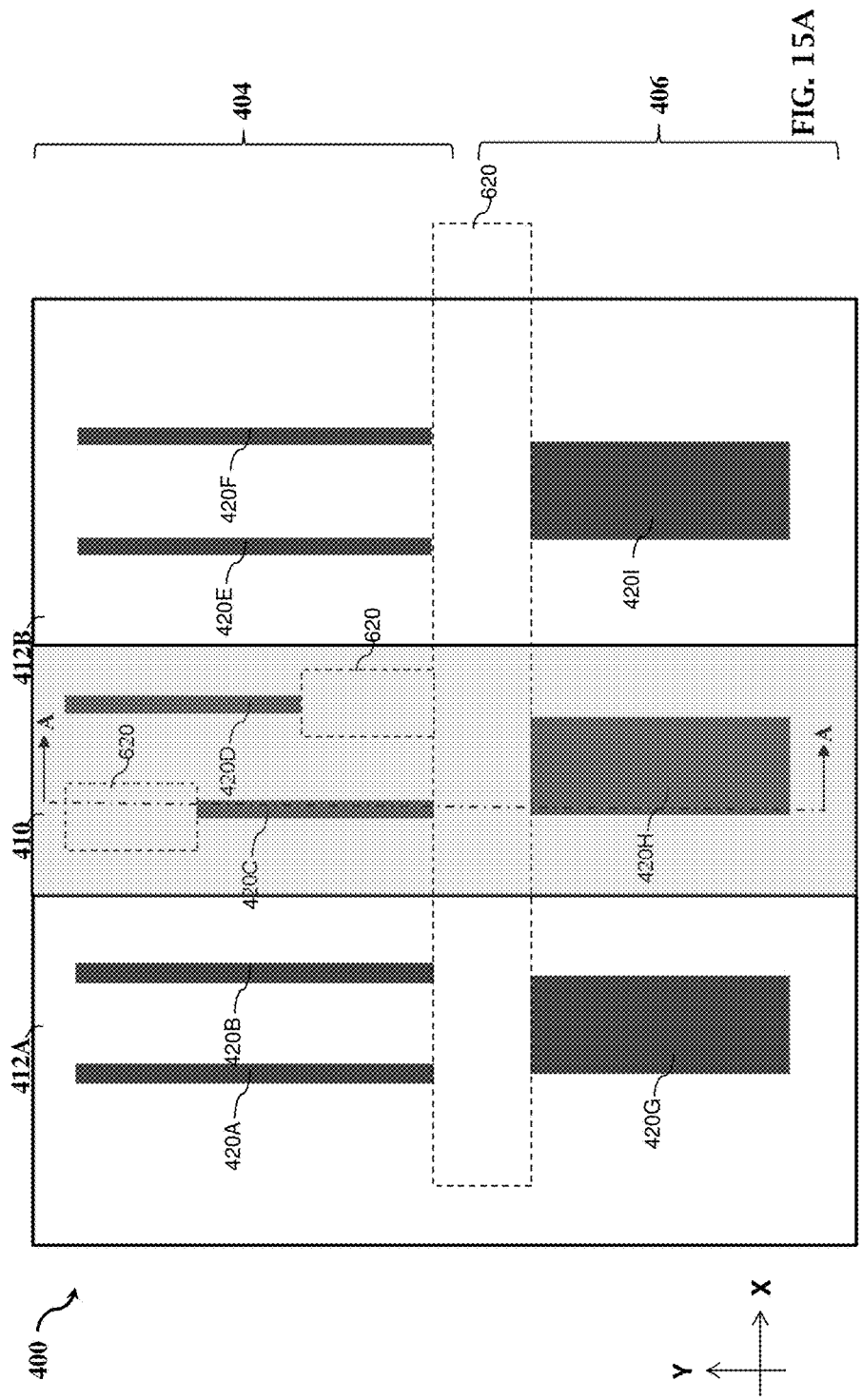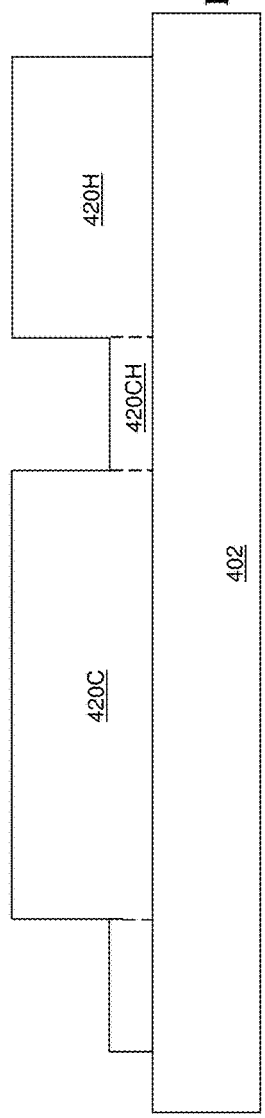
FIG. 15A
FIG. 15B

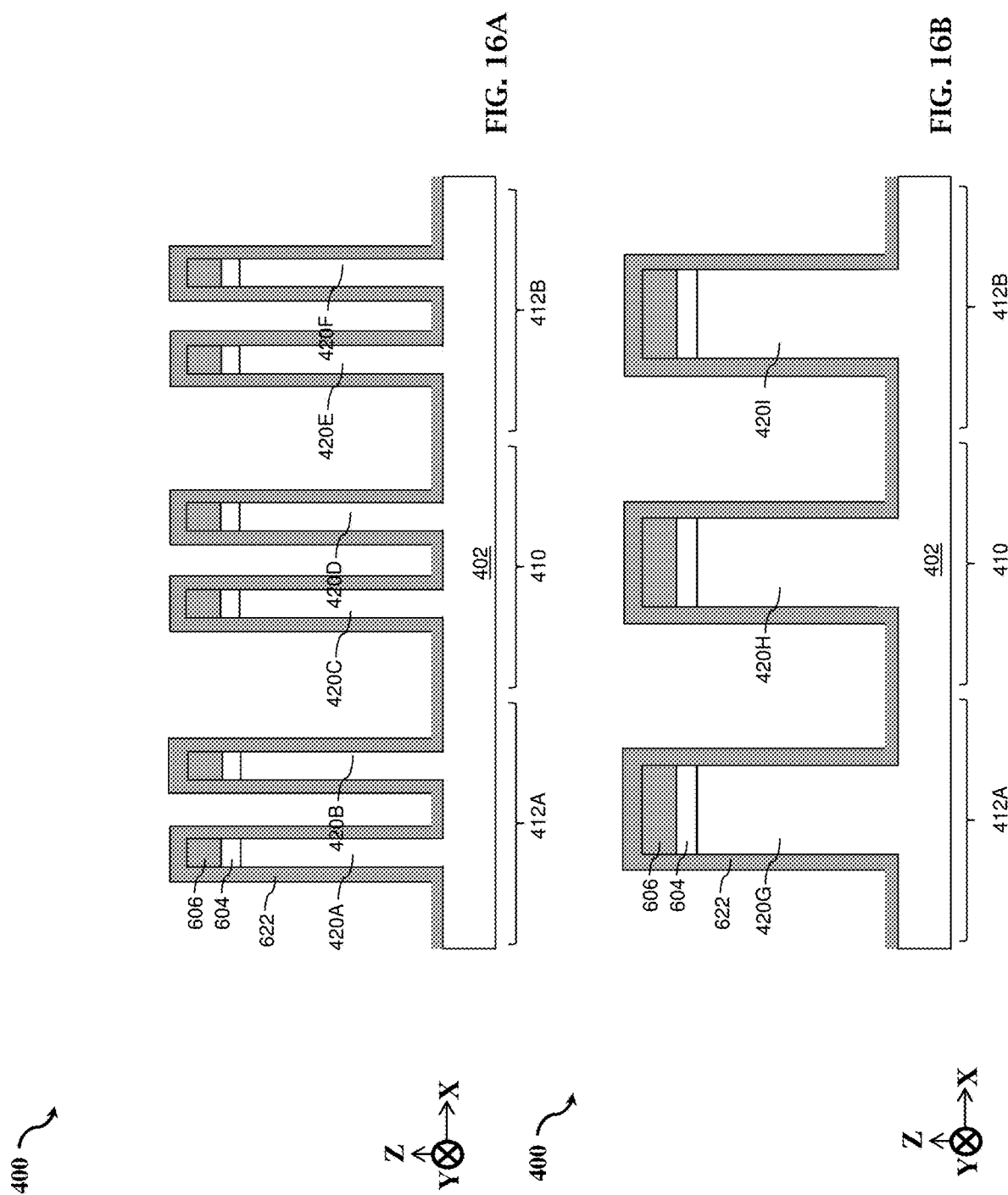

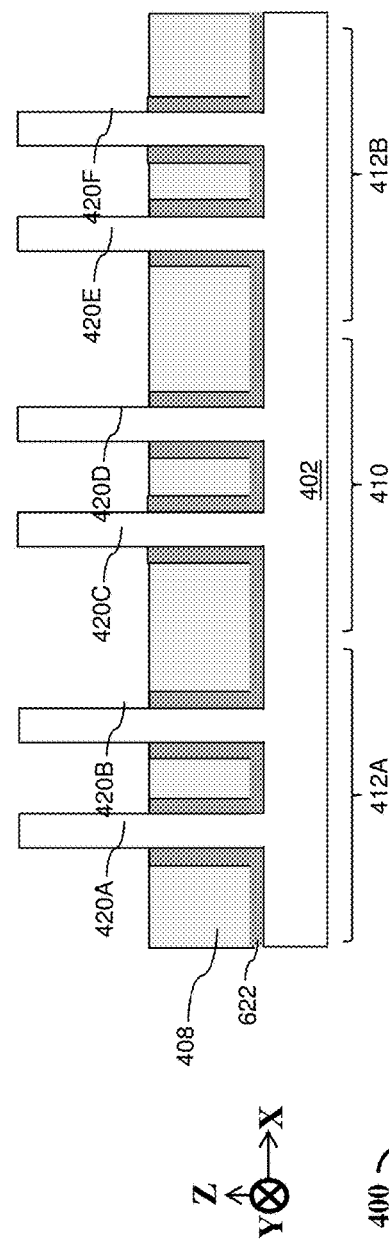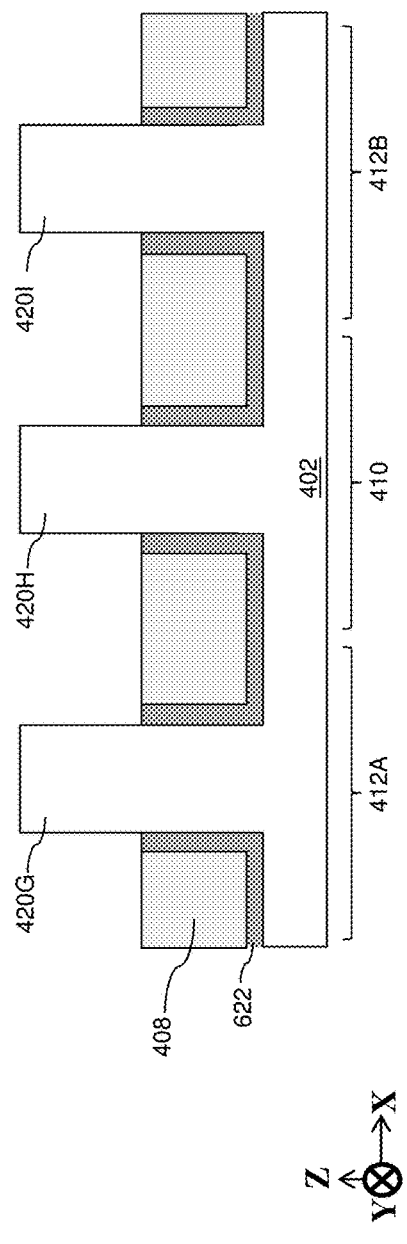

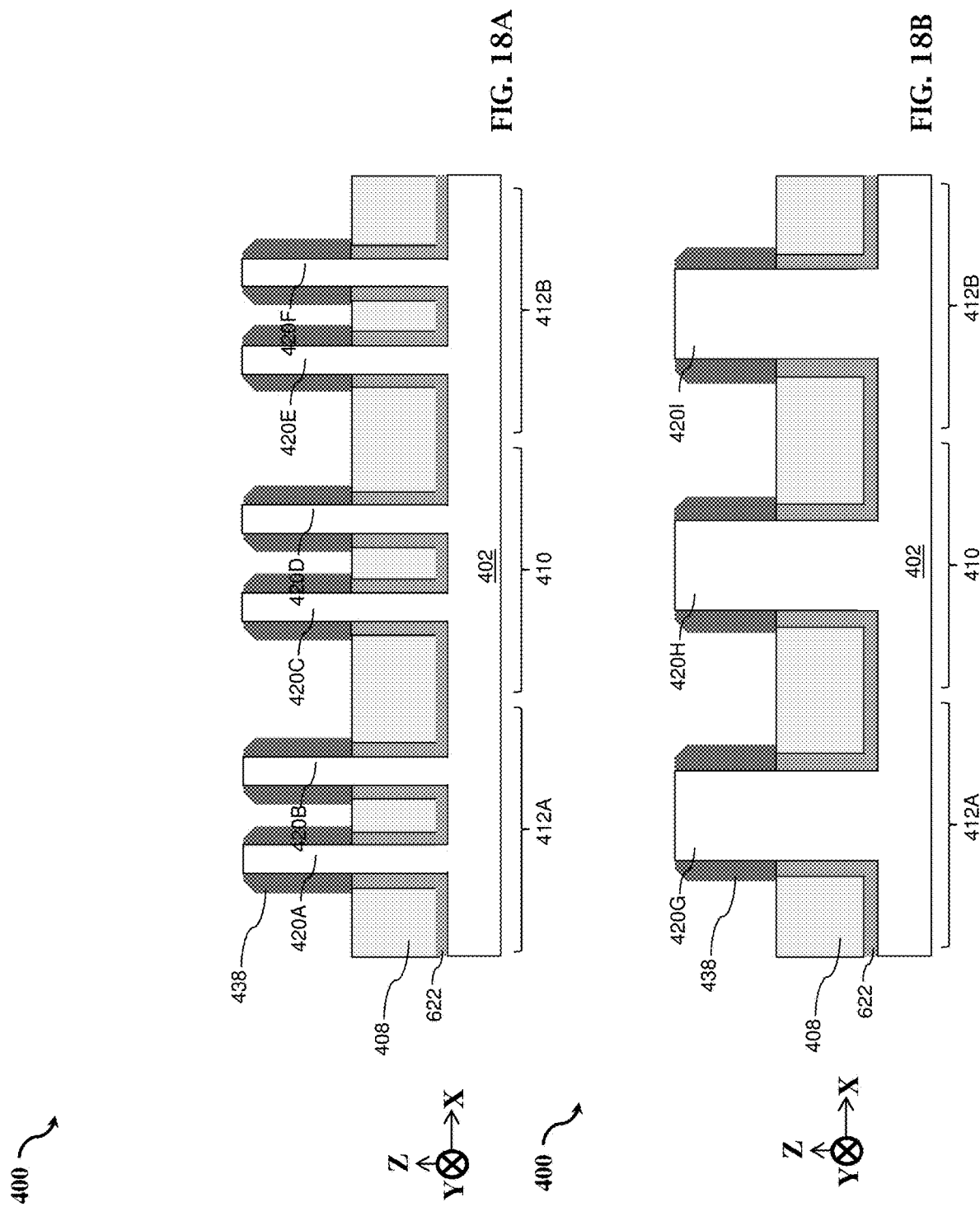

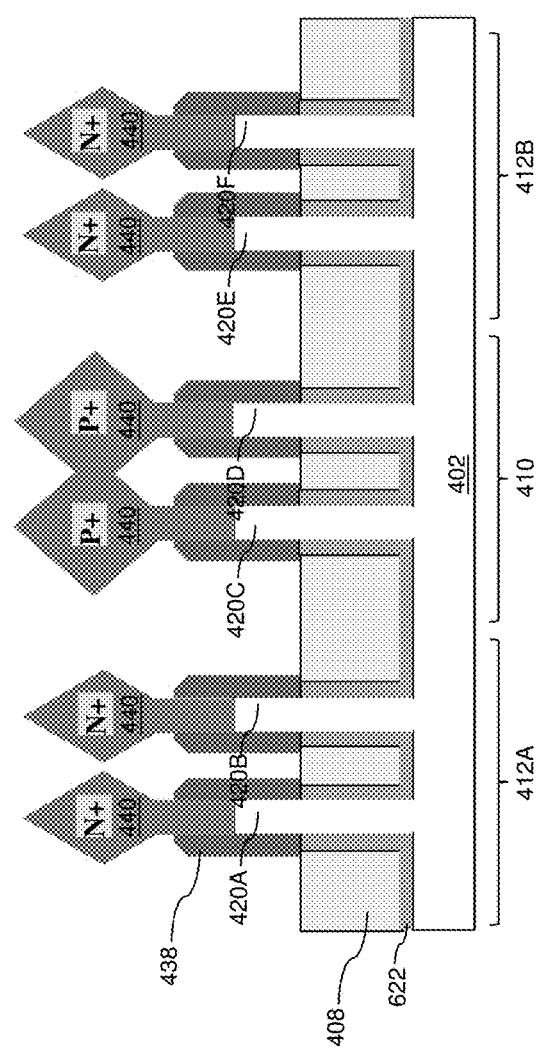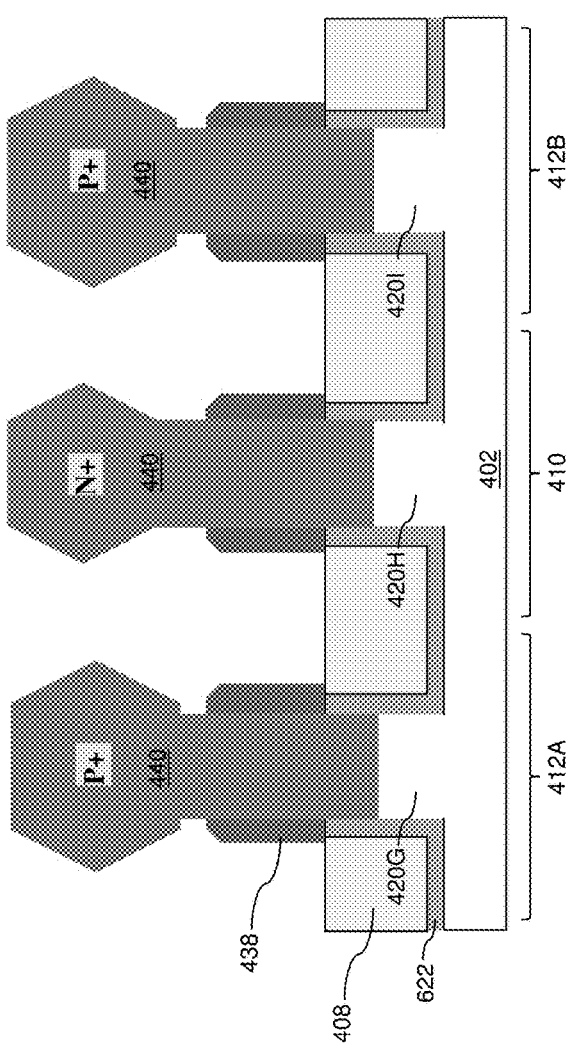

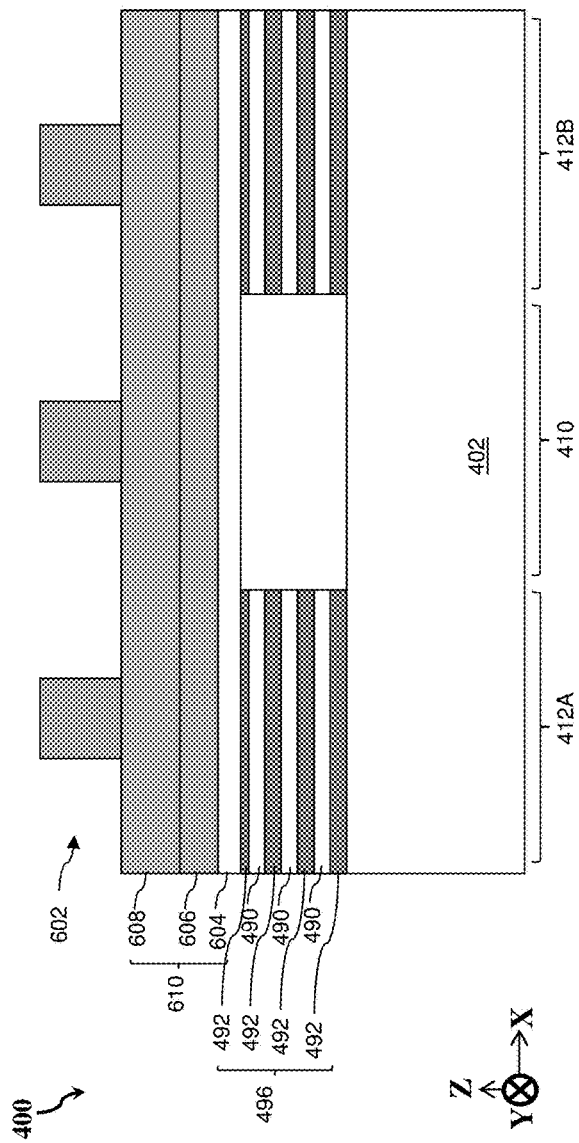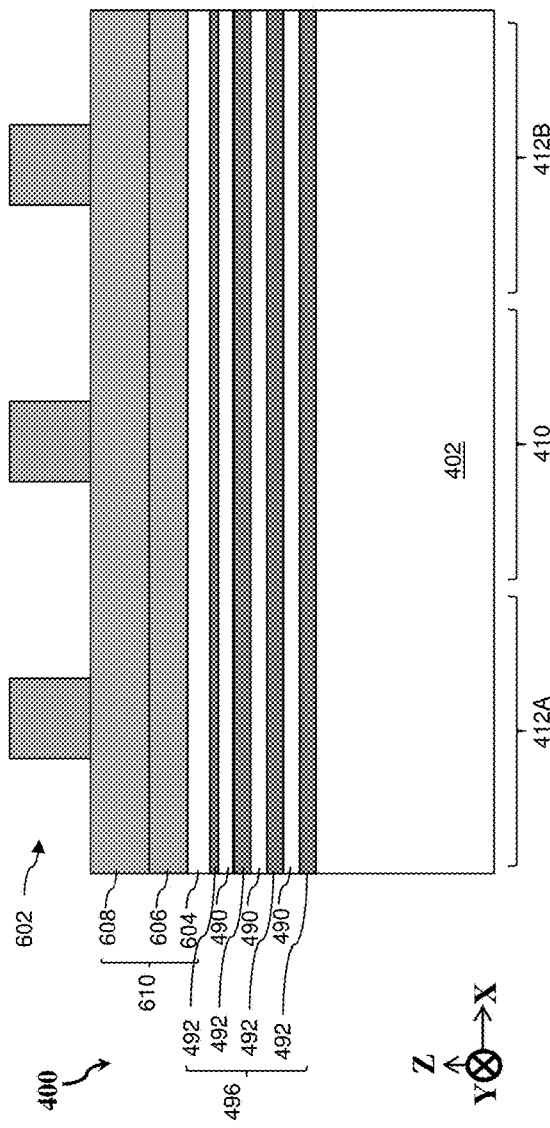

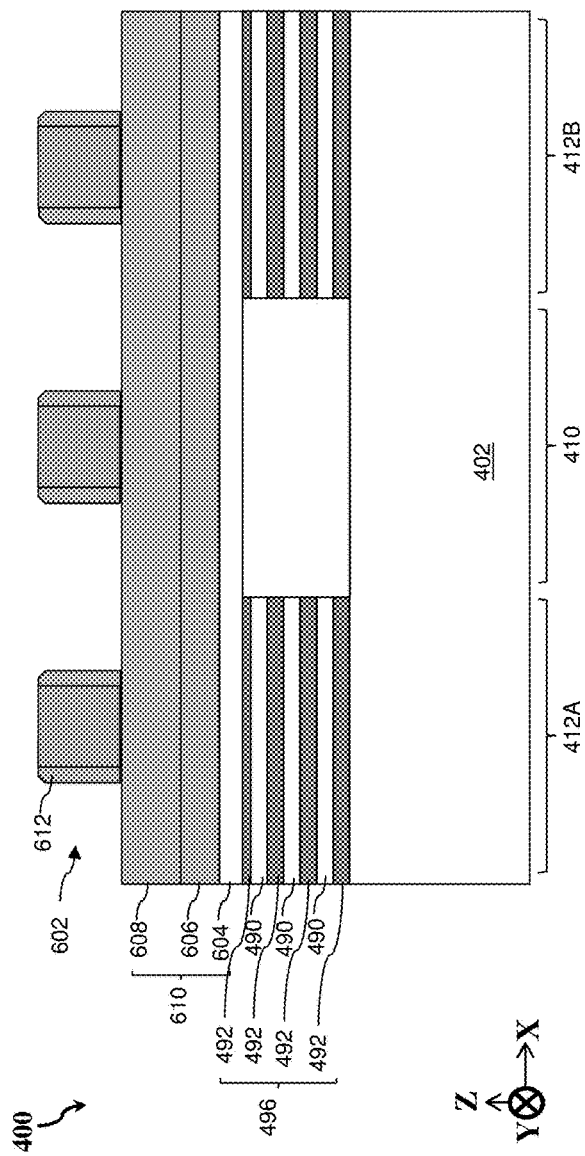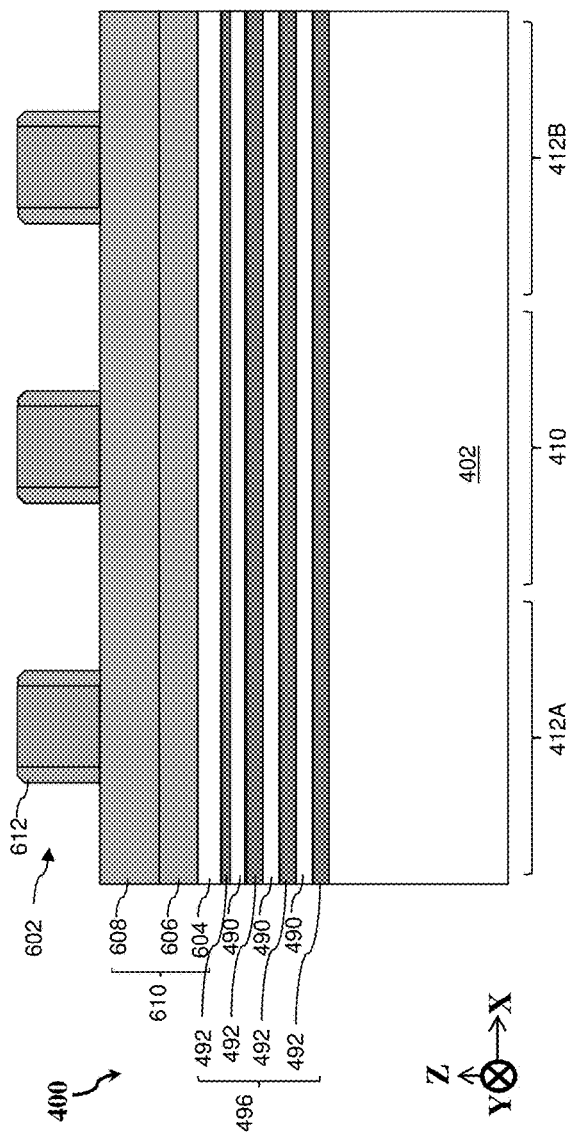

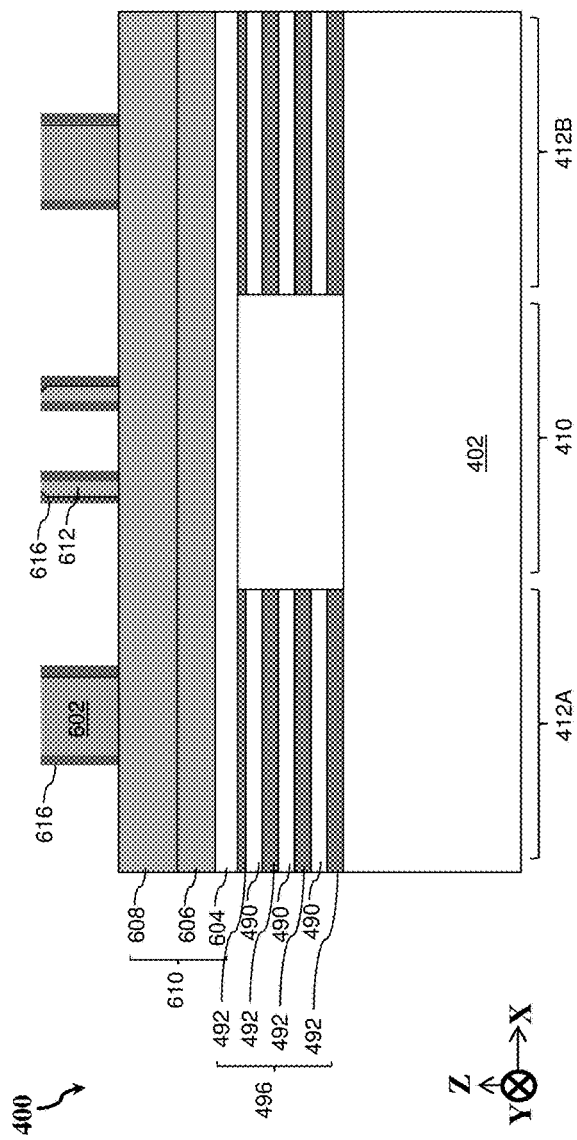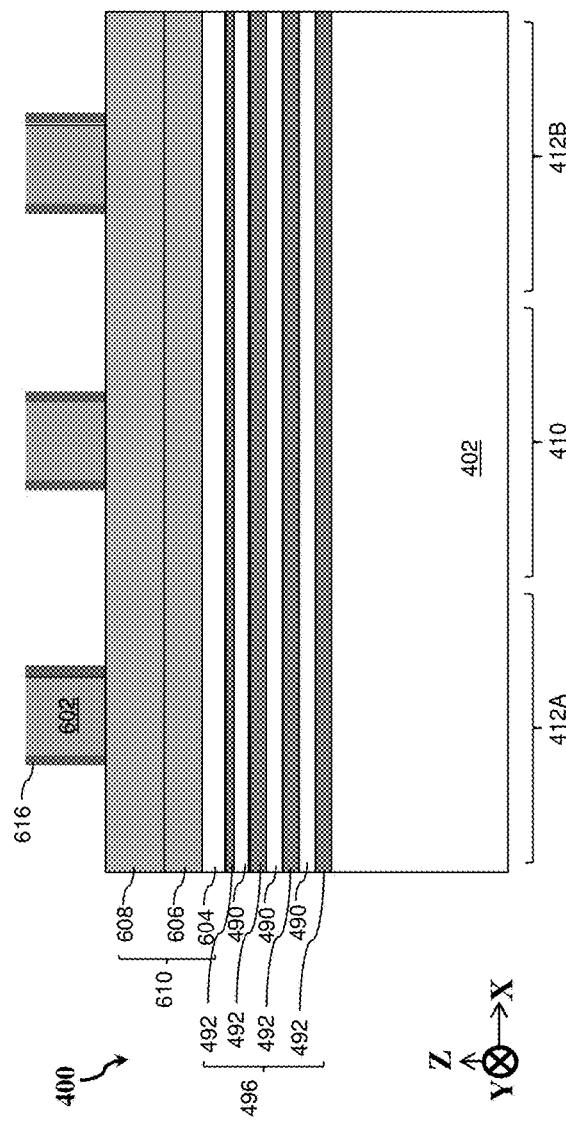

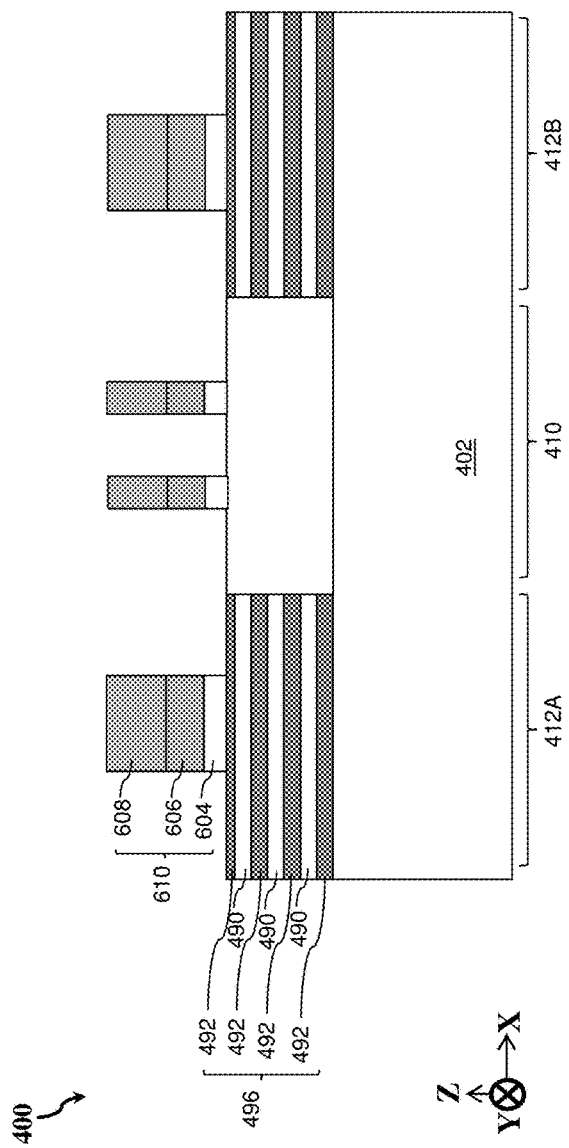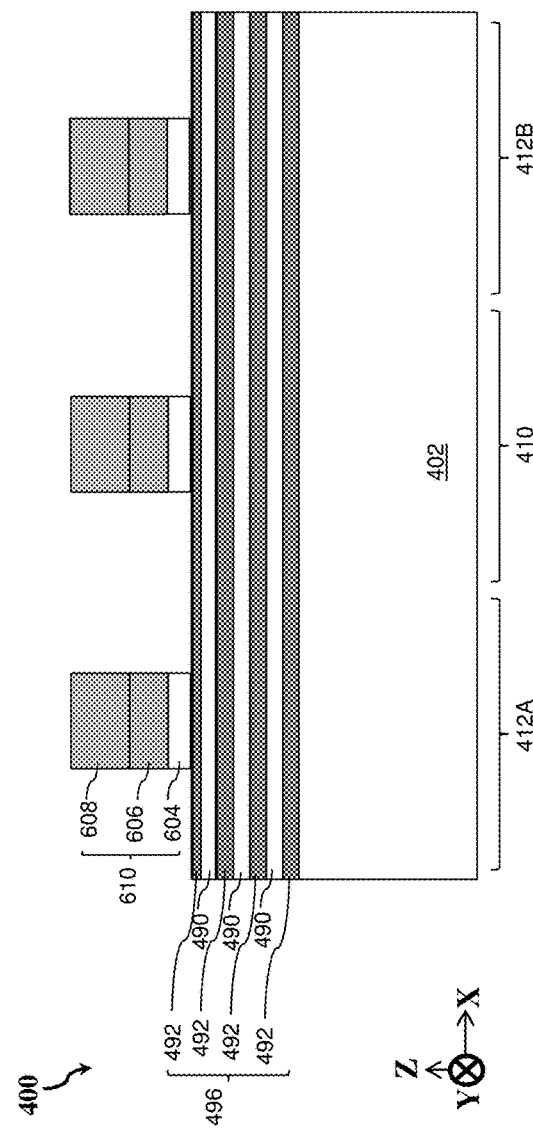

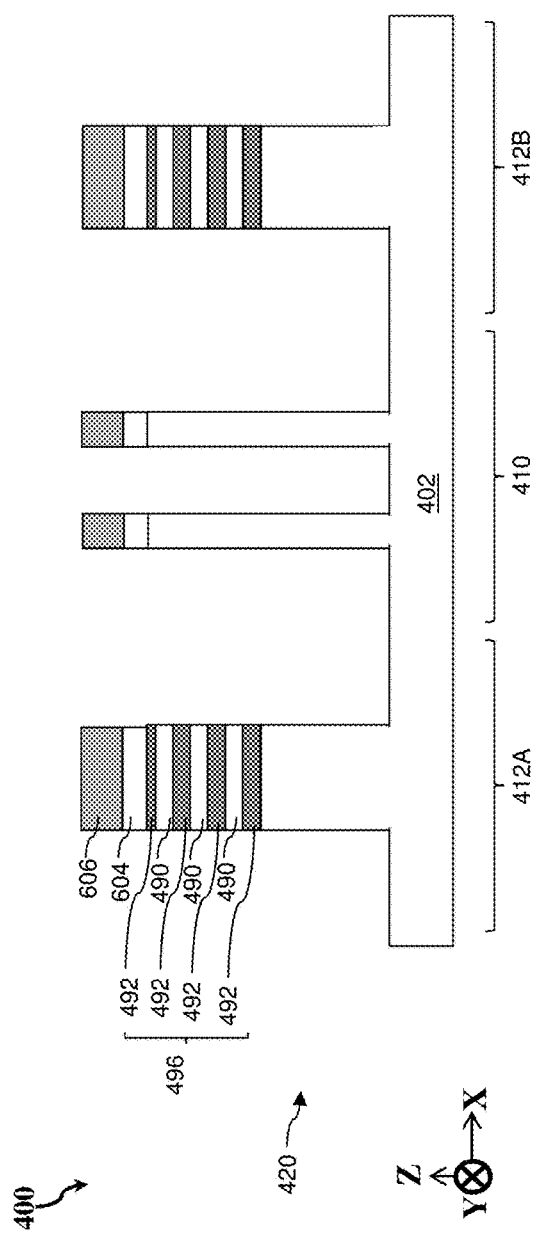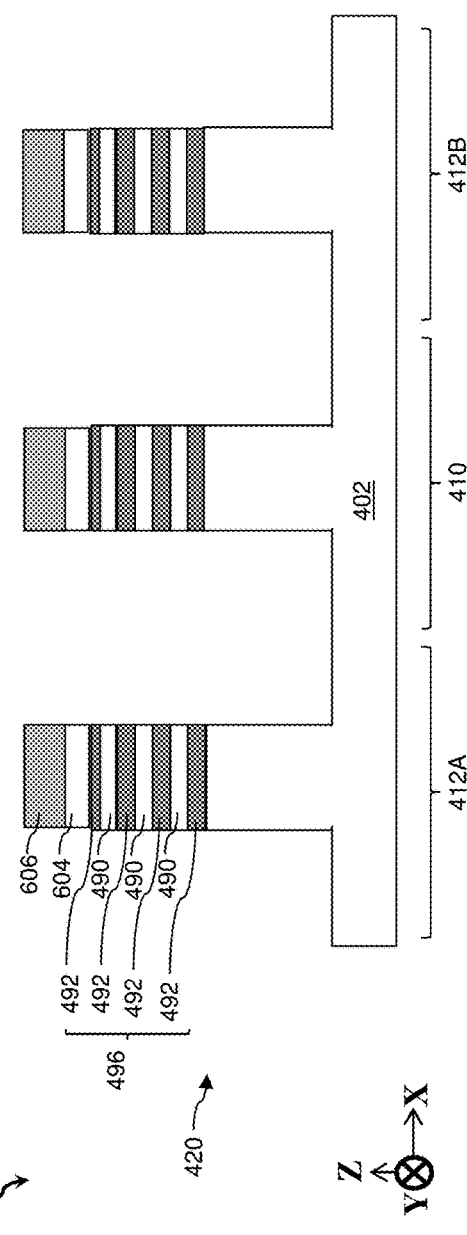
FIG. 27A
FIG. 27B

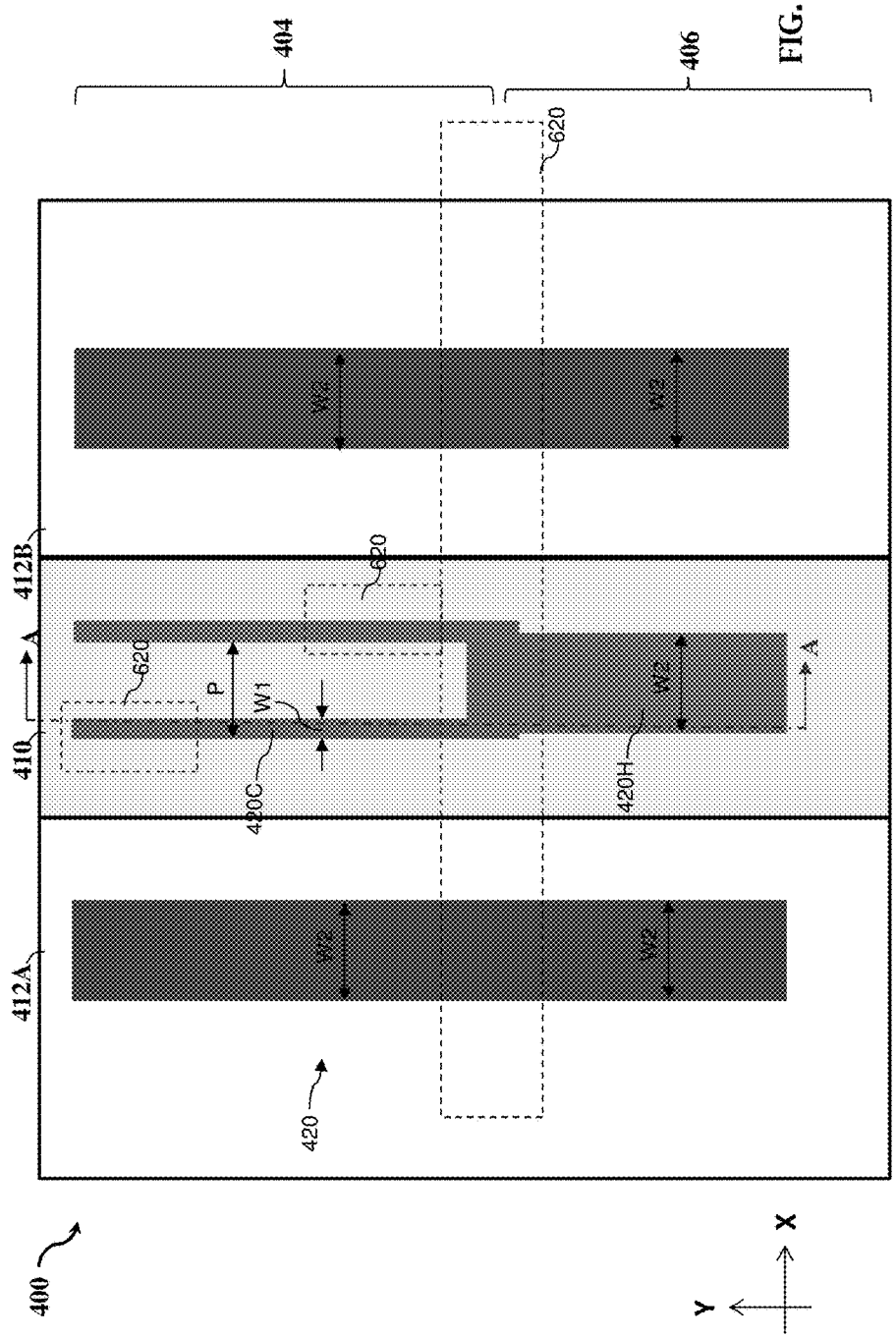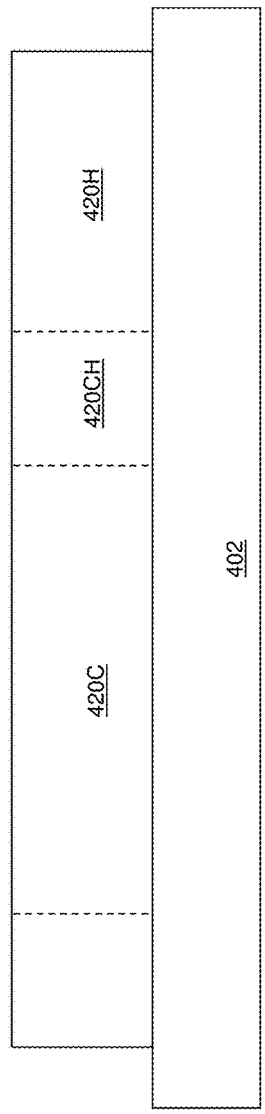

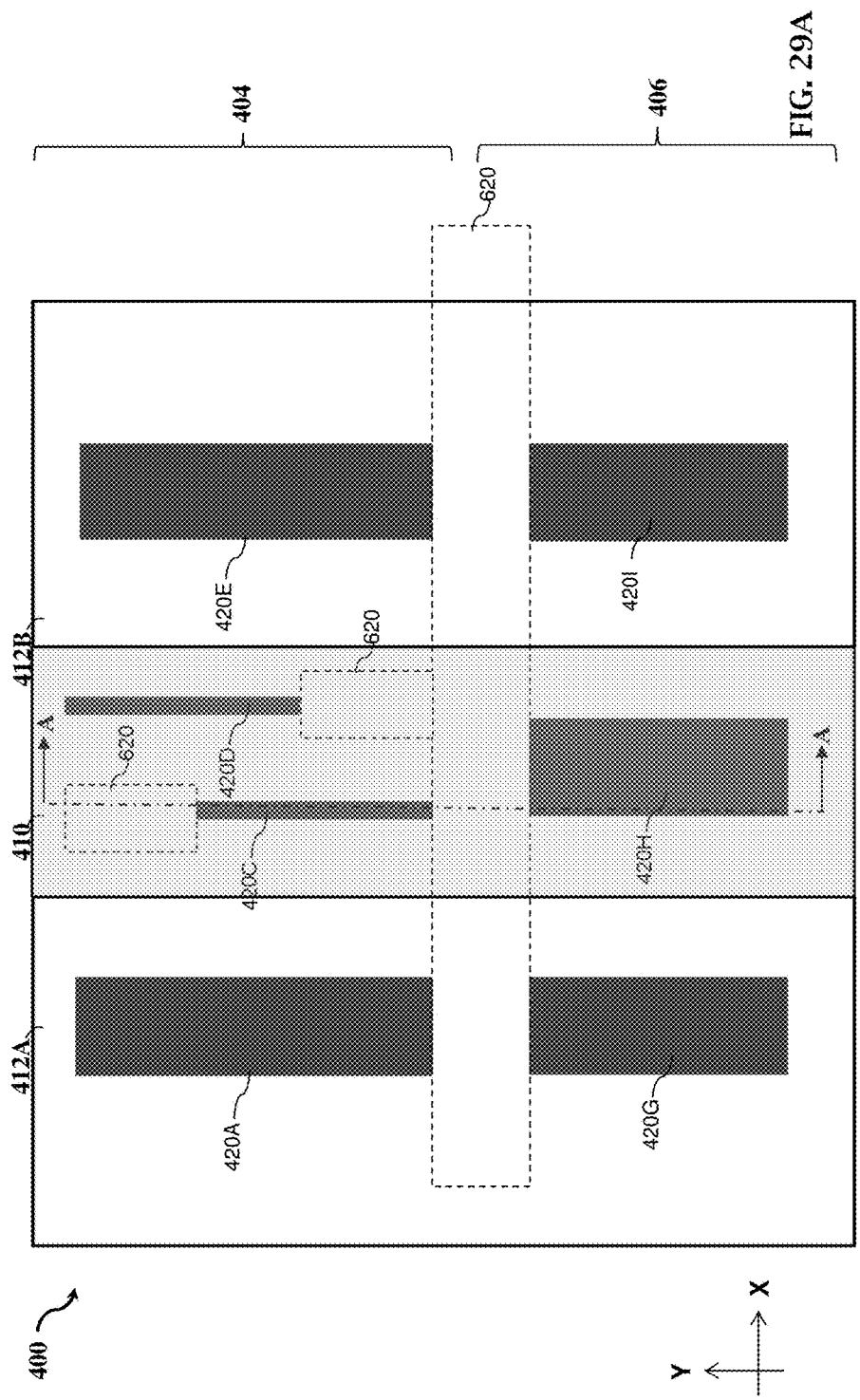
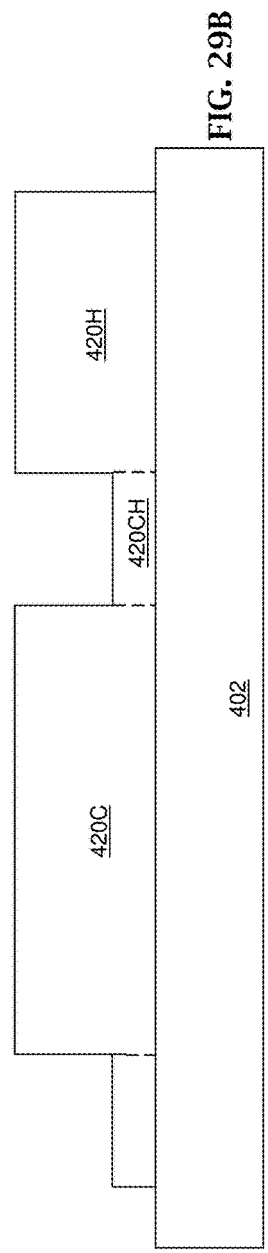

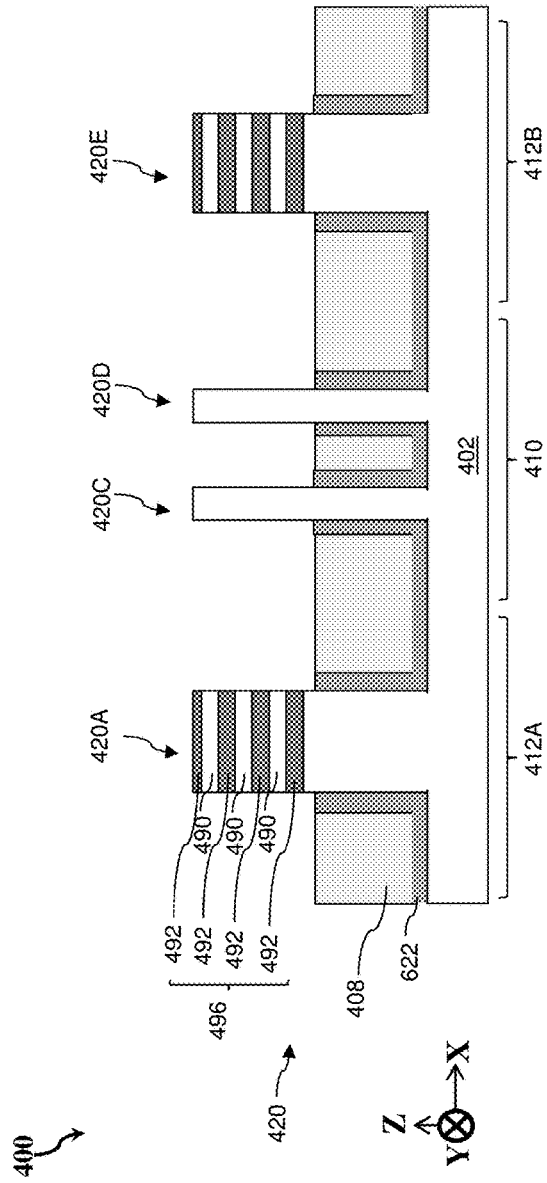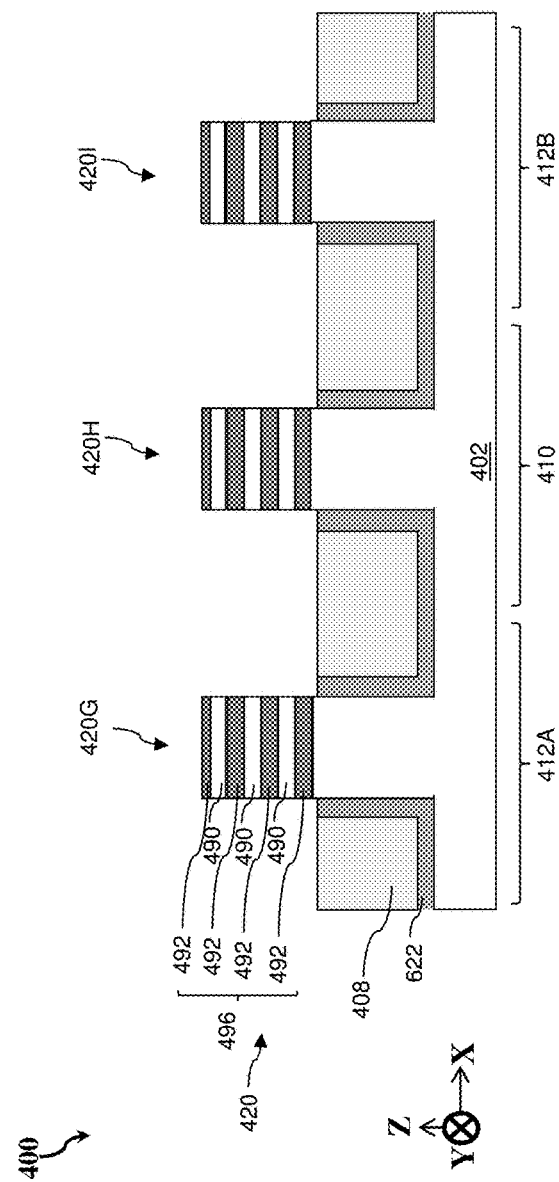

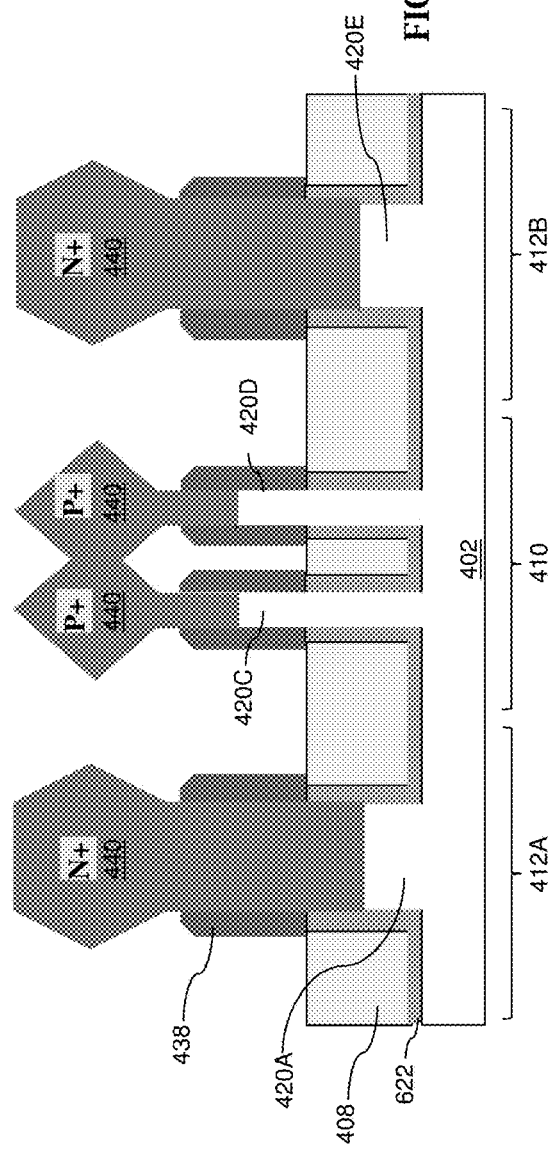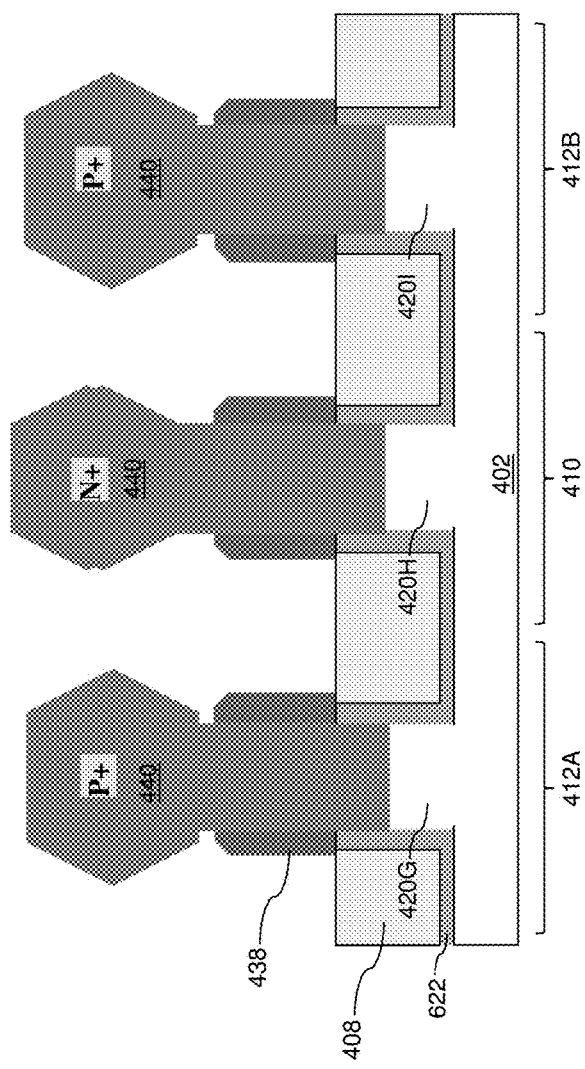

FIN-BASED WELL STRAPS FOR IMPROVING MEMORY MACRO PERFORMANCE

PRIORITY

This is a non-provisional application of and claims benefit of U.S. Provisional Patent Application Ser. No. 62/907,565, filed Sep. 28, 2019, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, in memory devices, such as static random-access memory (SRAM), leakage issue becomes more severe in advanced process nodes. Static random access memory ("SRAM") generally refers to any memory or storage that can retain stored data only when power is applied. As integrated circuit (IC) technologies progress towards smaller technology nodes, SRAMs often incorporate fin-based structures, such as fin-like field effect transistors (FinFETs) or gate-all-around (GAA) transistors, into SRAM cells to enhance performance, where each SRAM cell can store a bit of data. Since SRAM cell performance is largely layout dependent (for example, it has been observed that an inner SRAM cell of a SRAM array will perform differently than an edge SRAM cell of the SRAM array), fin-based well strap cells have been implemented to stabilize well potential, facilitating uniform charge distribution throughout a SRAM array, and thus uniform performance among SRAM cells of the SRAM array.

However, as fin dimensions shrink, fin-based well strap cells have been observed to increase pick-up resistance and/or reduce latch-up performance of SRAM arrays. Accordingly, although existing well strap cells for SRAM arrays have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 6A, 6B, 7A, 7B, 8A, 8B, 9A, 9B, 10A, 10B, 11A, 11B, 12A, 12B, 13A, 13B, 14A, 14B, 15A, 15B, 16A, 16B, 17A, 17B, 18A, 18B, 19A, 19B, 20A, 20B, 22A, 22B, 23A, 23B, 24A, 24B, 25A, 25B, 26A, 26B, 27A, 27B, 28A, 28B, 29A, 29B, 30A, 30B, 31A, 31B, 32A, 32B, 33A, 33B, and 34 are fragmentary diagrammatic views of various embodiments of a memory device during fabrication processes according to the method of FIG. 5, according to various aspects of the present disclosure.

DETAILED DESCRIPTION

Figure 1:
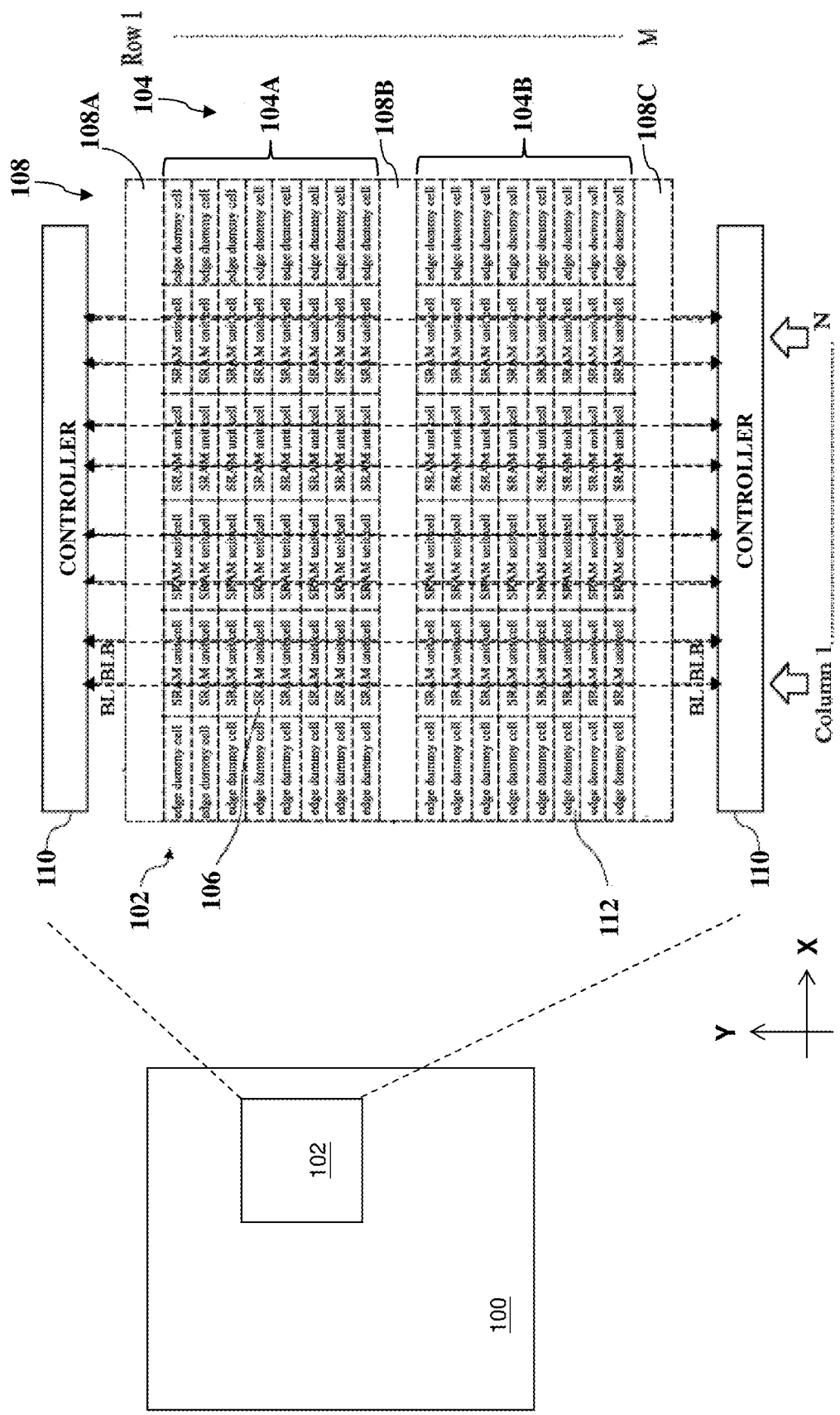
FIG. 1 is a simplified block diagram of an integrated circuit (IC) with an embedded memory macro, according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

For advanced IC technology nodes, fin-based structures, such as fin-like field effect transistors (FinFETs) or gate-all-around (GAA) transistors, have become a popular and promising candidate for high performance and low leakage applications. Memory arrays, such as static random access memory (SRAM) arrays, often incorporate fin-based multi-gate transistors into memory cells to enhance performance, where each memory cell can store a bit of data. Memory cell performance is largely layout dependent. For example, it has been observed that an inner memory cell of a memory array will perform differently than an edge memory cell of the memory array. In some implementations, inner memory cells and edge memory cells exhibit different threshold voltages ($V_t$), different on-currents ($I_{on}$), and/or a different off-currents ($I_{off}$). Fin-based well strap cells have thus been implemented to stabilize well potential, facilitating uniform charge distribution throughout a memory array, and thus uniform performance among memory cells of the memory array. A fin-based (non-planar based) well strap (also referred to as a well pick-up) electrically connects a well region corresponding with transistors of a memory cell to a voltage node (or voltage line). For example, a fin-based n-type well strap electrically connects an n-well region corresponding with a p-type transistor to a voltage node, such as a voltage node associated with the p-type transistor; a fin-based p-type well strap electrically connects a p-well region corresponding with an n-type transistor to a voltage node, such as a voltage node associated with the n-type transistor.

As IC technologies progress towards smaller technology nodes (for example, 20 nm, 16 nm, 10 nm, 7 nm, and below), decreasing fin pitch and decreasing fin width have been observed to diminish benefits provided by fin-based well straps. For example, decreasing fin widths have been observed to increase well pick-up resistance. Such increases in well pick-up resistance have been observed to degrade latch-up performance of memory arrays using fin-based well straps. The present disclosure thus proposes modifications to fin-based well straps that can achieve significant improvements in performance, for example, as described herein, by increasing fin widths in well strap regions to reduce well pick-up resistance without affecting desired characteristics (e.g., voltage threshold) of other transistors (e.g., FinFET or GAA transistors) in circuit regions. It has been observed that reducing the well-pick up resistance as described herein improves latch-up immunity of a memory array incorporating the fin-based well strap. Different embodiments may have different advantages, and no particular advantage is necessarily required of any embodiment.

FIG. 1 shows a semiconductor device 100 with a memory macro 102. The semiconductor device 100 can be, e.g., a microprocessor, an application specific integrated circuit (ASIC), a field programmable gate array (FPGA), or a digital signal processor (DSP). Further, semiconductor device 100 may be a portion of an IC chip, an SoC, or portion thereof, that includes various passive and active microelectronic devices such as resistors, capacitors, inductors, diodes, p-type field effect transistors (PFETs), n-type field effect transistors (NFETs), MOSFETs, CMOS transistors, BJTs, LDMOS transistors, high voltage transistors, high frequency transistors, other suitable components, or combinations thereof. The exact functionality of semiconductor device 100 is not a limitation to the provided subject matter. In the illustrated embodiment, memory macro 102 is a static random access memory (SRAM) macro, such as a single-port SRAM macro, a dual-port SRAM macro, or other types of SRAM macro. However, the present disclosure contemplates embodiments, where memory macro 102 is another type of memory, such as a dynamic random access memory (DRAM), a non-volatile random access memory (NVRAM), a flash memory, or other suitable memory. FIG. 1 has been simplified for the sake of clarity to better understand the inventive concepts of the present disclosure. Additional features can be added in memory macro 102, and some of the features described below can be replaced, modified, or eliminated in other embodiments of memory macro 102.

Memory macro 102 includes one or more circuit regions 104, such as circuit regions 104A and 104B in the illustrated embodiment. Circuit regions 104 contain all the memory cells 106 of memory macro 102. Circuit regions 104 are also referred to as memory cell regions 104. Memory cells 106 are generally implemented in forms of arrays in circuit regions 104. Each memory cell 106, such as an SRAM memory cell, is configured to store data. Memory cell 106 may be implemented with various PFETs and NFETs such as planar transistors or non-planar transistors. In the illustrated embodiment, memory cells 106 include various FinFETs, GAA transistors, or a combination thereof.

Memory macro 102 also includes one or more well strap regions 108, such as well strap regions 108A, 108B, and 108C oriented lengthwise along an x-direction in the illustrated embodiment. Well strap regions 108A and 108C are located at the edge of memory macro 102 and well strap region 108B is located between circuit regions 104A and 104B. Each of well strap regions 108 does not contain memory cells and is used for implementing well pick-up structures. A well pick-up structure is generally configured to electrically couple a voltage to an n-well of memory cells 106 or a p-well of memory cells 106. Well strap regions 108 are also referred to as well pick-up regions.

Further, memory macro 102 may include various contact features (or contacts), vias, and metal lines for connecting the source, drain, and gate electrodes (or terminals) of the transistors to form an integrated circuit.

Still referring to FIG. 1, memory cells 106 are arranged in column 1 to column N each extending along a first direction (here, in a y-direction) and row 1 to row M each extending along a second direction (here, in an x-direction), where N and M are positive integers. Column 1 to column N each include a bit line pair extending along the first direction, such as a bit line (BL) and a bit line bar (BLB) (also referred to as a complementary bit line), that facilitate reading data from and/or writing data to respective memory cells 106 in true form and complementary form on a column-by-column basis. Row 1 to row M each includes a word line (WL) (not shown) that facilitates access to respective memory cells 106 on a row-by-row basis. Each memory cell 106 is electrically connected to a respective BL, a respective BLB, and a respective WL, which are electrically connected to a controller 110. Controller 110 is configured to generate one or more signals to select at least one WL and at least one bit line pair (here, BL and BLB) to access at least one of memory cells 106 for read operations and/or write operations. Controller 110 includes any circuitry suitable to facilitate read/write operations from/to memory cells 106, including but not limited to, a column decoder circuit, a row decoder circuit, a column selection circuit, a row selection circuit, a read/write circuit (for example, configured to read data from and/or write data to memory cells 106 corresponding to a selected bit line pair (in other words, a selected column)), other suitable circuit, or combinations thereof. In some implementations, controller 110 includes at least one sense amplifier (not shown) configured to detect and/or amplify a voltage differential of a selected bit line pair. In some implementations, the sense amplifier is configured to latch or otherwise store data values of the voltage differential.

A perimeter of memory macro 102 is configured with dummy cells, such as edge dummy cells 112, to ensure uniformity in performance of memory cells 106. Dummy cells are configured physically and/or structurally similar to memory cells 106, but do not store data. For example, dummy cells can include p-type wells, n-type wells, fin structures (including one or more fins), gate structures, source/drain features, and/or contact features. In the illustrated embodiment, row 1 to row M each begins with an edge dummy cell 112 and ends with an edge dummy cell 112, such that row 1 to row M of memory cells 106 are disposed between two edge dummy cells 112.

Figure 2:
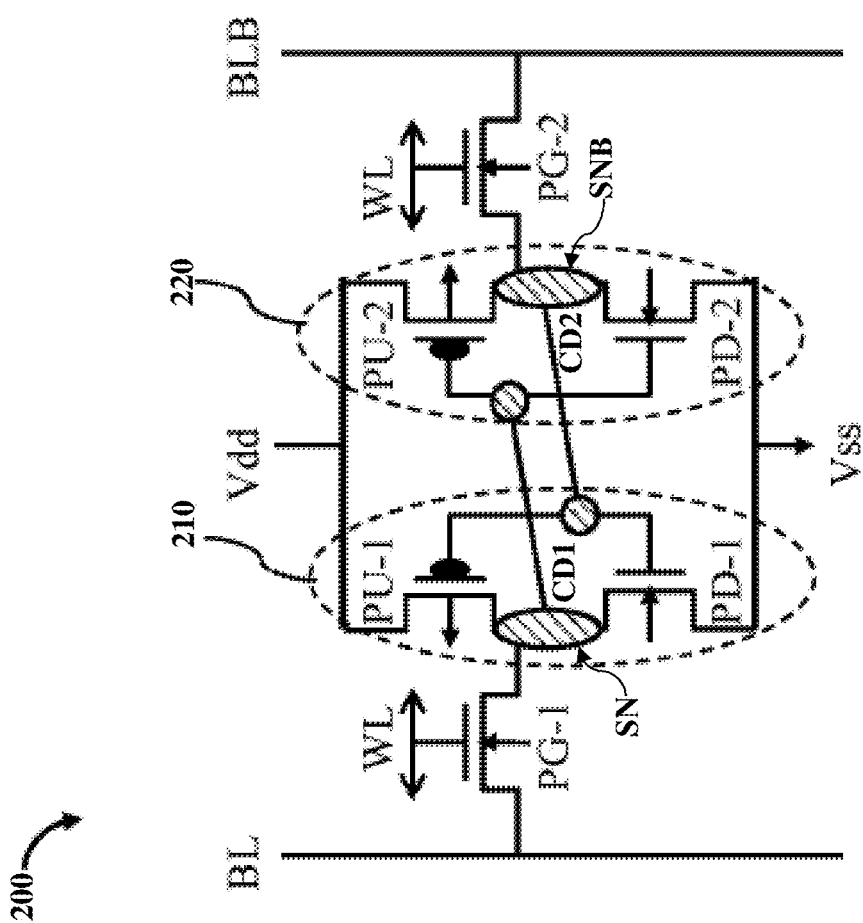
FIG. 2 is a circuit diagram of a single-port SRAM cell, which can be implemented in a memory cell of a memory macro, according to various aspects of the present disclosure.

FIG. 2 is a circuit diagram of a single-port SRAM cell 200, which can be implemented in a memory cell of a SRAM array, according to various aspects of the present disclosure. In some implementations, SRAM cell 200 is implemented in one or more memory cells 106 of memory macro 102 (FIG. 1). FIG. 2 has been simplified for the sake of clarity to better understand the inventive concepts of the present disclosure. Additional features can be added in single-port SRAM cell 200, and some of the features described below can be replaced, modified, or eliminated in other embodiments of single-port SRAM cell 200.

Single-port SRAM cell 200 includes six transistors: a pass-gate transistor PG-1, a pass-gate transistor PG-2, a pull-up transistor PU-1, a pull-up transistor PU-2, a pull-down transistor PD-1, and a pull-down transistor PD-1. Single-port SRAM cell 200 is thus alternatively referred to as a 6T SRAM cell. In operation, pass-gate transistor PG-1 and pass-gate transistor PG-2 provide access to a storage portion of SRAM cell 200, which includes a cross-coupled pair of inverters, an inverter 210 and an inverter 220. Inverter 210 includes pull-up transistor PU-1 and pull-down transistor PD-1, and inverter 220 includes pull-up transistor PU-2 and pull-down transistor PD-2. In some implementations, pull-up transistors PU-1, PU-2 are configured as p-type FinFETs, and pull-down transistors PD-1, PD-2 are configured as n-type FinFETs. For example, pull-up transistors PU-1, PU-2 each include a gate structure disposed over a channel region of an n-type fin structure (including one or more n-type fins), such that the gate structure interposes p-type source/drain regions of the n-type fin structure (for example, p-type epitaxial source/drain features), where the gate structure and the n-type fin structure are disposed over an n-type well region; and pull-down transistors PD-1, PD-2 each includes a gate structure disposed over a channel region of a p-type fin structure (including one or more p-type fins), such that the gate structure interposes n-type source/drain regions of the p-type fin structure (for example, n-type epitaxial source/drain features), where the gate structure and the p-type fin structure are disposed over a p-type well region. In some implementations, pass-gate transistors PG-1, PG-2 are also configured as n-type FinFETs. For example, pass-gate transistors PG-1, PG-2 each include a gate structure disposed over a channel region of a p-type fin structure (including one or more p-type fins), such that the gate structure interposes n-type source/drain regions of the p-type fin structure (for example, n-type epitaxial source/drain features), where the gate structure and the p-type fin structure are disposed over a p-type well region.

A gate of pull-up transistor PU-1 interposes a source (electrically coupled with a power supply voltage ($V_{DD}$)) and a first common drain (CD1), and a gate of pull-down transistor PD-1 interposes a source (electrically coupled with a power supply voltage ($V_{SS}$)) and the first common drain. A gate of pull-up transistor PU-2 interposes a source (electrically coupled with power supply voltage ($V_{DD}$)) and a second common drain (CD2), and a gate of pull-down transistor PD-2 interposes a source (electrically coupled with power supply voltage ($V_{SS}$)) and the second common drain. In some implementations, the first common drain (CD1) is a storage node (SN) that stores data in true form, and the second common drain (CD2) is a storage node (SNB) that stores data in complementary form. The gate of pull-up transistor PU-1 and the gate of pull-down transistor PD-1 are coupled with the second common drain, and the gate of pull-up transistor PU-2 and the gate of pull-down transistor PD-2 are coupled with the first common drain. A gate of pass-gate transistor PG-1 interposes a source (electrically coupled with a bit line BL) and a drain, which is electrically coupled with the first common drain. A gate of pass-gate transistor PG-2 interposes a source (electrically coupled with a complementary bit line BLB) and a drain, which is electrically coupled with the second common drain (CD2). The gates of pass-gate transistors PG-1, PG-2 are electrically coupled with a word line WL. In some implementations, pass-gate transistors PG-1, PG-2 provide access to storage nodes SN, SNB during read operations and/or write operations. For example, pass-gate transistors PG-1, PG-2 couple storage nodes SN, SNB respectively to bit lines BL, BLB in response to voltage applied to the gates of pass-gate transistors PG-1, PG-2 by WLs.

Figure 3:
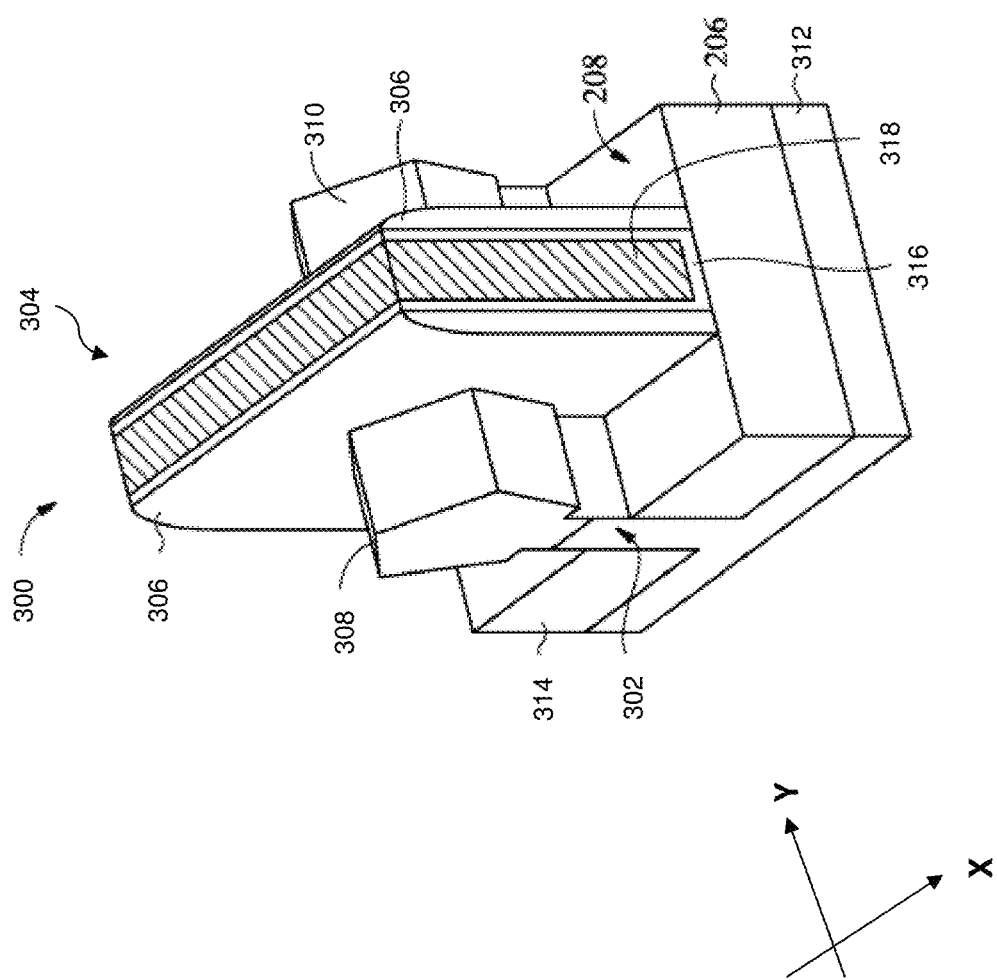
FIG. 3 is a perspective view of a multi-gate transistor, in accordance with some embodiments.

FIG. 3 illustrates a perspective view of a fin-based multi-gate transistor 300, which may serve as any of the transistors in single-port SRAM cell 200 (FIG. 2), including pull-up transistor PU-1, pull-up transistor PU-2, pull-down transistor PD-1, pull-down transistor PD-2, pass-gate transistor PG-1, and pass-gate transistor PG-2. In some embodiments, fin-based multi-gate transistor 300 is a FinFET. In some embodiments, fin-based multi-gate transistor 300 is a GAA transistor that includes a fin-like structure having vertically-stacked horizontally-oriented channel layers (e.g., nanowires or nanosheets). In some embodiments, fin-based multi-gate transistor 300 includes a fin 302, a gate structure 304, spacers 306, a drain region 308, and a source region 310. The term "fin" as used herein refers to either a continuous fin in a FinFET or a fin-like structure having vertically-stacked channel layers in a GAA transistor. Fin 302 extends above a semiconductor substrate 312. In some embodiments, semiconductor substrate 312 and fin 302 are made of the same material. For example, the substrate is a silicon substrate. In some instances, the substrate includes a suitable elemental semiconductor, such as germanium or diamond; a suitable compound semiconductor, such as silicon carbide, gallium nitride, gallium arsenide, or indium phosphide; or a suitable alloy semiconductor, such as silicon germanium, silicon tin, aluminum gallium arsenide, or gallium arsenide phosphide. In some embodiments, the substrate is a silicon on insulator (SOI) layer substrate or a silicon on sapphire (SOS) substrate. In some embodiments, semiconductor substrate 312 and fin 302 are made of different materials.

Fin 302 may be patterned by any suitable method. For example, fin 302 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern fin 302.

In some embodiments, fin 302 may be surrounded by isolating features 314 formed on opposite sides of fin 302. Isolating features 314 may electrically isolate an active region (not shown) of fin-based multi-gate transistor 300 from other active regions. In some embodiments, isolating features 314 are shallow trench isolation (STI), field oxide (FOX), or another suitable electrically insulating structure. For example, fin 302 represents semiconductor fins 420A, 420B, 420C, 420D, 420E, 420F, 420G, 420H, and 420I in a layout of a SRAM cell 400 shown in FIG. 4A.

Still referring to FIG. 3, in some embodiments, gate structure 304, which includes a gate dielectric 316 and a gate electrode 318 formed over gate dielectric 316. In a FinFET, gate structure 304 is positioned over sidewalls and a top surface of fin 302. In a GAA transistor, gate structure 304 wraps around each of the channel layer (e.g., nanowire or nanosheet) in the fin-like structure. Therefore, a portion of fin 302 overlaps gate structure 304 may serve as a channel region. In some embodiments, gate dielectric 316 is a high dielectric constant (high-k) dielectric material. A high-k dielectric material has a dielectric constant (k) higher than that of silicon dioxide. Examples of high-k dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-k material, or a combination thereof. In some embodiments, the gate electrode 318 is made of a conductive material, such as aluminum (Al), copper (Cu), tungsten (W), titanium (Ti), tantalum (Ta), or another applicable material.

In some embodiments, spacers 306 of fin-based multi-gate transistor 300 are positioned over sidewalls and a top surface of fin 302. In addition, spacers 306 may be formed on opposite sides of gate structure 304. In some embodiments, spacers 306 are made of silicon nitride, silicon oxynitride, silicon carbide, another suitable material, or a combination thereof.

In some embodiments, portions of fin 302 that are not covered by gate structure 304 and spacers 306 serve as a drain region 308 and a source region 310. In some embodiments, drain region 308 and source region 310 of PFETs, for example, pull-up transistor PU-1 and pull-up transistor PU-2 are formed by implanting the portions of fin 302 that are not covered by gate structure 304 and spacers 306 with a p-type impurity such as boron, indium, or the like. In some embodiments, drain region 308 and source region 310 of NFETs, for example, pass-gate transistor PG-1, pass-gate transistor PG-2, pull-down transistor PD-1, and pull-down transistor PD-2 are formed by implanting the portions of fin 302 that are not covered by gate structure 304 and spacers 306 with an n-type impurity such as phosphorous, arsenic, antimony, or the like.

In some embodiments, drain region 308 and source region 310 are formed by etching portions of fin 302 that are not covered by gate structure 304 and spacers 306 to form recesses, and growing epitaxial regions in the recesses. The epitaxial regions may be formed of Si, Ge, SiP, SiC, SiPC, SiGe, SiAs, InAs, InGaAs, InSb, GaAs, GaSb, InAlP, InP, C, or a combination thereof. Accordingly, drain region 308 and source region 310 may be formed of silicon germanium (SiGe) in some exemplary embodiments, while the remaining fin 302 may be formed of silicon. In some embodiments, p-type impurities are in-situ doped in drain region 308 and source region 310 during the epitaxial growth of drain region 308 and source region 310 of PFETs, for example, pull-up transistor PU-1 and pull-up transistor PU-2 in FIG. 2. In addition, n-type impurities are in-situ doped in drain region 308 and source region 310 during the epitaxial growth of drain region 308 and source region 310 of NFETs, for example, pass-gate transistor PG-1, pass-gat transistor PG-2, pull-down transistor PD-1, and pull-down transistor PD-2 in FIG. 2.

In some alternative embodiments, pass-gate transistors PG-1/PG-2, pull-up transistors PU-1/PU-2, and pull-down transistors PD-1/PD-2 of SRAM cell 200 in FIG. 2 are planar MOS devices.

Figure 4A:
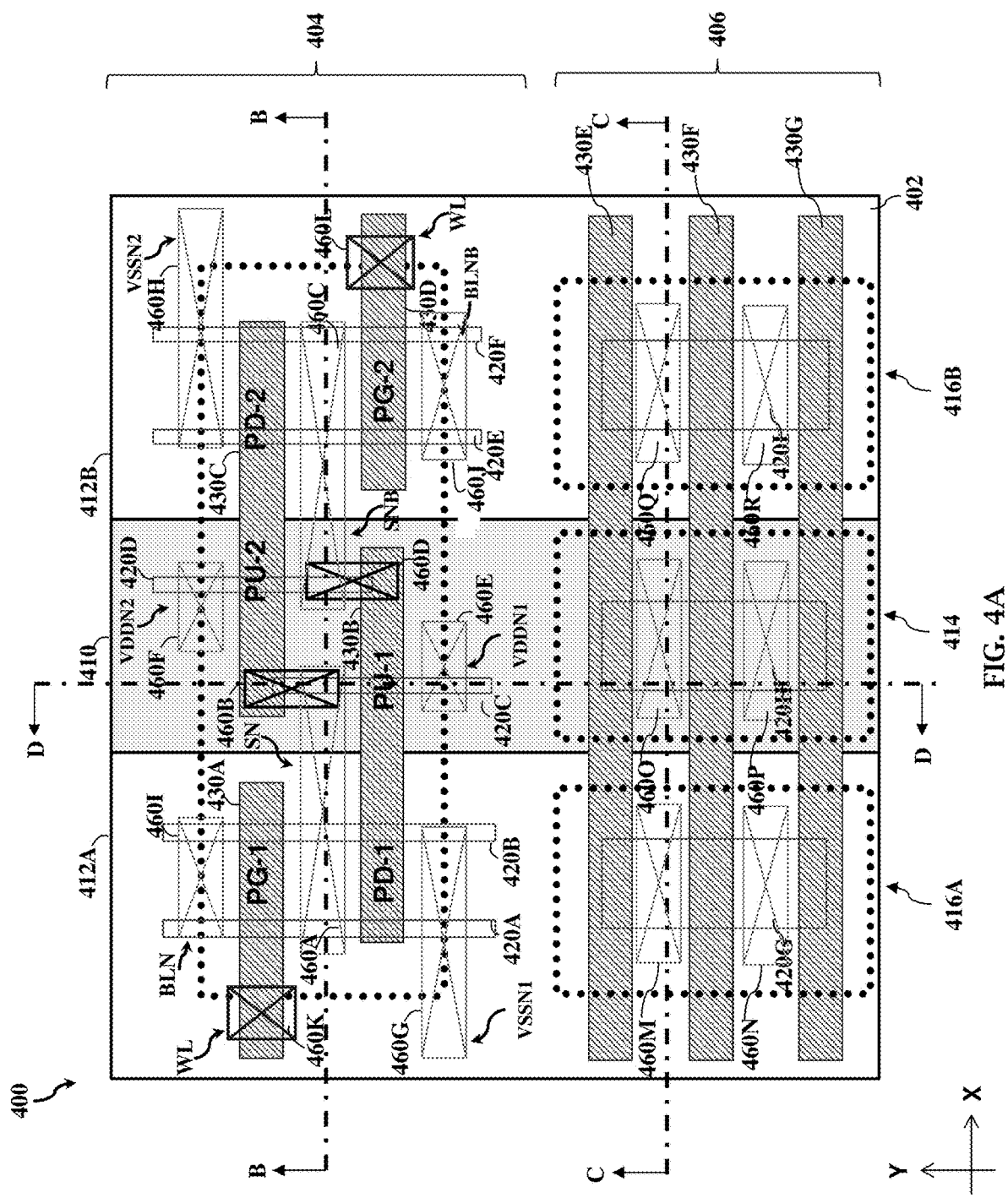
FIGS. 4A, 4B, 4C, and 4D are fragmentary diagrammatic views of an embodiment of a memory device, in portion or entirety, according to various aspects of the present disclosure.
Figure 4B:
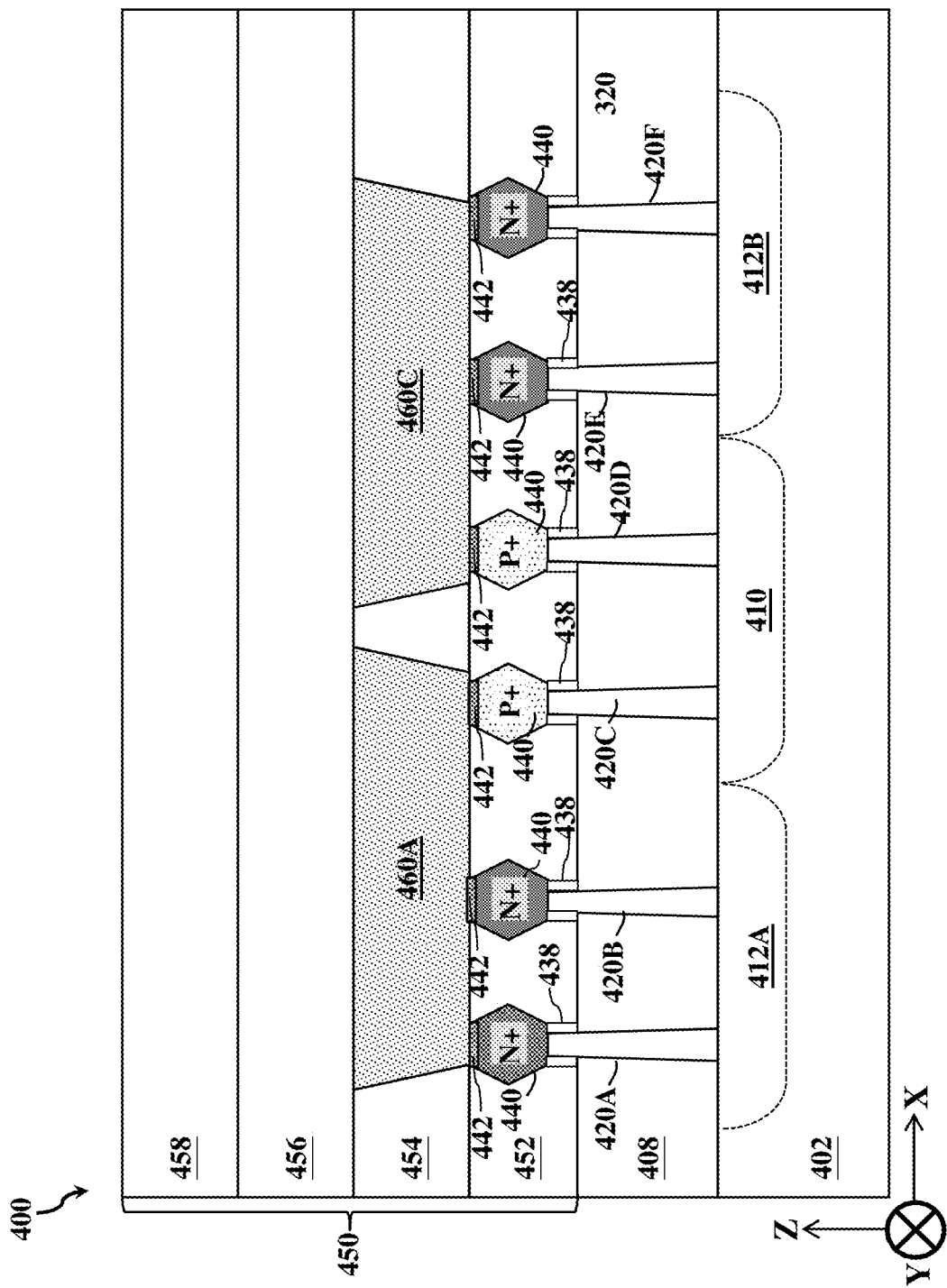
Figure 4C:
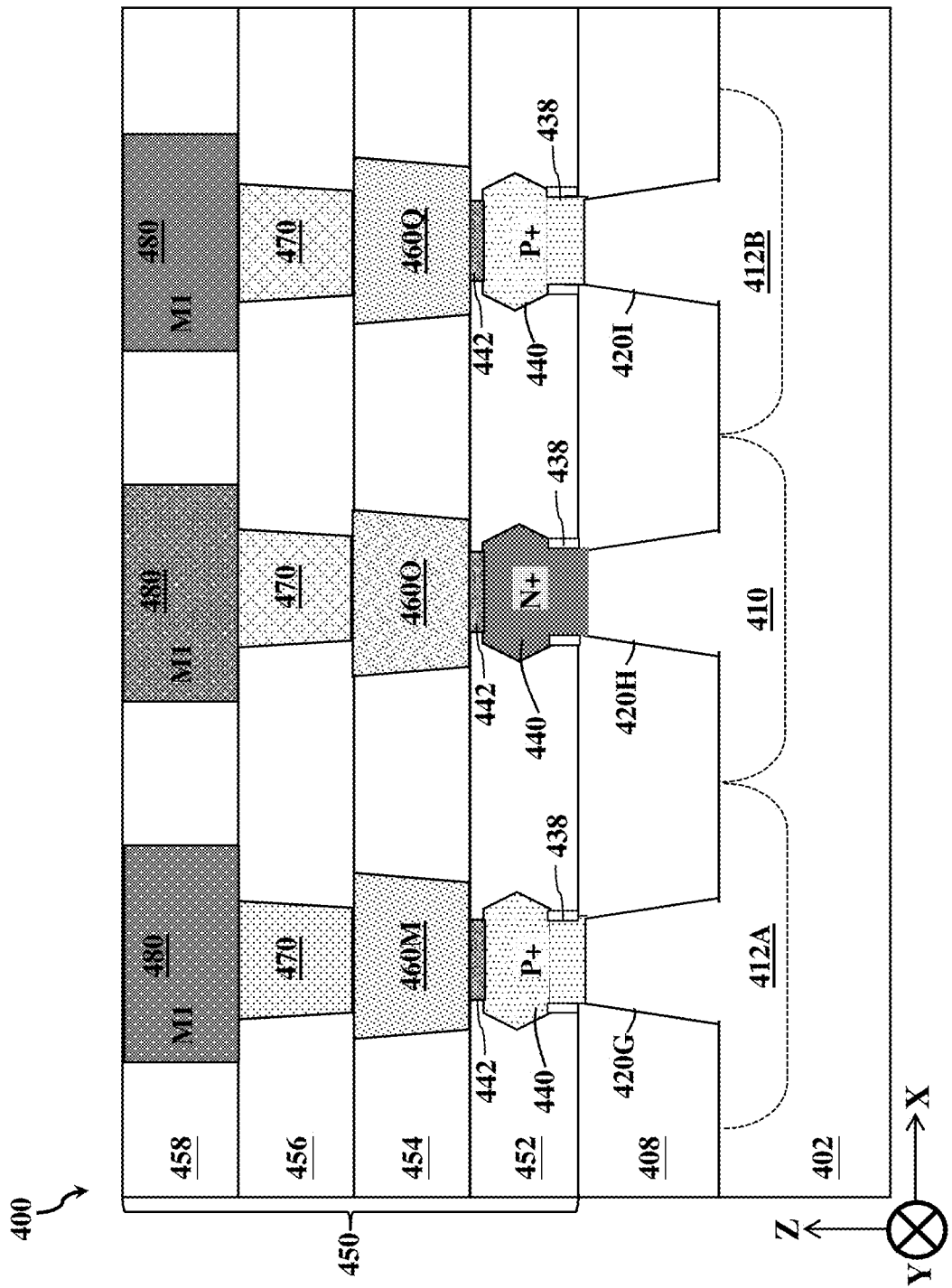
Figure 4D:
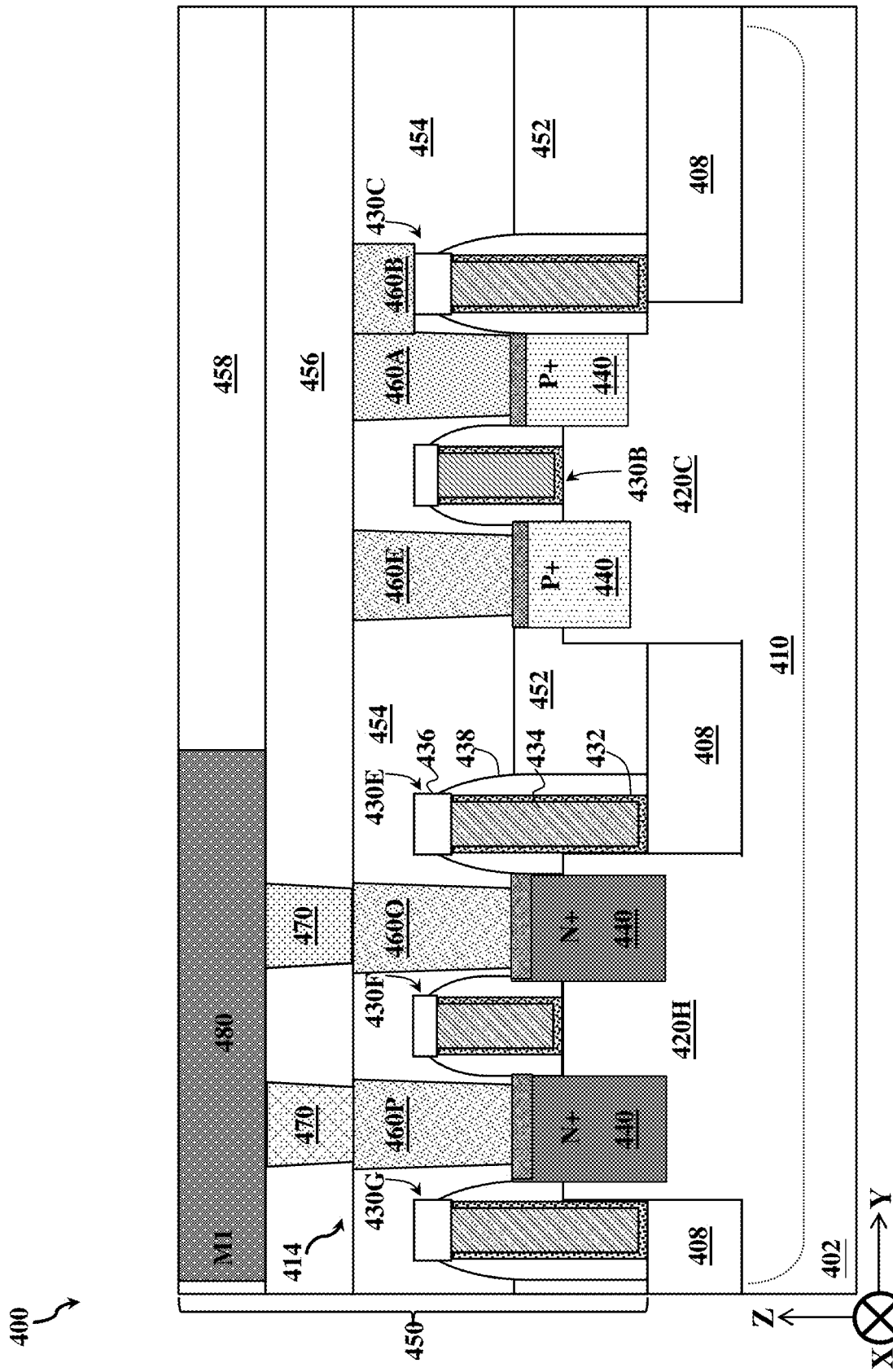

FIGS. 4A-4D are fragmentary diagrammatic views of an integrated circuit device (or device) 400, in portion or entirety, according to various aspects of the present disclosure. In particular, FIG. 4A is a simplified schematic top view of device 400 (for example, in an x-y plane); FIG. 4B is a diagrammatic cross-sectional view of device 400 along line B-B of FIG. 4A (for example, in an x-z plane); FIG. 4C is a diagrammatic cross-sectional view of device 400 along line C-C of FIG. 4A (for example, in an x-z plane); and FIG. 4D is a diagrammatic cross-sectional view of device 400 along line D-D of FIG. 4A (for example, in a y-z plane). Device 400 generally refers to any fin-based device, which can be included in a microprocessor, a memory cell, and/or other IC device. In the illustrated embodiment, device 400 is a portion of a SRAM array, in particular, a single-port SRAM cell in a circuit region 404 and fin-based well straps in a well strap region 406. In some implementations, the illustrated circuit of device 400 is implemented as single-port SRAM cell 200 (FIG. 2) or as one or more memory cells 106 of memory macro 102 (FIG. 1). FIGS. 4A-4D have been simplified for the sake of clarity to better understand the inventive concepts of the present disclosure. Additional features can be added in device 400, and some of the features described below can be replaced, modified, or eliminated in other embodiments of device 400.

Device 400 includes a substrate (wafer) 402. Substrate 402 includes various doped regions configured according to design requirements of device 400. In some implementations, substrate 402 includes p-type doped regions (for example, p-type wells) doped with p-type dopants, such as boron (for example, $BF_2$), indium, other p-type dopant, or combinations thereof. In some implementations, substrate 402 includes n-type doped regions (for example, n-type wells) doped with n-type dopants, such as phosphorus, arsenic, other n-type dopant, or combinations thereof. In some implementations, substrate 402 includes doped regions formed with a combination of p-type dopants and n-type dopants. The various doped regions can be formed directly on and/or in substrate 402, for example, providing a p-well structure, an n-well structure, a dual-well structure, a raised structure, or combinations thereof. An ion implantation process, a diffusion process, and/or other suitable doping process can be performed to form the various doped regions. In the depicted embodiment, substrate 402 includes an n-type doped region (also referred to as an n-well) 410 disposed between a p-type doped region (also referred to as an p-well) 412A and a p-well 412B. Each p-well and n-well extends continuously from circuit region 404 to well strap region 406. In some implementations, n-well 410 has an n-type dopant concentration of about $5 \times 10^{16}$ $cm^{-3}$ to about $5 \times 10^{19}$ $cm^3$, and p-wells 412A/412B have a p-type dopant concentration of about $5 \times 10^{16}$ $cm^{-3}$ to about $5 \times 10^{19}$ $cm^3$.

Device 400 includes a fin 420A, a fin 420B, a fin 420C, a fin 420D, a fin 420E, a fin 420F, a fin 420G, a fin 420H, and a fin 420I (collectively, as fins 420) disposed over substrate 402. Fins 420 are oriented substantially parallel to one another, each having a width defined in an x-direction, a length defined in a y-direction, and a height defined in a z-direction. The present disclosure contemplates variations in height, width, and length of fins 420 that may arise from processing and fabrication. For example, a width of fins 420 varies from an upper portion of fins to a lower portion of fins. In the depicted embodiment, the width tapers from the upper portion of fins 420 to the lower portion of fins 420, such that an average width of the upper portion is less than an average width of the lower portion. In some implementations, the width can vary from about 5 nm to about 15 nm along fins 420 depending on where the width is measured along the height of fins 420. In some implementations, the widths are not tapered, such that at least one of fins 420 have substantially the same width along its height. In the present disclosure, a width of fins represents a width measured at a midpoint in a height of the fins. To reduce well pick-up resistances, a width of fins 420G-420I in well strap region 406 is wider than a width of fins 420A-420F in circuit region 404. The larger width provides lower fin resistance, less fin dopant leakage, and larger volume of epitaxial source/drain (S/D) features above the fins, all contributing to lower well pick-up resistances. In some embodiments, a width of fins 420G-420I is about 1.5 times to about 5 times of a width of fins 420A-420F, such as about 3 times in a particular example. In some implementations, a larger width of fins in well strap regions may introduce 1 to 2 order resistance improvement. However, if the ratio is less than 1.5:1, the well pick-up resistances improvement may be not significant; if the ratio is larger than 5:1, layout area for a well strap region has to be enlarged which may increase chip size and result in higher fabrication costs. In some embodiments, a width of fins in well strap region 406 substantially equals a fin pitch (a fin width plus an edge-to-edge distance between adjacent fins) of respective fins in the same well in circuit region 404. For example, a width of fin 420H disposed in n-well 410 may substantially equal to a fin pitch of fins 420C and 420D disposed in n-well 410.

Fins 420A-420I each have at least one channel region, at least one source region, and at least one drain region defined along their length in the y-direction, where a channel region is disposed between a source region and a drain region (generally referred to as source/drain regions). Channel regions include a top portion defined between sidewall portions, where at least the top portion and the sidewall portions engage with a gate structure (as described below), such that current can flow between the source/drain regions during operation. The source/drain regions also include top portions defined between sidewall portions. In some implementations, fins 420A-420I are a portion of substrate 402 (such as a portion of a material layer of substrate 402). For example, where substrate 402 includes silicon, fins 420A-420I include silicon. Alternatively, in some implementations, fins 420A-420I are defined in a material layer, such as one or more semiconductor material layers, overlying substrate 402. For example, fins 420A-420I can include a stack of semiconductor layers (nanowires or nanosheets) disposed over substrate 402.

An isolation feature(s) 408 is formed over and/or in substrate 402 to isolate various regions, such as various device regions, of device 400. In the depicted embodiment, isolation feature 408 separates and isolates fins 420 from one another. Particularly, in circuit region 404, isolation feature 408 surrounds a bottom portion of fins 420A-420F, while a top portion of fins 420A-420F protrudes from isolation feature 408; in well strap region 406, isolation feature 408 surrounds fins 420G-420I with a top portion of fins 420G-420I below isolation feature 408. The different heights of fins 420A-420I are caused by different fin etching rates due to different fin widths and accordingly different loading effect during a fin recess process (for example, an etch back process), which will be discussed in further details below. Isolation feature 408 includes silicon oxide, silicon nitride, silicon oxynitride, other suitable isolation material (for example, including silicon, oxygen, nitrogen, carbon, or other suitable isolation constituent), or combinations thereof. Isolation feature 408 can include different structures, such as shallow trench isolation (STI) structures, deep trench isolation (DTI) structures, and/or local oxidation of silicon (LOCOS) structures. In some implementations, STI features can be formed by depositing an insulator material over substrate 402 after forming fins 420, such that the insulator material layer fills gaps (trenches) between fins 420, and etching back the insulator material layer to form isolation feature 408. In some implementations, isolation feature 408 includes a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation feature 408 includes a dielectric layer disposed over a doped liner layer (including, for example, boron silicate glass (BSG) or phosphosilicate glass (PSG)).

Various gate structures are disposed over fins 420A-420I, such as a gate structure 430A, a gate structure 430B, a gate structure 430C, a gate structure 430D, a gate structure 430E, a gate structure 430F, and a gate structure 430G (collectively, as gate structures 430). Gate structures 430 extend along the x-direction (for example, substantially perpendicular to fins 420). Gate structures 430 wrap portions of fins 420, positioned such that the gate structures interpose respective source/drain regions of fins. Gate structures 430 include gate stacks configured to achieve desired functionality according to design requirements of device 400, such that gate structures 430 include the same or different layers and/or materials. In the depicted embodiment, gate structures 430 have gate stacks that include a gate dielectric 432, a gate electrode 434, and a gate plug 436 (FIG. 4D). Gate dielectric 432 is conformally disposed over fins 420A-420I and isolation feature 408, such that gate dielectric 432 has a substantially uniform thickness. Gate electrode 434 is disposed over gate dielectric 432. Gate electrode 434 includes an electrically conductive material. In some implementations, gate electrode 434 includes multiple layers, such as a capping layer, a work function layer, a glue/barrier layer, and a metal fill (or bulk) layer. Gate plug 436 includes tungsten (W), cobalt (Co), molybdenum (Mo), ruthenium (Ru), nickel (Ni), copper (Cu), or other metals, and may be formed by CVD, PVD, ALD, plating, or other suitable processes. Gate structures 430 further include respective gate spacers 438 disposed adjacent to (for example, along sidewalls of) the respective gate stacks. Gate spacers 438 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide).

Epitaxial source features and epitaxial drain features (referred to as epitaxial source/drain features) are disposed over the source/drain regions of fins 420. For example, semiconductor material is epitaxially grown on fins 420, forming epitaxial source/drain (S/D) features 440. In some implementations, epitaxial S/D features 440 are formed over the S/D regions of fins 420 after a fin recess process, such that epitaxial S/D features 440 are grown from recessed fins 420. In some implementations, epitaxial S/D features 440 wrap the S/D regions of fins 420. In such implementations, fins 420 may not be subjected to a fin recess process. In FIG. 4B and FIG. 4C, epitaxial S/D features 440 extend (grow) laterally along the x-direction (in some implementations, substantially perpendicular to fins 420), such that adjacent epitaxial S/D features 440 may merge and span more than one fin. For example, merged epitaxial S/D features 440 may span over fins 420C and 420D (as illustrated in FIGS. 20A and 33A). An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of substrate 402. Epitaxial S/D features 440 are doped with n-type dopants and/or p-type dopants. Epitaxial S/D features 440 over the same well (n-well or p-well) in circuit region 404 and well strap region 406 are oppositely doped. In the depicted embodiment, fins 420A, 420B, 420E, 420F, 420G, 420I include a p-type dopant, fins 420C, 420D, 420H include an n-type dopant; epitaxial S/D features 440 over fins 420A, 420B, 420E, 420F, 420H are doped with an n-type dopant, epitaxial S/D features 440 over fins 420C, 420D, 420G, 420I are doped with a p-type dopant. For example, for doping with p-type dopant, epitaxial S/D features 440 may be silicon germanium containing epitaxial layers that are doped with boron, carbon, other p-type dopant, or combinations thereof (for example, forming a Si:Ge:B epitaxial layer or a Si:Ge:C epitaxial layer). For doping with n-type dopant, epitaxial S/D features 440 may be silicon-containing epitaxial layers or silicon-carbon-containing epitaxial layers that are doped with phosphorous, arsenic, other n-type dopant, or combinations thereof (for example, forming a Si:P epitaxial layer, a Si:C epitaxial layer, or a Si:C:P epitaxial layer). In some implementations, epitaxial S/D features 440 are doped by an ion implantation process subsequent to a deposition process. In some implementations, annealing processes are performed to activate dopants in epitaxial S/D features 440. Further, in the depicted embodiment, epitaxial S/D features 440 over fins 420G, 420H, 420I in well strap region 406 have larger volume that epitaxial S/D features 440 over fins 420A, 420B, 420C, 420D, 420E, 420F in circuit region 404, due to larger fin width in well strap region 406, which further reduces well pick-up resistance.

In some implementations, silicide layers are formed on epitaxial S/D features 440. In some implementations, silicide layers 442 are formed by depositing a metal layer over epitaxial source/drain features 440. The metal layer includes any material suitable for promoting silicide formation, such as nickel, platinum, palladium, vanadium, titanium, cobalt, tantalum, ytterbium, zirconium, other suitable metal, or combinations thereof. A heating process, such as an annealing process is subsequently performed to cause constituents of epitaxial source/drain features 440 (for example, silicon and/or germanium) to react with the metal. Silicide layers thus include metal and a constituent of epitaxial S/D features 440 (for example, silicon and/or germanium). In some implementations, silicide layers include nickel silicide, titanium silicide, or cobalt silicide. Any un-reacted metal, such as remaining portions of the metal layer, is selectively removed by any suitable process, such as an etching process. In some implementations, the silicide layers 442 and epitaxial S/D features 440 are collectively referred to as epitaxial S/D features.

A multilayer interconnect (MLI) feature 450 is disposed over substrate 402. MLI feature 450 electrically couples various devices (for example, transistors, resistors, capacitors, and/or inductors) and/or components (for example, gate structures and/or source/drain features) of device 400. MLI feature 450 includes a combination of dielectric layers and electrically conductive layers (for example, metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of MLI feature 450. During operation of device 400, the interconnect features are configured to route signals between the devices and/or the components of device 400 and/or distribute signals (for example, clock signals, voltage signals, and/or ground signals) to the devices and/or the components of device 400. It is noted that though MLI feature 450 is depicted with a given number of dielectric layers and conductive layers, the present disclosure contemplates MLI feature 450 having more or less dielectric layers and/or conductive layers.

MLI feature 450 includes one or more dielectric layers, such as an interlayer dielectric layer 452 (ILD-0) disposed over substrate 402, an interlayer dielectric layer 454 (ILD-1) disposed over ILD layer 452, an interlayer dielectric layer 456 (ILD-2) disposed over ILD layer 454, and an interlayer dielectric layer 458 (ILD-3) disposed over ILD layer 456. ILD layers 452-458 include a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SiLK® (Dow Chemical, Midland, Mich.), polyimide, other low-k dielectric material, or combinations thereof. In the depicted embodiment, ILD layers 452-458 are dielectric layers that include a low-k dielectric material (generally referred to as low-k dielectric layers). In some implementations, low-k dielectric material generally refers to materials having a dielectric constant (k) that is less than 3.9. ILD layers 452-458 can include a multilayer structure having multiple dielectric materials. MLI feature 450 can further include one or more contact etch stop layers (CESLs) disposed between ILD layers 452-458, such as a CESL disposed between ILD layer 452 and ILD layer 454, a CESL disposed between ILD layer 454 and ILD layer 456, and a CESL disposed between ILD layer 456 and ILD layer 458. In some implementations, a CESL is disposed between substrate 402 and/or isolation feature 408 and ILD layer 452. CESLs include a material different than ILD layers 452-458, such as a dielectric material that is different than the dielectric material of ILD layers 452-458. For example, where ILD layers 452-458 include a low-k dielectric material, CESLs include silicon and nitrogen, such as silicon nitride or silicon oxynitride. ILD layers 452-458 are formed over substrate 402 by a deposition process, such as CVD, PVD, ALD, HDPCVD, MOCVD, RPCVD, PECVD, LPCVD, ALCVD, APCVD, plating, other suitable methods, or combinations thereof. In some implementations, ILD layers 452-458 are formed by a flowable CVD (FCVD) process that includes, for example, depositing a flowable material (such as a liquid compound) over substrate 402 and converting the flowable material to a solid material by a suitable technique, such as thermal annealing and/or ultraviolet radiation treating. Subsequent to the deposition of ILD layers 452-458, a CMP process and/or other planarization process is performed, such that ILD layers 452-458 have substantially planar surfaces.

Device-level contacts 460A-460R (also referred to as local interconnects or local contacts), vias 470, and conductive lines 480 (also referred to as a metal one (M1) layer of MLI feature 450) are disposed in ILD layers 452-458 to form interconnect structures. Device-level contacts 460A-460R, vias 470, and conductive lines 480 include any suitable electrically conductive material, such as Ta, Ti, Al, Cu, Co, W, TiN, TaN, other suitable conductive materials, or combinations thereof. Device-level contacts 460A-460R electrically couple and/or physically couple IC device features, such as features of transistors in circuit region 404 and well straps in well strap region 404 to vias 470 of MLI feature 450. For example, device-level contacts 460A-460R are metal-to-device (MD) contacts, which generally refer to contacts to a conductive region, such as source/drain regions, of device 400. In the depicted embodiment, device-level contacts 460A-460L are disposed on respective epitaxial S/D features 440 in circuit region 404. Device-level contacts 460M-460R are disposed on respective epitaxial S/D features 440 in well strap region 406, such that device-level contacts 460M-460R physically (or directly) connect the source/drain regions of p-type well straps 416A/416B and n-type well strap 414 respectively to vias 470. Yet some device-level contacts 460 (e.g., 406A and/or 460C) may not further connect some source/drain regions in the circuit region 404 to another electrically conductive feature of MLI feature 450.

In circuit region 404, a single-port SRAM cell includes six transistors: a pass-gate transistor PG-1, a pass-gate transistor PG-2, a pull-up transistor PU-1, a pull-up transistor PU-2, a pull-down transistor PD-1, and a pull-down transistor PD-1. The single-port SRAM cell is thus alternatively referred to as a 6T SRAM cell. The single-port SRAM cell is formed over n-well 410, p-well 412A, and p-well 412B. Pull-up transistors PU-1, PU-2 are disposed over n-well 410; pull-down transistor PD-1 and pass-gate transistor PG-1 are disposed over p-well 412A; and pull-down transistor PD-2 and pass-gate transistor PG-2 are disposed over p-well 412B. In some embodiments, each transistor may be in a form similar to fin-based multi-gate transistor 300 (FIG. 3). In some implementations, pull-up transistors PU-1, PU-2 are configured as p-type FinFETs, and pull-down transistors PD-1, PD-2 and pass-gate transistors PG-1, PG-2 are configured as n-type FinFETs. In the illustrated embodiment, pull-down transistor PD-1 and pass-gate transistor PG-1 are multi-fin FinFETs (including, for example, a fin 420A and a fin 420B), pull-up transistor PU-1 is a single fin FinFET (including, for example, a fin 420C), pull-up transistor PU-2 is a single fin FinFET (including, for example, a fin 420D), and pull-down transistor PD-2 and pass-gate transistor PG-2 are multi-fin FinFETs (including, for example, a fin 420E and a fin 420F). Fin 420A, fin 420B, fin 420E, and fin 420F are p-type doped fins, and fin 420C and fin 420D are n-type doped fins. A gate structure 430A is disposed over fins 420A, 420B; a gate structure 430B is disposed over fins 420A-420D; a gate structure 430C is disposed over fins 420C-420F; and a gate structure 430D is disposed over fins 420E, 420F. A gate of pass-gate transistor PG-1 is formed from gate structure 430A, a gate of pull-down transistor PD-1 is formed from gate structure 430B, a gate of pull-up transistor PU-1 is formed from gate structure 430B, a gate of pull-up transistor PU-2 is formed from gate structure 430C, a gate of pull-down transistor PD-2 is formed from gate structure 430C, and a gate of pass-gate transistor PG-2 is formed from gate structure 430D.

A device-level contact 460A electrically connects a drain region of pull-down transistor PD-1 (formed by fins 420A, 420B (which can include n-type epitaxial source/drain features)) and a drain region of pull-up transistor PU-1 (formed by fin 420C (which can include p-type epitaxial source/drain features)), such that a common drain of pull-down transistor PD-1 and pull-up transistor PU-1 form a storage node SN. A device-level contact 460B electrically connects a gate of pull-up transistor PU-2 (formed by gate structure 430C) and a gate of pull-down transistor PD-2 (also formed by gate structure 430C) to storage node SN. A device-level contact 460C electrically connects a drain region of pull-down transistor PD-2 (formed by fins 420E, 420F (which can include n-type epitaxial source/drain features)) and a drain region of pull-up transistor PU-2 (formed by fin 420D (which can include p-type epitaxial source/drain features)), such that a common drain of pull-down transistor PD-2 and pull-up transistor PU-2 form a storage node SNB. A device-level contact 460D electrically connects a gate of pull-up transistor PU-1 (formed by gate structure 430B) and a gate of pull-down transistor PD-1 (also formed by gate structure 430B) to storage node SNB. A device-level contact 460E electrically connects a source region of pull-up transistor PU-1 (formed by fin 420C (which can include p-type epitaxial source/drain features)) to a power supply voltage $V_{DD}$ at a voltage node VDDN1, and a device-level contact 460F electrically connects a source region of pull-up transistor PU-2 (formed by fin 420D (which can include p-type epitaxial source/drain features)) to power supply voltage $V_{DD}$ at a voltage node VDDN2. A device-level contact 460G electrically connects a source region of pull-down transistor PD-1 (formed by fins 420A, 420B (which can include n-type epitaxial source/drain features)) to a power supply voltage $V_{SS}$ at a voltage node VSSN1, and a device-level contact 460H electrically connects a source region of pull-down transistor PD-2 (formed by fins 420E, 420F (which can include n-type epitaxial source/drain features)) to power supply voltage $V_{SS}$ at a voltage node VSSN2. In some implementations, power supply voltage $V_{DD}$ is a positive power supply voltage, and power supply voltage $V_{SS}$ is an electrical ground. A device-level contact 460I electrically connects a source region of pass-gate transistor PG-1 (formed by fins 420A, 420B (which can include n-type epitaxial source/drain features)) to a bit line (generally referred to as a bit line node BLN), and a device-level contact 460J electrically connects a source region of pass-gate transistor PG-2 (formed by fins 420E, 420F (which can include n-type epitaxial source/drain features)) to a complementary bit line (generally referred to as a bit line node BLNB). A device-level contact 460K electrically connects a gate of pass-gate transistor PG-1 (formed by gate structure 430A) to a word line WL (generally referred to as a word line node WL), and a device-level contact 460L electrically connects a gate of pass-gate transistor PG-2 (formed by gate structure 430D) to the word line. Though not depicted, it is understood that single-port SRAM cell 400 can further include vias and/or conductive lines of a multilayer interconnect (MLI) feature electrically connected to device-level contacts 460A-460K.

In the well strap region 406, an n-type well strap 414 is configured to electrically connect n-well 410 to a first power supply voltage, such as a power supply voltage $V_{DD}$, and a p-type well strap 416A and a p-type well strap 416B are configured to electrically connect p-well 412A and p-well 412B, respectively, to a second power supply voltage, such as a power supply voltage $V_{SS}$. P-type well strap 416A includes a fin 420G disposed over (and electrically connected to) p-well 412A, p-type well strap 416B includes a fin 420I disposed over (and electrically connected to) p-well 412B, and n-type well strap 414 includes fin 420H disposed over (and electrically connected to) n-type doped region 410. Device-level contacts 460M/460N electrically connects respective source/drain regions of fin 420G to a conductive line 480 through vias 470, device-level contacts 460O/460P electrically connects respective source/drain regions of fin 420H to a conductive line 480 through vias 470 (FIG. 4D), and device-level contacts 460Q/460R electrically connects respective source/drain regions of fin 420I to a conductive line 480 through vias 470.

Figure 5:
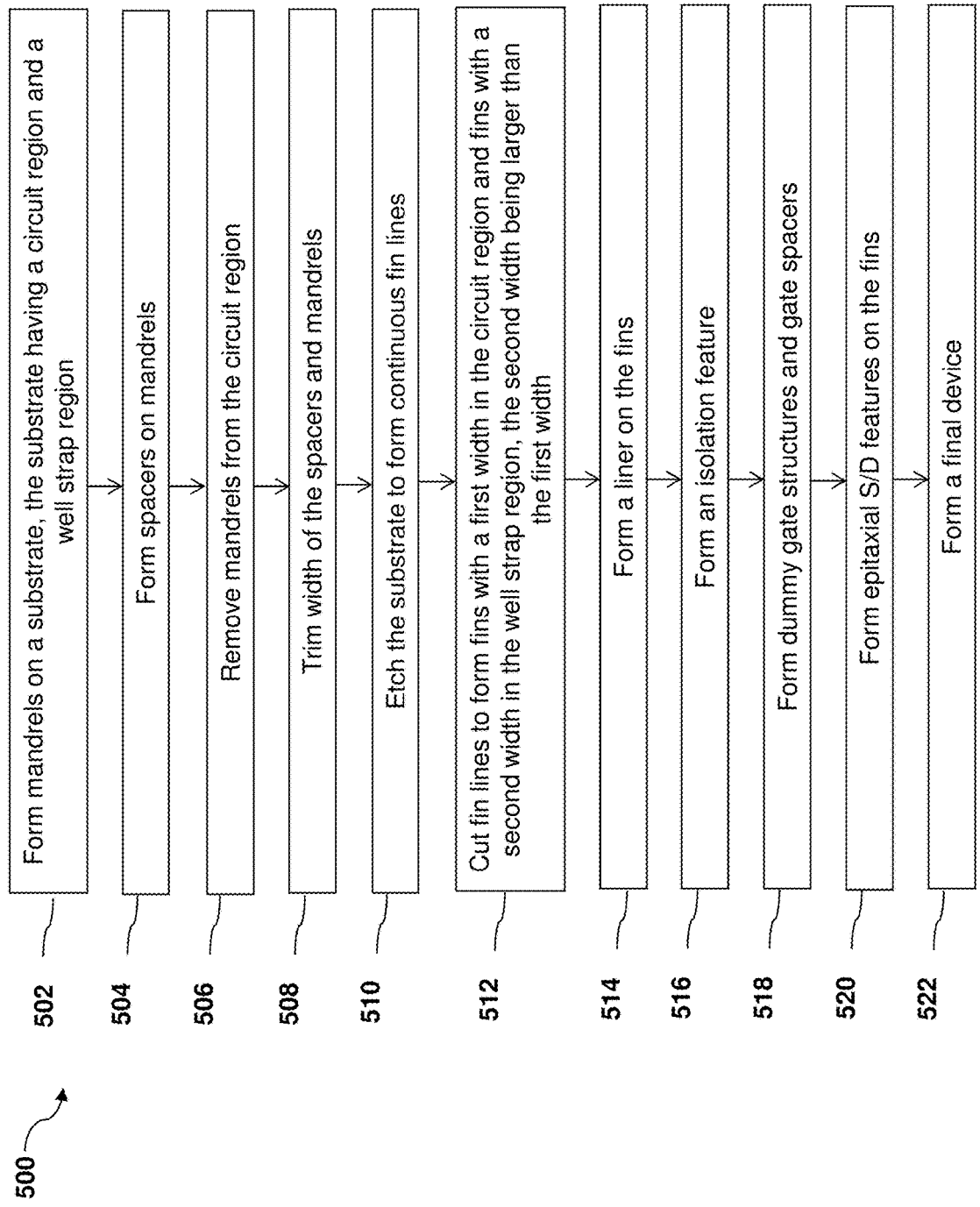
FIG. 5 shows a flow chart of a method of forming a memory device, according to various aspects of the present disclosure.

Illustrated in FIG. 5 is a method 500 of manufacturing an IC according to various aspects of the present disclosure. Method 500 is merely an example, and is not intended to limit the present disclosure beyond what is explicitly recited in the claims. Additional operations can be provided before, during, and after method 500, and some operations described can be replaced, eliminated, or moved around for additional embodiments of the method. Method 500 is described below in conjunction with FIGS. 6A-20B. FIGS. 6A-20B have been simplified for the sake of clarity to better understand the inventive concepts of the present disclosure. FIGS. 6A, 7A, 8A, 9A, 10A, 11A, 12A, 13A, 16A, 17A, 18A, 19A, and 20A illustrate cross-sectional views along the B-B line in a circuit region 404 of device 400 in FIG. 4A according to various stages of method 500. FIGS. 6B, 7B, 8B, 9B, 10B, 11B, 12B, 13B, 16B, 17B, 18B, 19B, and 20B illustrate cross-sectional views along the C-C line in a well strap region 406 of device 400 in FIG. 4A according to various stages of method 500. FIGS. 14A and 15A illustrate top views of device 400 in FIG. 4A according to various stages of method 500. FIGS. 14B and 15B illustrate cross-sectional views along the A-A line in FIGS. 14A and 15A, respectively. Reference numerals as in FIGS. 4A-4D are repeated for ease of understanding.

Figure 6A:
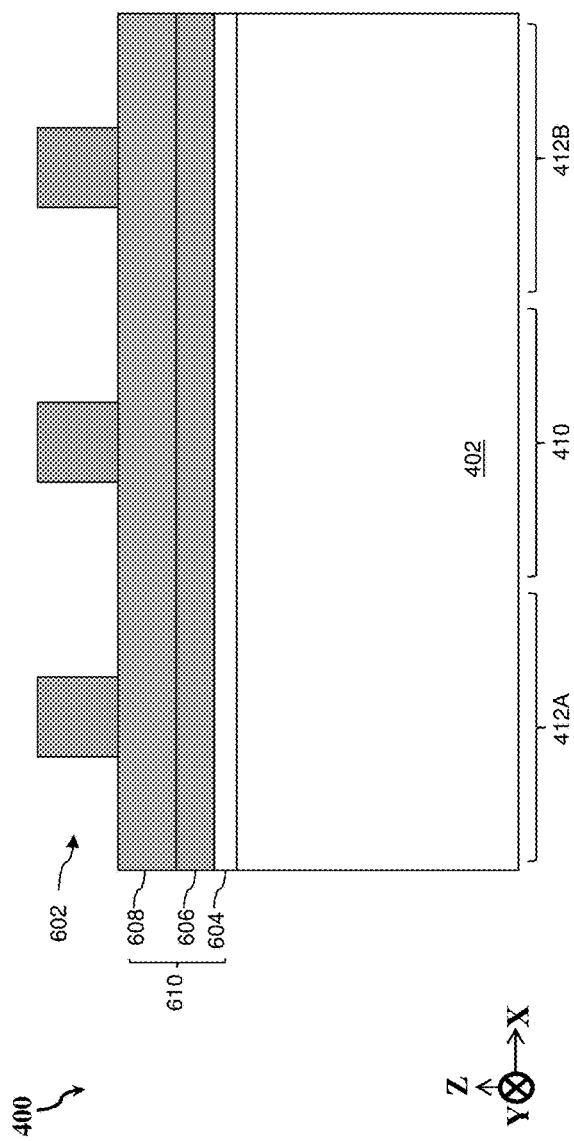
Figure 6B:
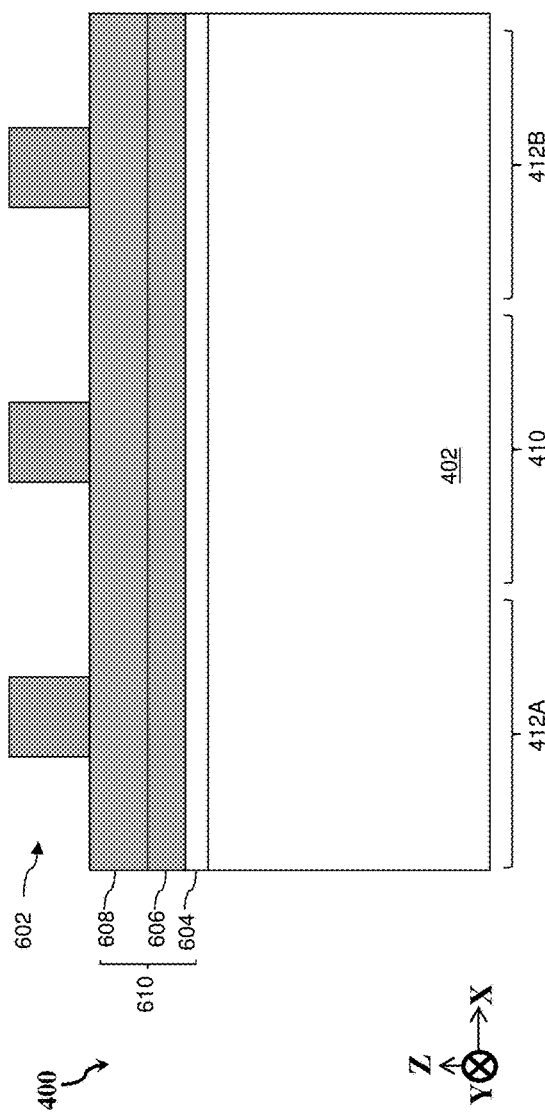

Method 500 at operation 502 (FIG. 5) forms mandrels 602 on a substrate 402. Referring to FIGS. 6A and 6B, although mandrels 602 are illustrated as rectangular-shaped lines, such is not required for some embodiments. Each mandrel 602 is a dummy feature and will be removed at a later fabrication stage.

Substrate 402 includes a semiconductor substrate, such as a silicon wafer. Alternatively, substrate 402 includes germanium, silicon germanium or other proper semiconductor materials. In one embodiment, substrate 402 includes an epitaxy (or epi) semiconductor layer. In another embodiment, substrate 402 includes a buried dielectric material layer for isolation formed by a proper technology, such as a technology referred to as separation by implanted oxygen (SIMOX). In some embodiments, substrate 402 may be a semiconductor on insulator, such as silicon on insulator (SOI).

Substrate 402 may include various doped regions depending on design requirements as known in the art. The doped regions may be doped with p-type dopants, such as boron or $BF_2$; n-type dopants, such as phosphorus or arsenic; or combinations thereof. The doped regions may be formed directly on substrate 402, in a p-well structure, in an n-well structure, in a dual-well structure, or using a raised structure. In the illustrated embodiment, substrate 402 includes an n-well 410 disposed between a p-well 412A and a p-well 412B.

In one embodiment, prior to forming mandrels 602, a hard mask 610 is formed over substrate 402 to pattern substrate 402 as an etch mask in subsequent processes. Hard mask 610 may include multiple layers to gain process flexibility. In the present example, hard mask 610 includes a first oxide layer (e.g., silicon oxide) 604 deposited over substrate 402, a nitride layer (e.g., silicon nitride) 606 deposited over first oxide layer 604, and a second oxide layer (e.g., silicon oxide) 608 deposited over nitride layer 606. One or more of the layers 604, 606, and 608 may be formed by various methods, including thermal oxidation, a chemical vapor deposition (CVD) process, plasma enhanced CVD (PECVD), atomic layer deposition (ALD), and/or other methods known in the art.

Mandrels 602 are then formed over hard mask 610. In one embodiment, mandrels 602 are formed by depositing a mandrel material layer, such as a dielectric material (e.g., amorphous silicon, silicon oxide, or silicon nitride), forming a patterned photo resist layer over the mandrel material layer, and etching the mandrel material layer using the patterned resist layer as an etch mask, thereby forming mandrels 602. In another embodiment, mandrels 602 are resist patterns.

Figure 8A:
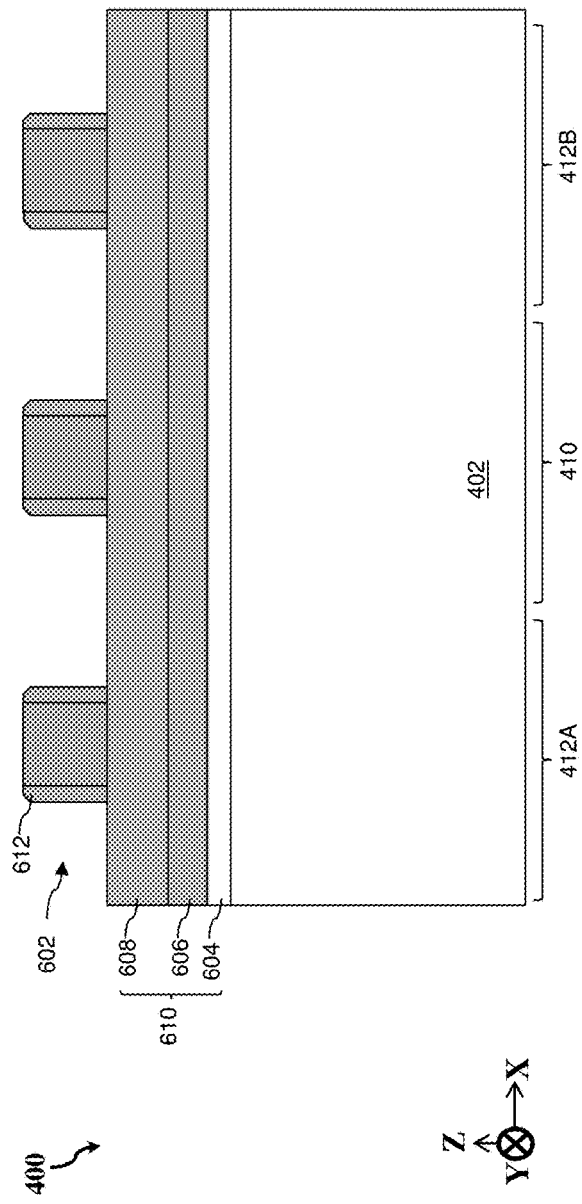
Figure 8B:
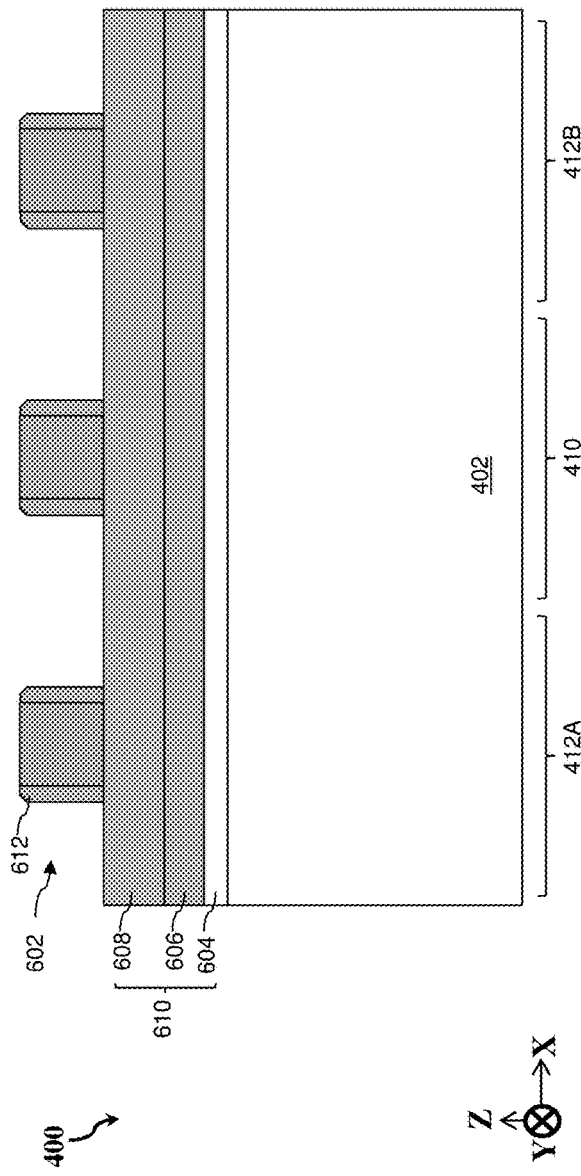

At operation 504, method 500 (FIG. 5) forms spacers 612 on sidewalls of mandrels 602. In an embodiment, spacers 612 may include a dielectric material, such as titanium nitride, silicon nitride, or titanium oxide. Spacers 612 can be formed by various processes, including a deposition process and an etching process. Referring to FIGS. 7A and 7B, the deposition process may include depositing spacers 612 as a blanket layer covering mandrels 602 and hard mask 610 by any suitable technique including thermal growth, CVD, PVD, and ALD. In the illustrated embodiment, the blanket layer includes silicon nitride and is deposited by a conformal deposition technique, such as an ALD process. Referring to FIGS. 8A and 8B, the etching process may include an anisotropic etch such as plasma etch. The anisotropic etch removes majority of the horizontal portions of the blanket layer from top surfaces of hard mask 610 and mandrels 602, while vertical portions of the blanket layer remains on sidewalls of mandrels 602 as spacers 612.

Figure 9A:
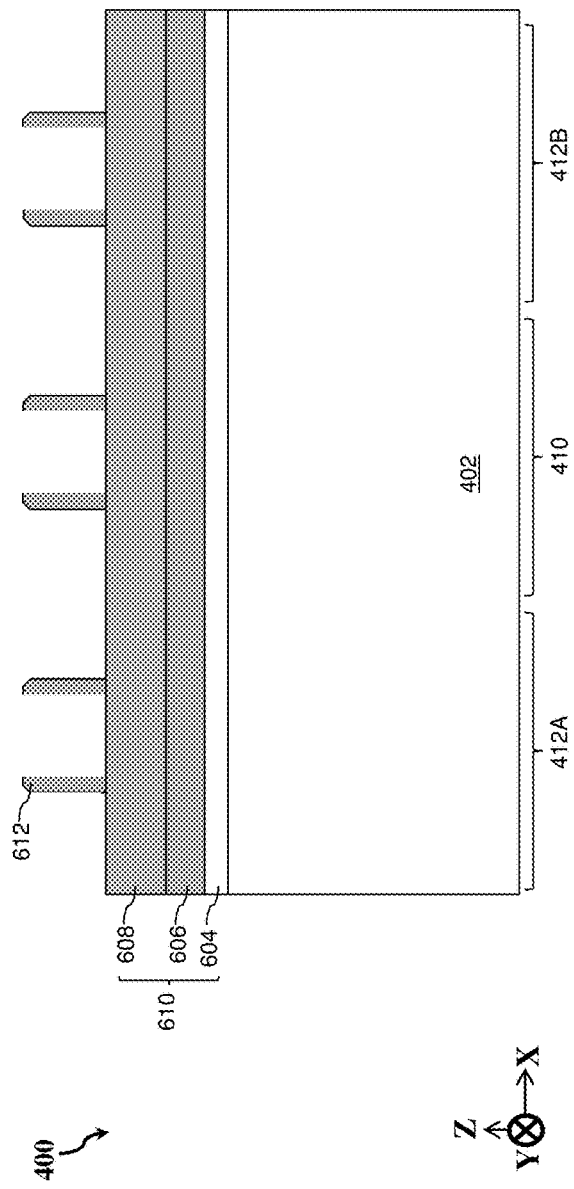
Figure 9B:
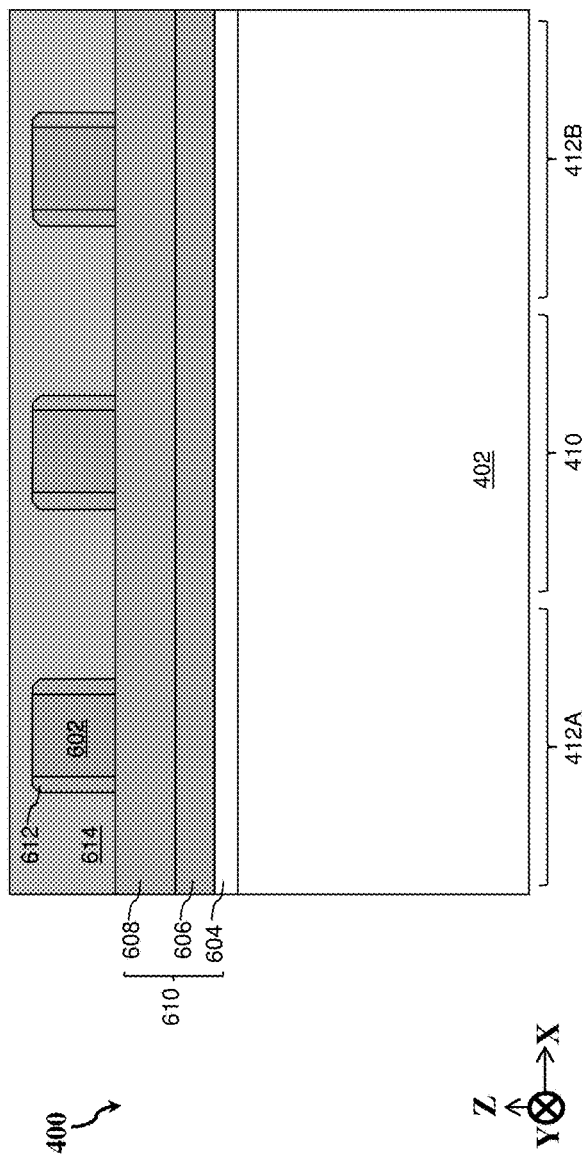

At operation 506, method 500 (FIG. 5) removes mandrels 602 from circuit region 404. Referring to FIGS. 9A and 9B, spacers 612 remain over hard mask 610 after the mandrels 602 has been removed from the circuit region, e.g., by an etching process selectively tuned to remove the dielectric material of mandrels 602 but not the dielectric material of spacers 612. The etching process can be a wet etching, a dry etching, or a combination thereof. A resist layer 614 may be formed covering mandrels 602 in the well strap region prior to the etching process, such that mandrels 602 in well strap region 406 remain over hard mask 610. Resist layer 614 is subsequently removed after operation 506, for example, by a resist stripping process or other suitable process.

Figure 11A:
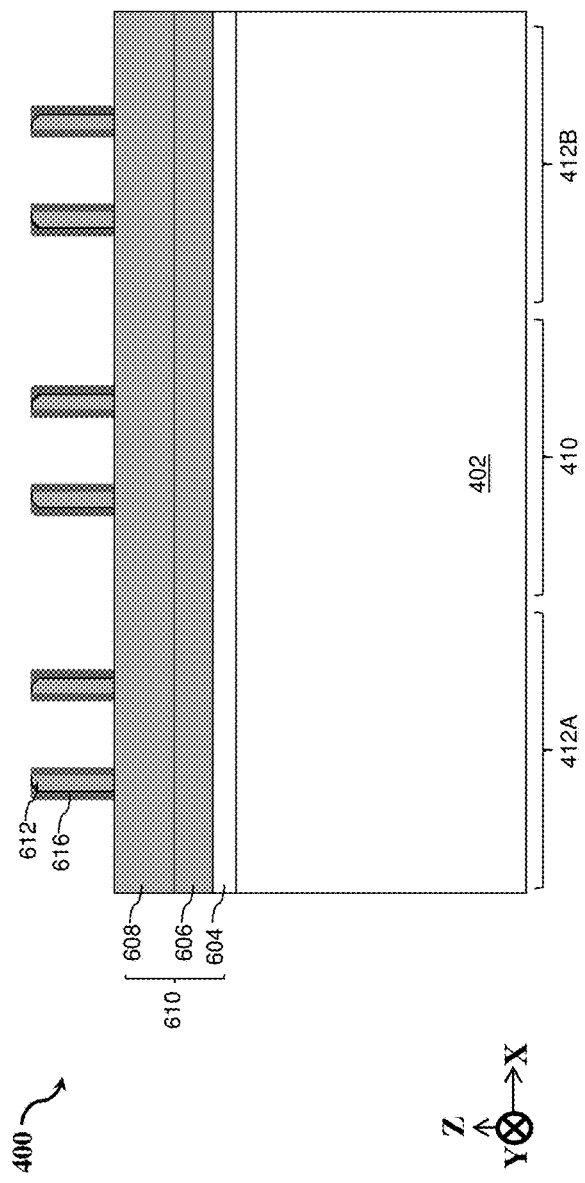
Figure 11B:
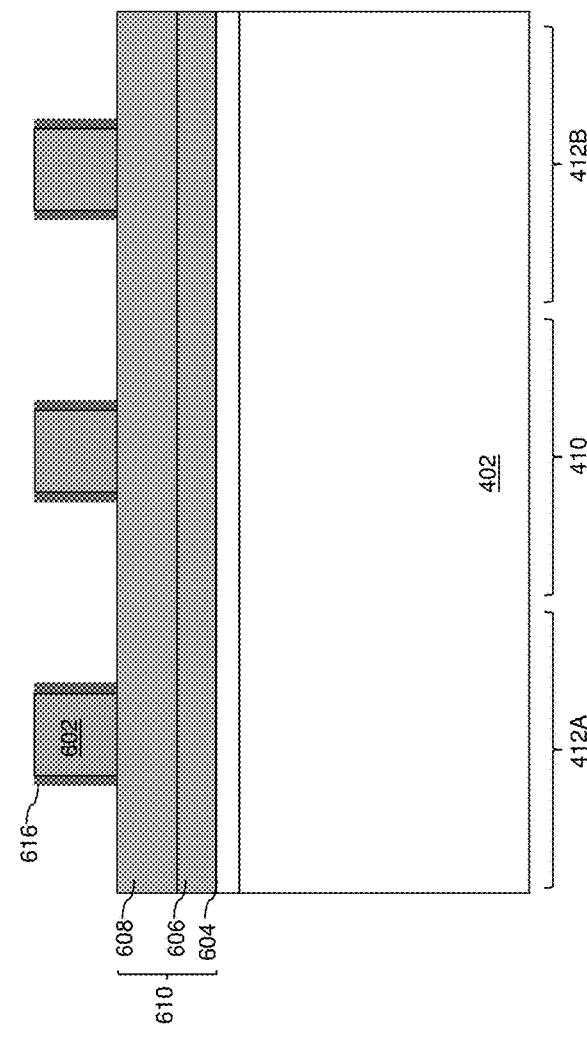

Since spacers 612 in the circuit region may suffer etching loss during the removal of mandrels 602, resulting in a width reduction, method 500 (FIG. 5) may optionally proceed to operation 508 to trim widths of spacers 612 in circuit region 404 (or together with mandrels 602 in well strap region 406). In an embodiment, a dielectric liner 616 is deposited on sidewalls of spacers 612 in circuit region 404 and mandrels 602 in well strap region 406. Dielectric liner 616 may include a dielectric material, such as titanium nitride, silicon nitride, or titanium oxide. Dielectric liner 616 can be formed by various processes, including a deposition process and an etching process. Referring to FIGS. 10A and 10B, the deposition process may include depositing dielectric liner 616 as a blanket layer covering spacers 612, mandrels 602, and hard mask 610 by any suitable technique including thermal growth, CVD, PVD, and ALD. In the illustrated embodiment, the blanket layer includes silicon nitride and is deposited by a conformal deposition technique, such as an ALD process. Referring to FIGS. 11A and 11B, the etching process may include an anisotropic etch such as plasma etch. The anisotropic etch removes majority of the horizontal portions of the blanket layer from top surfaces of hard mask 610, spacers 612, and mandrels 602, while vertical portions of the blanket layer remain on sidewalls of spacers 612 and mandrels 602 as dielectric liner 616.

At operation 510, method 500 (FIG. 5) etches substrate 402 to form continuous fin lines. Referring to FIGS. 12A and 12B, at operation 510, hard mask 610 is etched by using spacers 612 and mandrels 602 as an etch mask to form a patterned hard mask 610. The etching process may include multiple etching steps. The etching process may first etch second oxide layer 608 to transfer a pattern defined by spacers 612 and mandrels 602 to second oxide layer 608. The etching process then etches nitride layer 606 by using second oxide layer 608 as an etch mask. The etching process then etches first oxide layer 604 by using nitride layer 606 and second oxide layer 608 as an etch mask. Spacers 612 and mandrels 602 may subsequently be removed by a wet etching process, a dry etching process, or a combination thereof. Referring to FIGS. 13A and 13B, after patterned hard mask 610 is formed, substrate 402 is etched using patterned hard mask 610 to define fin lines 420. The etching processes may include any suitable etching technique such as wet etching, dry etching, RIE, ashing, and/or other etching methods. In some embodiments, etching includes multiple etching steps with different etching chemistries, each targeting a particular material of substrate 402 and each selected to resist etching hard mask 610. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $C_{12}$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The remaining portions of the semiconductor layers become fin lines 420.

A top view of the resultant structure after operation 510 is shown in FIG. 14A. Multiple fin lines 420 are created by patterning substrate 402 at operation 510. Fin lines 420 extend continuously lengthwise from circuit region 404 to well strap region 406 along a y-direction. Each fin line 420 includes multiple sections connected to form a continuous piece. For example, referring to FIG. 14B for a cross-sectional view along the A-A line of FIG. 14A, fin line 420 over n-well 410 includes a fin portion 420C in circuit region 404, a fin portion 420H in well strap region 406, and a middle portion 420CH connecting fin portions 420C and 420H. Middle portion 420CH extends across regions 404 and 406. Since fin portion 420C is defined by a spacer 612 and fin portion 420H is defined by a mandrel 602, a width W1 of fin portion 420C is smaller than a width W2 of fin portion 420H. As discussed above, a ratio between W2 and W1 ranges from about 1.5:1 to about 5:1 in various embodiments. In the illustrated embodiment, width W2 of fin portion 420H substantially equals to a fin pitch P of the adjacent fin portions above n-well 410. Depending on alignment between a center line of fin portion 420C and an edge of middle portion 420H, in various other embodiments, width W2 may be larger or smaller than fin pitch P. As will be explained in further detail below, fin lines 420 will be divided into multiple fins by a fin cut process defined in cut windows 620.

At operation 512, method 500 (FIG. 5) performs a fin cut process to cut fin lines 420 into fins. The resultant structure is shown in FIGS. 15A and 15B, in which FIG. 15A is a top view of device 400 and FIG. 15B is a cross-sectional view along the A-A line of FIG. 15A. In the present embodiment, the fin cut process includes a lithography process and an etching process. For example, a photoresist layer is formed on device 400 using a spin-coating process and soft baking process. Then, the photoresist layer is exposed to a radiation. The exposed photoresist layer is subsequently developed and stripped thereby forming a patterned photoresist layer defining cut windows (openings) 620. Fin lines 420 are partially protected by the patterned photoresist layer. Subsequently, fin lines 420 are etched through the openings of the patterned photoresist layer. The patterned photoresist layer is removed thereafter using a suitable process, such as wet stripping or plasma ashing.

Still referring to FIGS. 15A and 15B, in the illustrated embodiment, six fins 420A, 420B, 420C, 420D, 420E, 420F are formed in circuit region 404. Three fins 420G, 420H, 420I are formed in well strap region 406. The fin cut process may also trim end portions of some fins, such as fins 420C and 420D, as illustrated in FIG. 15A. The portions of the fin line 420 (e.g., middle portion 420CH) covered by the cut windows 620 are substantially removed. However, as shown in FIG. 15B, small portions of the fin lines 420 under the cut windows 620 may remain because fin etching process typically does not completely etch to the bottom of fin lines 420 to avoid over-etching of substrate 402. The small residual portions of fin line 420 are referred to as fin stubs because they are much shorter (along a z-direction) than the regular fins (e.g., 420A-420I). For example, fin stub 420CH connects a bottom portion of fin 420C and fin 420H. There are other fin stubs shown in FIG. 15B, though not labeled. Notably, various other lithography methods may be applied to form fin lines. For example, fins 420A, 420B, 420C, 420D, 420E, 420F, 420G, 420H, 420I can be formed by first patterning spacers 612 and mandrels 602 in segments that correspond to to-be-formed fins in lithography process first and then transferring the pattern defined in spacers 612 and mandrels 602 to substrate 402. In this way, a fin cut process may be skipped and fin stub 420CH (and other fin stubs) may not exist between bottom portions of adjacent fins.

At operation 514, the method 500 (FIG. 5) forms a dielectric liner 622 along top and sidewall surfaces of fins 420A-420I. Referring to FIGS. 16A and 16B, in some embodiments, dielectric liner 622 is disposed conformally on top and sidewall surfaces of fins 420A-420I. The term "conformally" may be used herein for ease of description upon a layer having substantial same thickness over various regions. By way of example, dielectric liner 622 may be formed by depositing a dielectric material using processes such as, CVD process, a subatmospheric CVD (SACVD) process, a flowable CVD process, an ALD process, a PVD process, or other suitable process. In some embodiments, dielectric liner 622 is an oxide layer (e.g., $SiO_2$) formed by oxidizing exposed surfaces of fins 420A-420I and substrate 402. The oxidation process results in the oxide layer having a determined thickness. For example, the oxide layer may have a thickness from about 1 nm to about 5 nm. In some embodiments, the oxidation process comprises a rapid thermal oxidation (RTO) process, high pressure oxidation (HPO), chemical oxidation process, in-situ steam generation (ISSG) process, or enhanced in-situ steam generation (EISSG) process. In some embodiments, the RTO process is performed at a temperature of about 400° C. to about 700° C., using 02 and 03 as reaction gases, for about 1 second to about 30 seconds. In other embodiments, an HPO is performed using a process gas of $O_2$, $O_2+N_2$, $N_2$, or the like, at a pressure from about 1 atm to about 25 atm and a temperature from about 300° C. to about 700° C., for about 1 minute to about 10 minutes. Examples of a chemical oxidation process include wet SPM clean, wet $O_3/H_2O$, or the like. The 03 may have a concentration of about 1 ppm to about 50 ppm.

At operation 516, method 500 (FIG. 5) forms isolation features, such as shallow trench isolation (STI) features 408. Referring to FIGS. 17A and 17B, STI features 408 is disposed on substrate 402 interposing fins 420A-420I. By way of example, in some embodiments, a dielectric layer is first deposited over the substrate 402, filling trenches between fins 420A-420I with dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a SACVD process, a flowable CVD process, an ALD process, a PVD process, and/or other suitable process. In some embodiments, after deposition of the dielectric layer, device 400 may be annealed, for example, to improve the quality of the dielectric layer. In some embodiments, the dielectric layer may include a multi-layer structure, for example, having one or more liner layers. For example, dielectric liner 622 may be part of STI features 408. In some embodiments of forming isolation features, after deposition of the dielectric layer, the deposited dielectric material is thinned and planarized, for example by a chemical mechanical polishing (CMP) process. In some embodiments, nitride layer 606 and first oxide layer 604 function as a CMP stop layer. Subsequently, the dielectric layer interposing fins 420A-420I are recessed. Referring to the example of FIGS. 17A and 17B, STI features 408 are recessed providing fins 420A-420I extending above STI features 408. In some embodiments, the recessing process may include a dry etching process, a wet etching process, and/or a combination thereof. In some embodiments, a recessing depth is controlled (e.g., by controlling an etching time) so as to result in a desired height of the exposed upper portion of fins 420A-420I.

At operation 518, method 500 (FIG. 5) forms gate stacks (not shown) and gate spacers 438 on sidewalls of dummy gate stacks. In an embodiment, the gate stacks are dummy (sacrificial) gate stack that are subsequently removed. Thus, in some embodiments using a gate-last process, the gate stacks are dummy gate stacks and will be replaced by the final gate stack at a subsequent processing stage of device 400. In particular, the dummy gate stacks may be replaced at a later processing stage by a high-K dielectric layer (HK) and metal gate electrode (MG). Referring to FIGS. 18A and 18B, by way of example, gate spacers 438 may be formed by conformally depositing a dielectric material over device 400 using processes such as a CVD process, a subatmospheric CVD (SACVD) process, a flowable CVD process, an ALD process, a PVD process, or other suitable process. Following the conformal deposition of the dielectric material, portions of the dielectric material used to form gate spacers 438 may be etched-back to expose portions of fins 420A-420I not covered by the dummy gate stacks (e.g., for example, in source/drain regions). In some cases, the etch-back process removes majority of horizontal portions of dielectric material, thereby exposing top surfaces of fins 420A-420I. In some embodiments, the etch-back process may include a wet etch process, a dry etch process, a multiple-step etch process, and/or a combination thereof. It is noted that after the etch-back process, in source/drain regions gate spacers 438 remain disposed on sidewalls of fins 420A-420I.

Figure 19A:
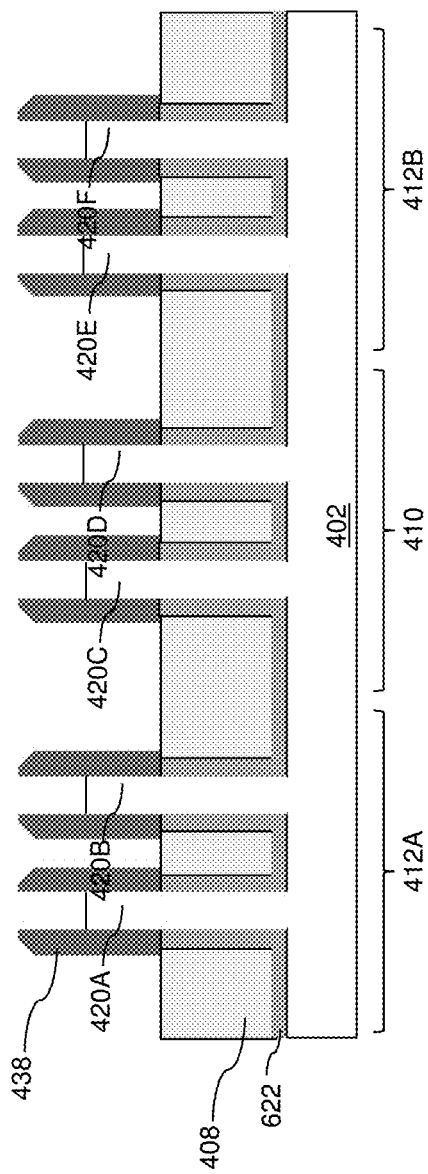
Figure 19B:
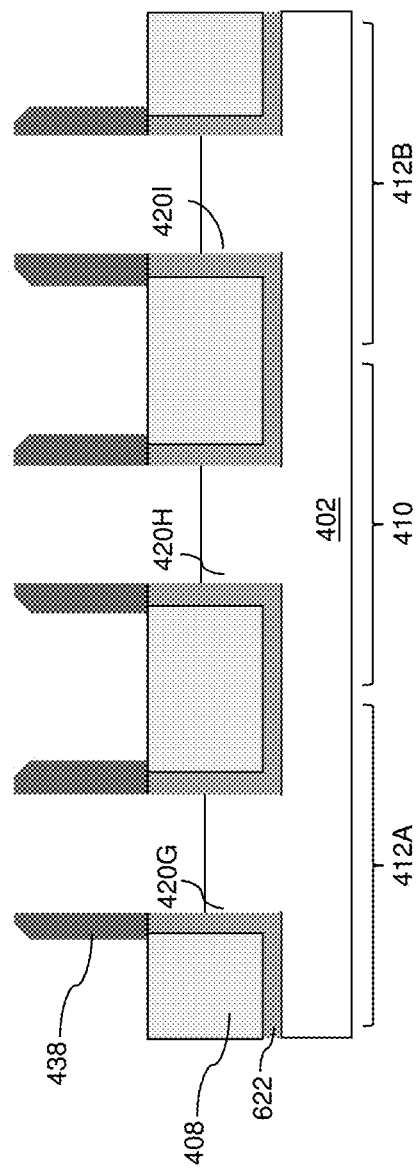

At operation 520, the method 500 (FIG. 5) forms epitaxial S/D features 440 in source/drain regions of fins 420A-420I. Referring to FIGS. 19A and 19B, in some embodiments of operation 520, a source/drain etch process is performed prior to the forming of epitaxial S/D features 440. A source/drain etch process is performed to remove portions of fins 420A-420I not covered by the dummy gate stacks (e.g., in source/drain regions). In some embodiments, the source/drain etch process may include a dry etching process, a wet etching process, and/or a combination thereof. Since fins 420G-420I has larger width than fins 420A-420F, the recesses over fins 420G-420I have larger openings over fins 420G-420I than fins 420A-420F. Consequently, there is less etch loading effect during recessing fins 420G-420I than fins 420A-420F, and etch rate of fins 420G-420I is larger than fins 420A-420F. Accordingly, fins 420G-420I are recessed faster than fins 420A-420F. In the illustrated embodiment, top surfaces of fins 420G-420I are recessed below STI features 408, while top surfaces of fins 420A-420F are still above STI features 408. Referring to FIGS. 20A and 20B, in an embodiment of operation 520, epitaxial S/D features 440 are formed in source/drain regions adjacent to and on either side of the dummy gate stacks. For example, epitaxial S/D features 440 may be formed over the exposed top portions of fins 420A-420I and in contact with the adjacent gate spacers 438. In some embodiments, epitaxial S/D features 440 are formed by epitaxially growing a semiconductor material layer in the source/drain regions. In various embodiments, epitaxial S/D features 440 may include Ge, Si, GaAs, AlGaAs, SiGe, GaAsP, SiP, or other suitable material. Epitaxial S/D features 440 may be in-situ doped during the epitaxial process by introducing doping species including: p-type dopants, such as boron or $BF_2$; n-type dopants, such as phosphorus or arsenic; and/or other suitable dopants including combinations thereof. If epitaxial S/D features 440 are not in-situ doped, an implantation process (i.e., a junction implant process) is performed to dope epitaxial S/D features 440. In an exemplary embodiment, epitaxial S/D features 440 over fins 420A, 420B, 420E, 420F, 420H include n-type dopant, while epitaxial S/D features 440 over fins 420C, 420D, 420G, 420I include p-type dopant. Due to larger fin width and lower fin top surfaces, epitaxial S/D features 440 over fins 420G, 420H, 420I generally have larger volume than epitaxial S/D features 440 over fins 410A, 420B, 420C, 420D, 420E, 420F. In some embodiments, neighboring epitaxial S/D features 440 may merge, forming a merged epitaxial S/D feature spanning over more than one fin, such as epitaxial S/D features 440 over fins 420C and 420D in the illustrated embodiment.

At operation 522, the method 500 (FIG. 5) perform further processes to finish a functional circuit. The device 400 may undergo further processing to form various features and regions known in the art. For example, the dummy gate stacks may be replaced by high-k metal-gate stacks, and silicidation or germano-silicidation may be formed on the epitaxial S/D features 440. Furthermore, subsequent processes may form contact openings, contact metal, as well as various contacts/vias/lines and multilayers interconnect features (e.g., metal layers and interlayer dielectrics) on substrate 402, configured to connect the various features to form a functional circuit that may include one or more memory devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Figure 21A:
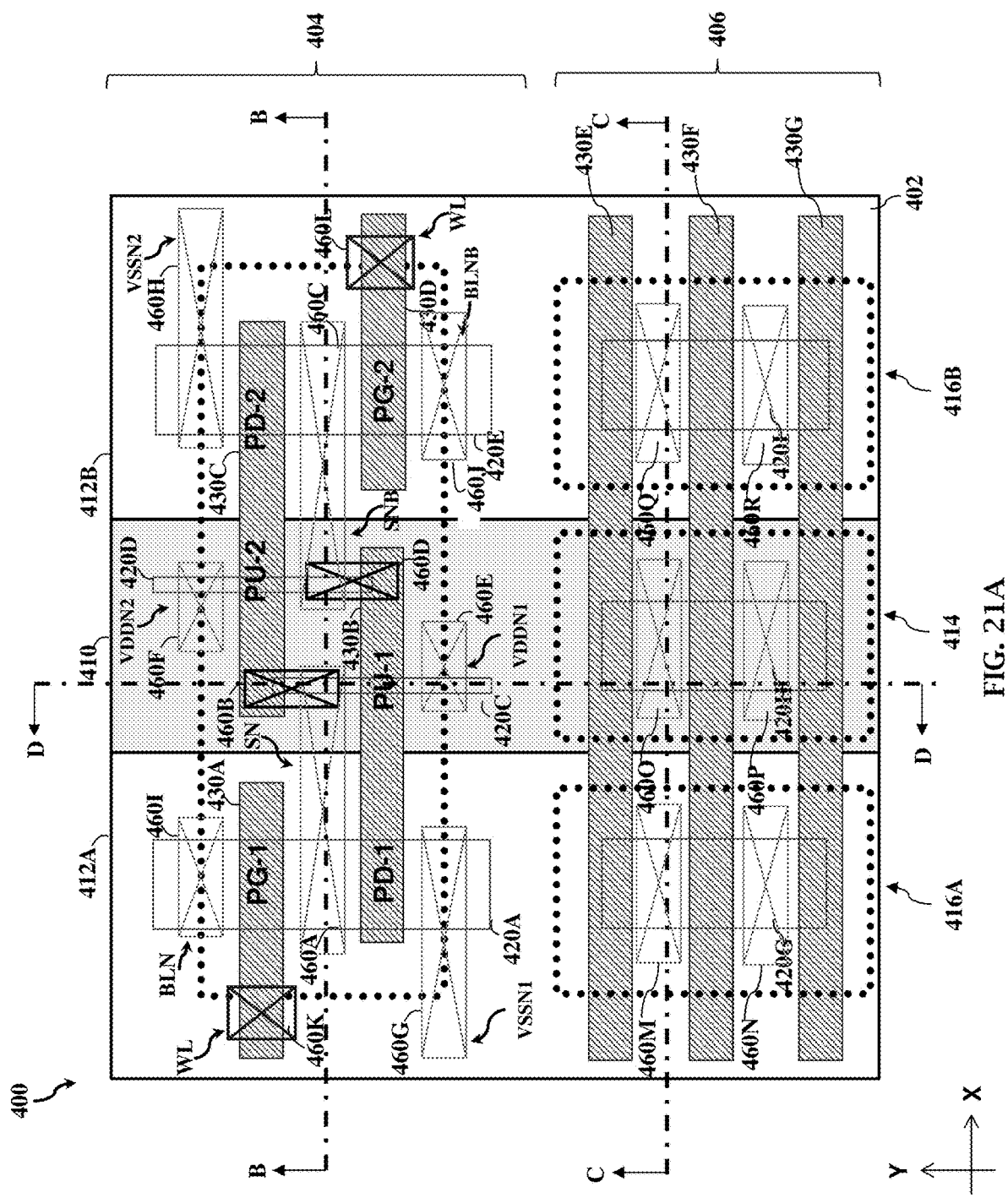
FIGS. 21A, 21B, 21C, and 21D are fragmentary diagrammatic views of an alternative embodiment of a memory device, in portion or entirety, according to various aspects of the present disclosure.
Figure 21B:
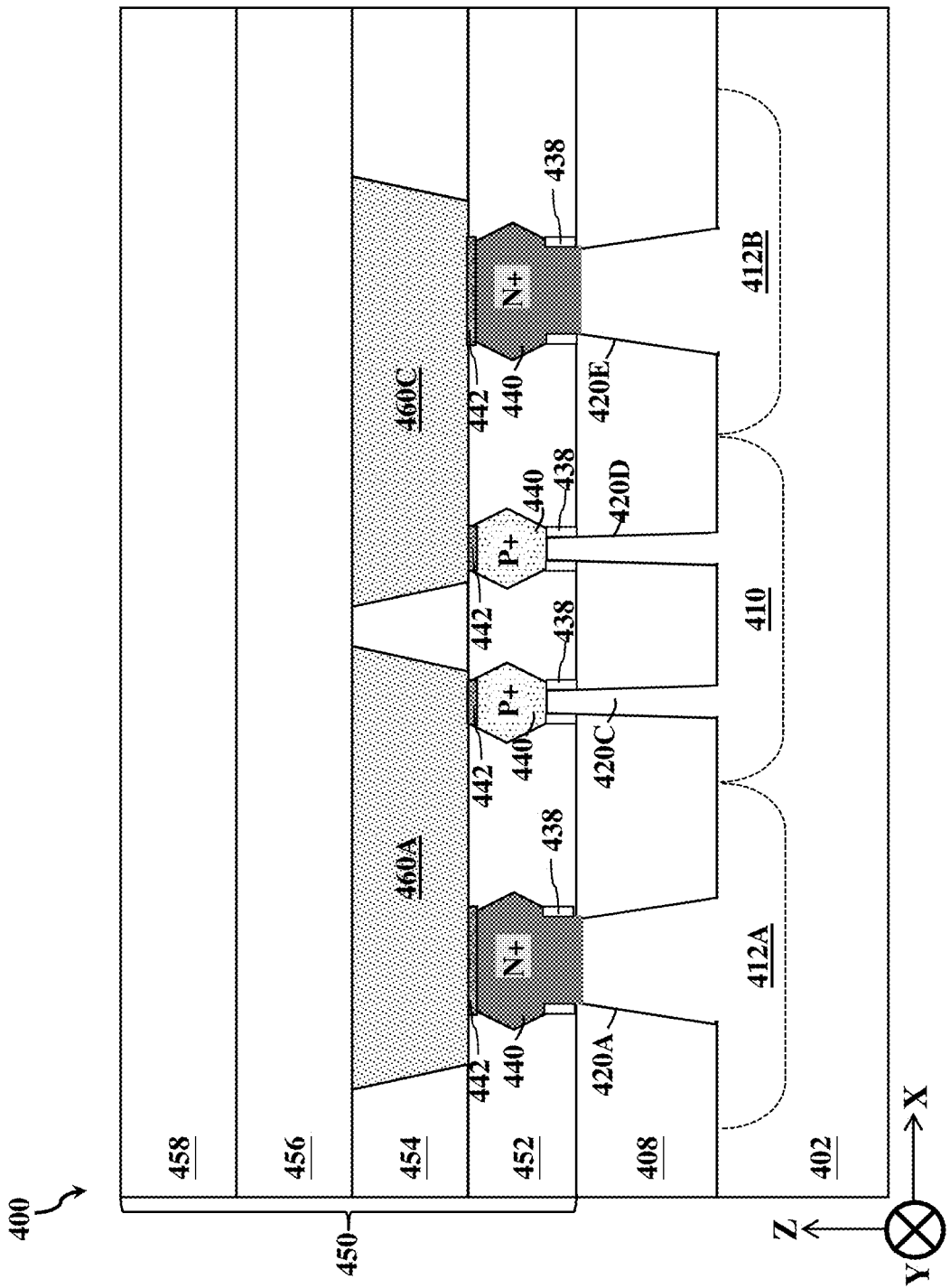
Figure 21C:
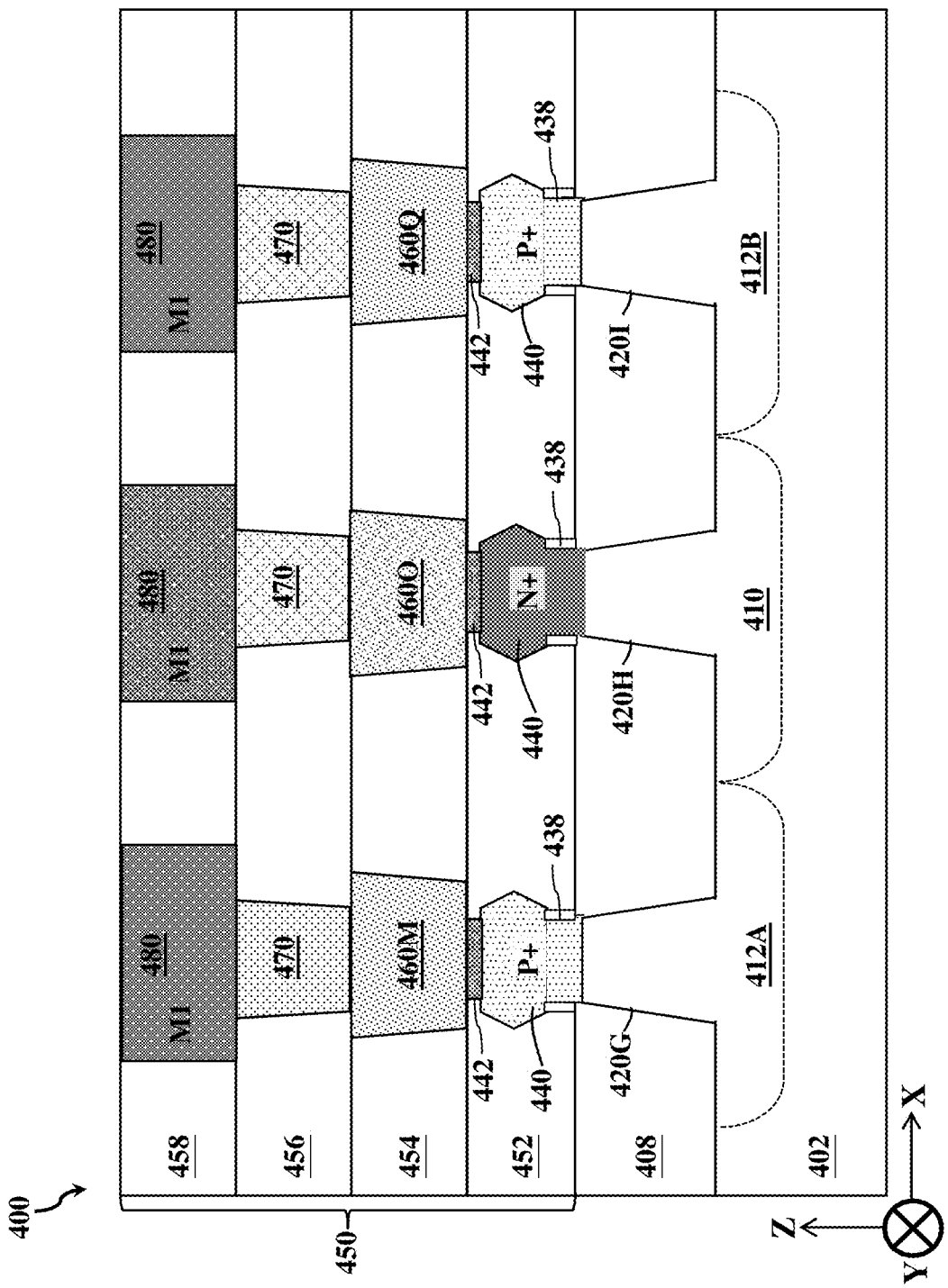
Figure 21D:
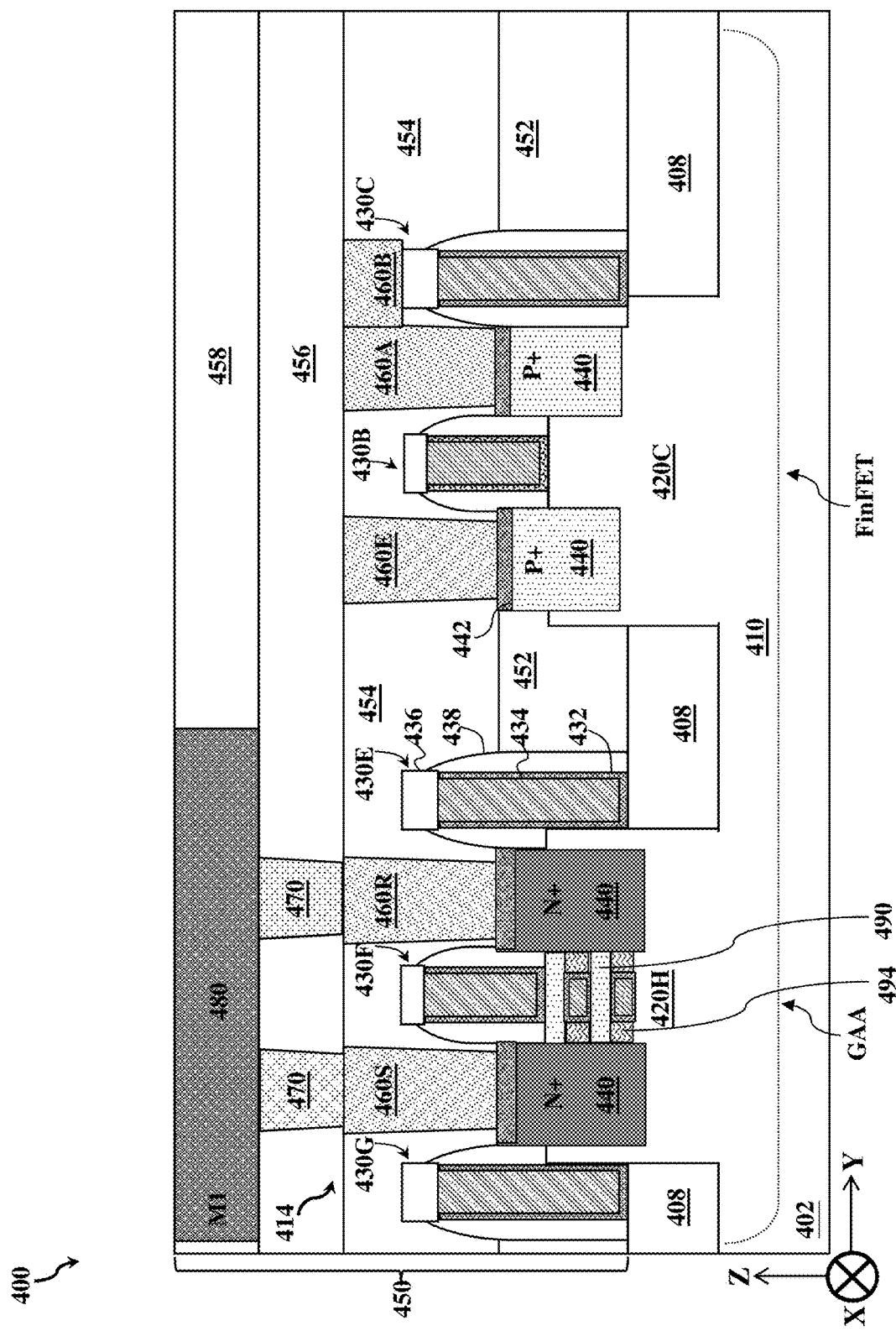

FIGS. 21A-21D are fragmentary diagrammatic views of an alternative embodiment of device 400. In particular, FIG. 21A is a simplified schematic top view of device 400 (for example, in an x-y plane); FIG. 21B is a diagrammatic cross-sectional view of device 400 along line B-B of FIG. 21A (for example, in an x-z plane); FIG. 21C is a diagrammatic cross-sectional view of device 400 along line C-C of FIG. 21A (for example, in an x-z plane); and FIG. 21D is a diagrammatic cross-sectional view of device 400 along line D-D of FIG. 4A (for example, in a y-z plane). May aspects of the alternative embodiment of device 400 as shown in FIGS. 21A-21D are the same as those of device 400 as shown in FIGS. 4A-4D. Some differences are discussed below.

In FIGS. 4A-4D, in circuit region 404, channels of pull-down transistors PD-1/PD-2 and pass-gate transistors PG-1/PG-2 are provided by multi-fin FinFETs (e.g., a fin 420A and a fin 420B over p-well 412A; a fin 420E and a fin 420F over p-well 412B). In FIGS. 21A-21D, in circuit region 404, channels of pull-down transistors PD-1/PD-2 and pass-gate transistors PG-1/PG-2 are provided by vertically stacked channel layers (e.g., nanowire or nanosheet) of GAA transistors. Pull-up transistors PU-1/PU-2 are still in form of single fin FinFETs (including, for example, a fin 420C and a fin 420D, respectively). In the illustrated embodiment, fin-like structures (also referred to as fin) 420A and 420E provide vertically stacked nanosheets 490 (FIG. 21D) as channels of respective GAA transistors. Gate structures 430 (including gate dielectric 432 and gate electrode 434) wrap around and engage each nanosheet 490. Inner spacers 494 interpose epitaxial S/D features 440 and gate structures 430 providing isolation.

In some embodiments, inner spacers 494 include a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, inner spacers 494 include a low-k dielectric material. Inner spacers 494 may be formed by deposition and etching processes. For example, after S/D trenches are etched and before epitaxial S/D features 440 are epitaxially grown from the S/D trenches, an etch process may be used to recess sacrificial semiconductor layers between the adjacent channel layers 490 to form gaps vertically between the adjacent channel layers 490. Then, one or more dielectric materials are deposited (using CVD or ALD for example) to fill the gaps. Another etching process is performed to remove the dielectric materials outside the gaps, thereby forming inner spacers 494.

From a top view (FIG. 21A), a width of fins 420A and 420E in circuit region 404 substantially equals to that of fins 420G-420I in well strap region 406, which is about 1.5 times to about 5 times of a width of fins 420C and 420D. In some embodiments, in source/drain regions, fins 420A, 420E, 420G, 420H, 420I are recessed below isolation features 408 and epitaxial S/D features 440 deposited on fins 420A, 420E, 420G, 420H, 420I have larger volume than epitaxial S/D features 440 on fins 420C and 420D.

Method 500 discussed above in association with FIGS. 6A-20B can also be applied to form the alternative embodiment of device 400 as shown in FIGS. 21A-21D. In the following FIGS. 22A-33B and 34, the manufacturing operations of method 500 in forming the alternative embodiment of device 400 are discussed. Similar aspects are not repeated below in interest of conciseness. FIGS. 22A-33B have been simplified for the sake of clarity to better understand the inventive concepts of the present disclosure. FIGS. 22A, 23A, 24A, 25A, 26A, 27A, 30A, 31A, 32A, and 33A illustrate cross-sectional views along the B-B line in a circuit region 404 of device 400 in FIG. 21A according to various stages of method 500. FIGS. 22B, 23B, 24B, 25B, 26B, 27B, 30B, 31B, 32B, 33B, and 34 illustrate cross-sectional views along the C-C line in a well strap region 406 of device 400 in FIG. 21A according to various stages of method 500. FIGS. 29A and 30A illustrate top views of device 400 in FIG. 21A according to various stages of method 500. FIGS. 29B and 30B illustrate cross-sectional views along the A-A line in FIGS. 29A and 30A, respectively. Reference numerals as in FIGS. 21A-21D are repeated for ease of understanding.

Referring to FIGS. 22A and 22B, method 500 at operation 502 (FIG. 5) forms mandrels 602 on a substrate 402. Substrate 402 includes an epitaxial stack 496. Epitaxial stack 496 includes epitaxial layers 492 of a first composition interposed by epitaxial layers 490 of a second composition. The first and second composition can be different. In the illustrated embodiment, epitaxial layers 492 are SiGe and epitaxial layers 490 are silicon (Si). However, other embodiments are possible including those that provide for a first composition and a second composition having different oxidation rates and/or etch selectivity. For example, in some embodiments, either of epitaxial layers 490/492 of the first composition or the second composition may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. In some embodiments, epitaxial layers 490/492 are substantially dopant-free (i.e., having an extrinsic dopant concentration from about 0 cm-3 to about 1×1017 cm-3), where for example, no intentional doping is performed during the epitaxial growth process. In some embodiments, the epitaxially grown layers such as, epitaxial layers 490 include the same material as substrate 402. Substrate 402 is a crystalline substrate and epitaxial layers 490/492 are crystalline semiconductor layers.

Still referring to FIGS. 22A and 22B, in the illustrated embodiment, epitaxial stack 496 covers p-wells 412A/412B in both circuit region 404 and well strap region 406, but only covers n-well 410 in well strap region 406. It is still bulk semiconductor material of substrate 402 above n-well 410 in circuit region 404. By way of example, epitaxial stack 496 may first be formed over device 400, such that epitaxial growth of the epitaxial layers 490/492 of the first composition or the second composition may be performed by a molecular beam epitaxy (MBE) process, a metalorganic chemical vapor deposition (MOCVD) process, and/or other suitable epitaxial growth processes. Then circuit region 404 above n-well 410 is etched in an etching process to remove epitaxial stack 496, such by through openings of an etch mask that covers well strap region 406 and circuit region 404 above p-wells 412A/412B. Subsequently, bulk semiconductor material (e.g., same semiconductor material as in substrate 402) is epitaxially grown in the etched area, such as by a MBE process, a MOCVD process, and/or other suitable epitaxial growth processes.

In some embodiments, each epitaxial layer 492 has a thickness ranging from about 2 nanometers (nm) to about 6 nm. Epitaxial layers 492 may be substantially uniform in thickness. Yet in the illustrated embodiment, the top epitaxial layer 492 is thinner (e.g., half the thickness) than other epitaxial layers 492 thereunder. The top epitaxial layer 492 functions as a capping layer providing protections to other epitaxial layers in subsequent processes. In some embodiments, each epitaxial layer 490 has a thickness ranging from about 6 nm to about 12 nm. In some embodiments, epitaxial layers 490 of the stack are substantially uniform in thickness. As described in more detail below, epitaxial layers 490 or portions thereof may form channel layer(s) of the subsequently-formed GAA transistors and the thickness is chosen based on device performance considerations. Epitaxial layers 492 in channel regions(s) may eventually be removed and serve to define a vertical distance between adjacent channel region(s) for a subsequently-formed GAA transistor and the thickness is chosen based on device performance considerations. Accordingly, epitaxial layers 492 may also be referred to as sacrificial layers, and epitaxial layers 490 may also be referred to as channel layers.

It is noted that four (4) layers of epitaxial layers 492 and three (3) layers of epitaxial layers 490 are alternately arranged as illustrated in FIGS. 22A and 22B, which is for illustrative purposes only and not intended to be limiting beyond what is specifically recited in the claims. It can be appreciated that any number of epitaxial layers can be formed in epitaxial stack 496; the number of layers depending on the desired number of channels regions for a GAA transistor. In some embodiments, the number of epitaxial layers 490 is between 2 and 10 (FIG. 21D illustrates two (2) layers of epitaxial layers 490). It is also noted that while epitaxial layers 490, 492 are shown as having a particular stacking sequence, where an epitaxial layer 492 is the topmost layer of epitaxial stack 496, other configurations are possible. For example, in some cases, an epitaxial layer 490 may alternatively be the topmost layer of epitaxial stack 496. Stated another way, the order of growth for the epitaxial layers 490, 492, and thus their stacking sequence, may be switched or otherwise be different than what is shown in the figures, while remaining within the scope of the present disclosure.

Referring to FIGS. 23A and 23B, at operation 504, method 500 (FIG. 5) forms spacers 612 on sidewalls of mandrels 602. Spacers 612 can be formed by various processes, including a deposition process and an etching process. The deposition process may include depositing spacers 612 as a blanket layer covering mandrels 602 and hard mask 610 by any suitable technique including thermal growth, CVD, PVD, and ALD. The etching process may include an anisotropic etch such as plasma etch. The anisotropic etch removes majority of the horizontal portions of the blanket layer from top surfaces of hard mask 610 and mandrels 602, while vertical portions of the blanket layer remains on sidewalls of mandrels 602 as spacers 612.

Figure 24A:
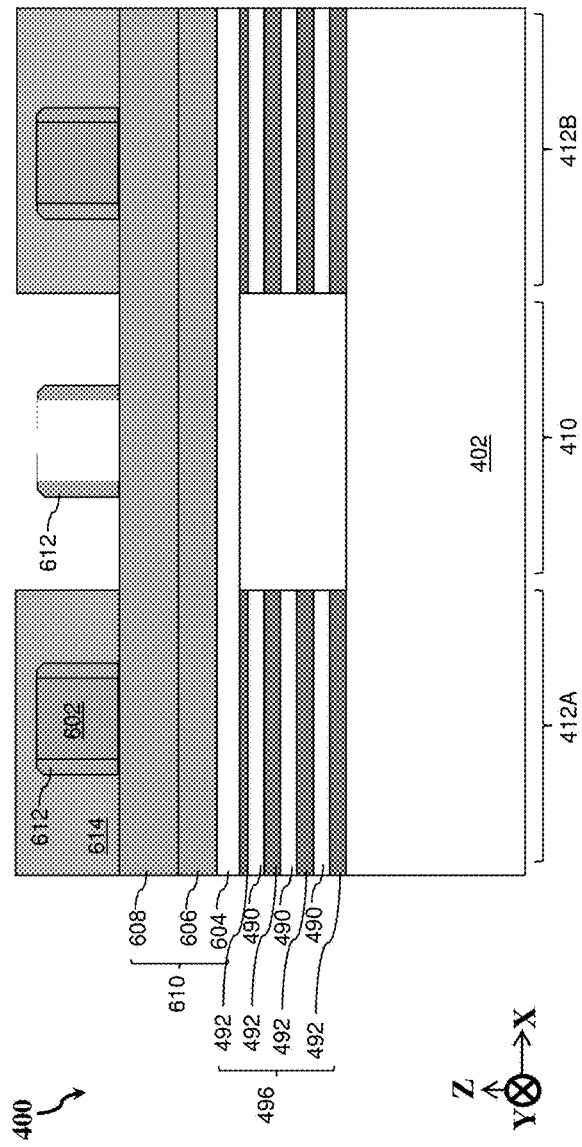
Figure 24B:
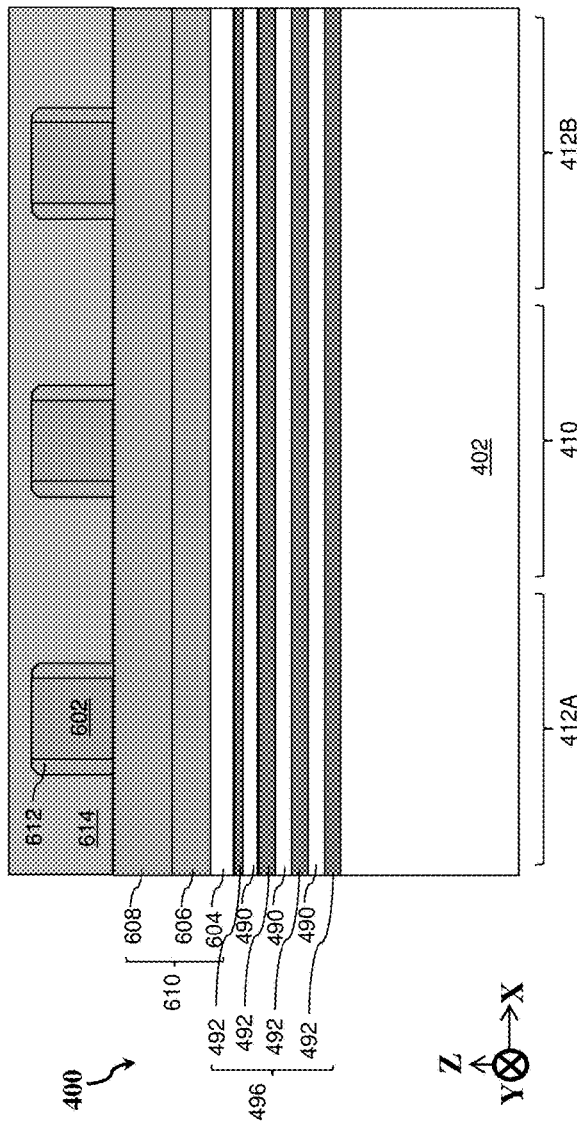

Referring to FIGS. 24A and 24B, at operation 506, method 500 (FIG. 5) removes mandrels 602 from above n-well 410 in circuit region 404. Spacers 612 remain over the hard mask 610 after the mandrels 602 has been removed from above n-well 410 in the circuit region 404, e.g., by an etching process selectively tuned to remove the dielectric material of mandrels 602 but not the dielectric material of spacers 612. The etching process can be a wet etching, a dry etching, or a combination thereof. A resist layer 614 may be formed covering mandrels 602 in the well strap region 406 and above p-wells 412A/412B in the circuit region 404 prior to the etching process, such that mandrels 602 in these areas remain. The resist layer 614 is subsequently removed after operation 506, for example, by a resist stripping process or other suitable process.

Referring to FIGS. 25A and 25B, method 500 (FIG. 5) may optionally proceed to operation 508 to trim widths of spacers 612 in circuit region 404 (or together with mandrels 602 in both circuit region 404 and well strap region 406). In an embodiment, a dielectric liner 616 is deposited as a blanket layer covering device 400 by any suitable technique including thermal growth, CVD, PVD, and ALD. Then an etching process that includes an anisotropic etch such as plasma etch is applied to remove majority of the horizontal portions of the blanket layer from top surfaces of hard mask 610, spacers 612, and mandrels 602, while vertical portions of the blanket layer remain on sidewalls of spacers 612 and mandrels 602 as dielectric liner 616.

At operation 510, method 500 (FIG. 5) etches epitaxial stack 496 and substrate 402 to form continuous fin lines. Referring to FIGS. 26A and 26B, at operation 510, hard mask 610 is etched by using spacers 612 and mandrels 602 as an etch mask to form a patterned hard mask 610. The etching process may include multiple etching steps. Spacers 612 and mandrels 602 may subsequently be removed by a wet etching process, a dry etching process, or a combination thereof. Referring to FIGS. 27A and 27B, after patterned hard mask 610 is formed, the substrate 402 is etched using patterned hard mask 610 to define fin lines 420. The etching processes may include any suitable etching technique such as wet etching, dry etching, RIE, ashing, and/or other etching methods. The remaining portions of the semiconductor layers become fin lines 420.

A top view of the resultant structure after operation 510 is shown in FIG. 28A. Multiple fin lines 420 are created by patterning substrate 402 at operation 510. Fin lines 420 extend continuously lengthwise from circuit region 404 to well strap region 406 along a y-direction. Each fin line 420 includes multiple sections connected to form a continuous piece. For example, referring to FIG. 28B for a cross-sectional view along the A-A line of FIG. 29A, fin line 420 over n-well 410 includes a fin portion 420C in circuit region 404, a fin portion 420H in well strap region 406, and a middle portion 420CH connecting fin portions 420C and 420H. Middle portion 420CH extends across regions 404 and 406. Since fin portion 420C is defined by a spacer 612 and fin portion 420H is defined by a mandrel 602, a width W1 of fin portion 420C is smaller than a width W2 of fin portion 420H. As discussed above, a ratio between W2 and W1 ranges from about 1.5:1 to about 5:1 in various embodiments. In the illustrated embodiment, width W2 of fin portion 420H substantially equals to a fin pitch P of the adjacent fin portions above n-well 410. As a comparison, fin lines 420 above p-wells 412A/412B continuously extend from circuit region 404 to well strap region 406 with substantially same width W2. As will be explained in further detail below, fin lines 420 will be divided into multiple fins by a fin cut process defined in cut windows 620.

Referring to FIGS. 29A and 29B, at operation 512, method 500 (FIG. 5) performs a fin cut process to cut fin lines 420 into fins. FIG. 29A is a top view of the alternative embodiment of device 400 and FIG. 29B is a cross-sectional view along the A-A line of FIG. 29A. In the present embodiment, the fin cut process includes a lithography process and an etching process. For example, a photoresist layer is formed on device 400 using a spin-coating process and soft baking process. Then, the photoresist layer is exposed to a radiation. The exposed photoresist layer is subsequently developed and stripped thereby forming a patterned photoresist layer defining cut windows (openings) 620. Fin lines 420 are partially protected by the patterned photoresist layer. Subsequently, fin lines 420 are etched through the openings of the patterned photoresist layer. The patterned photoresist layer is removed thereafter using a suitable process, such as wet stripping or plasma ashing.

Still referring to FIGS. 29A and 29B, in the illustrated embodiment, four fins 420A, 420C, 420D, 420E are formed in circuit region 404. Three fins 420G, 420H, 420I are formed in the well strap region 406. Top portions of fins 420A, 420E, 420G, 420H, 420I include epitaxial stack 496; fins 420C, 420D include bulk semiconductor material, such as the same semiconductor material as in substrate 402. The fin cut process may also trim end portions of some fins, such as fins 420C and 420D, as illustrated in FIG. 29A. The portions of the fin line 420 (e.g., middle portion 420CH) covered by the cut windows 620 are substantially removed. However, as shown in FIG. 29B, small portions of the fin lines 420 under the cut windows 620 may remain because fin etching process typically does not completely etch to the bottom of fin lines 420 to avoid over-etching of substrate 402. The small residual portions of fin line 420 are referred to as fin stubs because they are much shorter (along a z-direction) than the regular fins. For example, fin stub 420CH connects a bottom portion of fin 420C and fin 420H. There are other fin stubs shown in FIG. 29B, though not labeled.

Referring to FIGS. 30A and 30B, the method 500 (FIG. 5) forms a dielectric liner 622 at operation 514 and isolation feature (e.g., STI features) 408 at operation 516. In some embodiments, dielectric liner 622 is part of STI features 408. In some embodiments, dielectric liner 622 is disposed conformally on top and sidewall surfaces of fins 420 using processes such as, CVD process, a subatmospheric CVD (SACVD) process, a flowable CVD process, an ALD process, a PVD process, or other suitable process. STI features 408 is disposed on the substrate 402 interposing fins 420. By way of example, in some embodiments, a dielectric layer is first deposited over the substrate 402, filling the trenches between fins 420 with dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a SACVD process, a flowable CVD process, an ALD process, a PVD process, and/or other suitable process. In some embodiments of forming the isolation (STI) features, after deposition of the dielectric layer, the deposited dielectric material is thinned and planarized, for example by a chemical mechanical polishing (CMP) process. In some embodiments, nitride layer 606 and first oxide layer 604 function as a CMP stop layer. Subsequently, the dielectric layer interposing fins 420 are recessed. STI features 408 are recessed providing fins 420A-420I extending above STI features 408. In some embodiments, the recessing process may include a dry etching process, a wet etching process, and/or a combination thereof. In some embodiments, a recessing depth is controlled (e.g., by controlling an etching time) so as to result in a desired height of the exposed upper portion of fins 420. Particularly, STI features 408 is recessed to be level or below the bottommost layer of epitaxial stack 496.

Figure 31A:
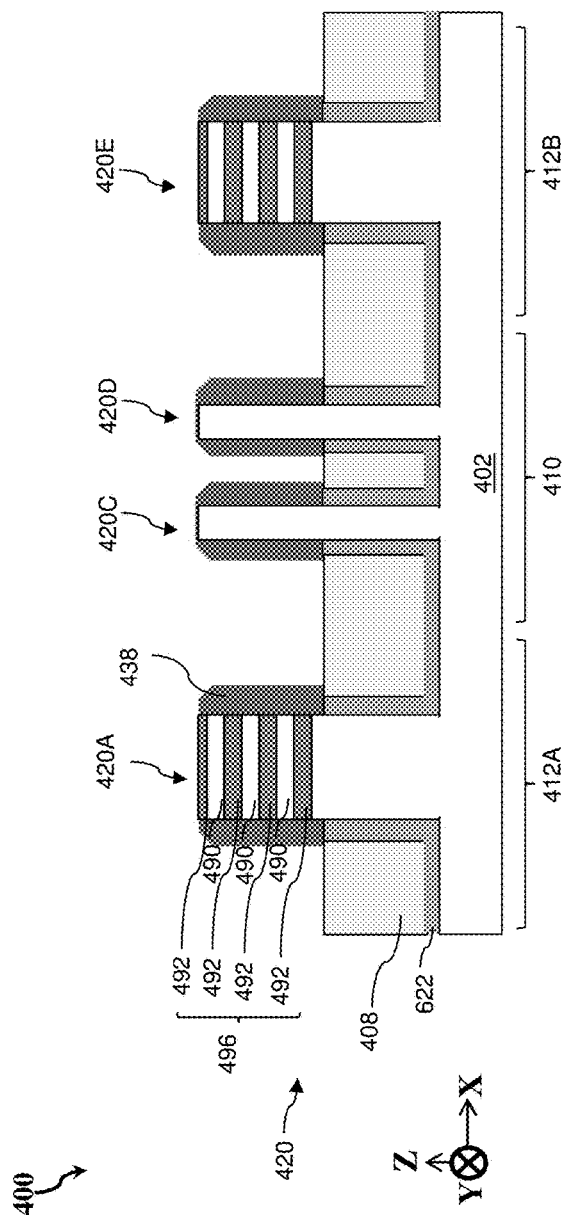
Figure 31B:
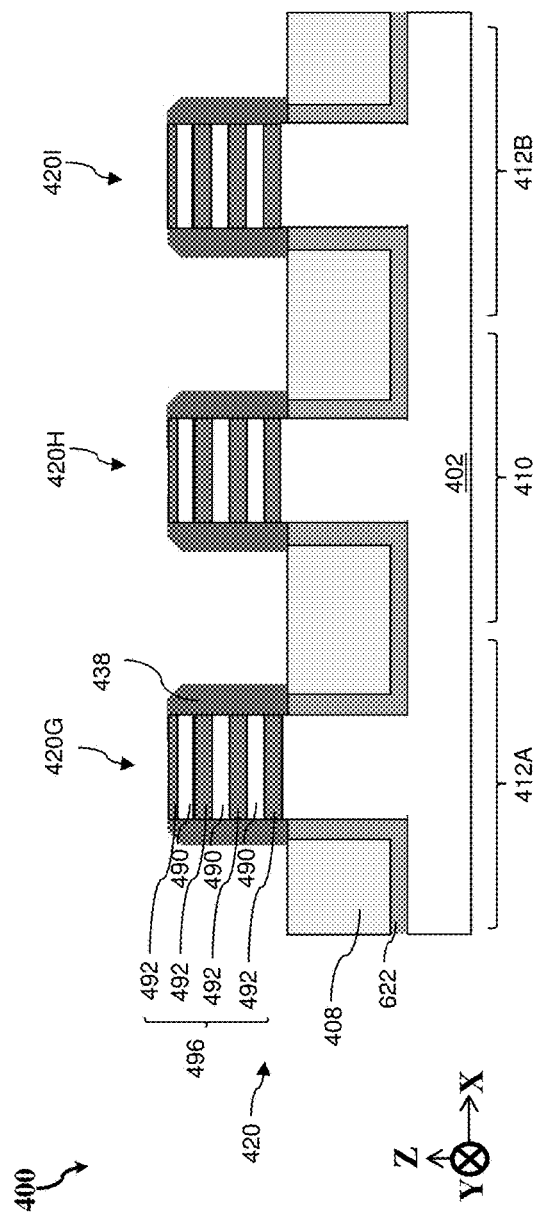

Referring to FIGS. 31A and 31B, at operation 518, method 500 (FIG. 5) forms gate stacks (not shown) and gate spacers 438 on sidewalls of dummy gate stacks. In an embodiment, the gate stacks are dummy (sacrificial) gate stack that are subsequently removed. By way of example, gate spacers 438 may be formed by conformally depositing a dielectric material over device 400 using processes such as a CVD process, a subatmospheric CVD (SACVD) process, a flowable CVD process, an ALD process, a PVD process, or other suitable process. Following the conformal deposition of the dielectric material, portions of the dielectric material used to form gate spacers 438 may be etched-back to expose portions of fins 420 not covered by the dummy gate stacks (e.g., for example, in source/drain regions). In some cases, the etch-back process removes majority of horizontal portions of dielectric material, thereby exposing top surfaces of fins 420. In some embodiments, the etch-back process may include a wet etch process, a dry etch process, a multiple-step etch process, and/or a combination thereof. It is noted that after the etch-back process, in source/drain regions gate spacers 438 remain disposed on sidewalls of fins 420.

Figure 32A:
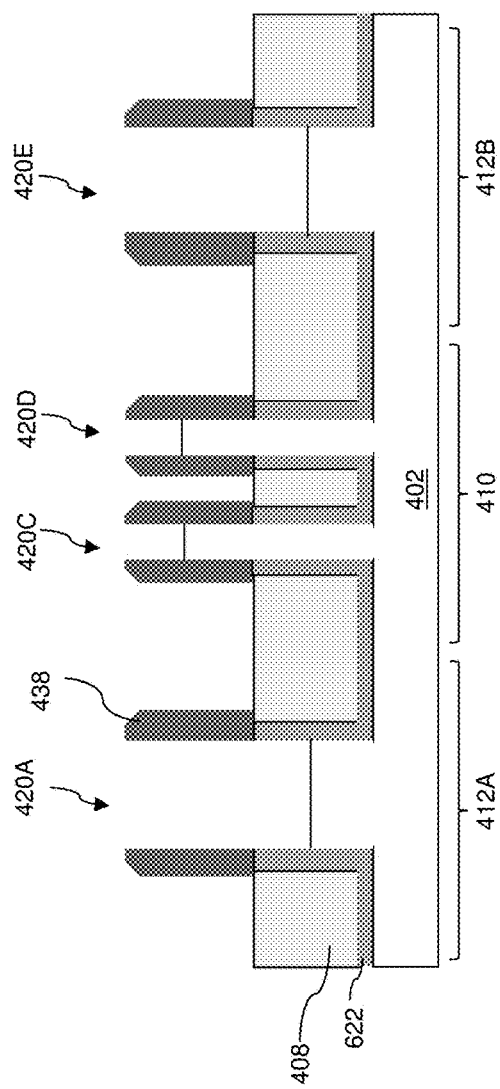
Figure 32B:
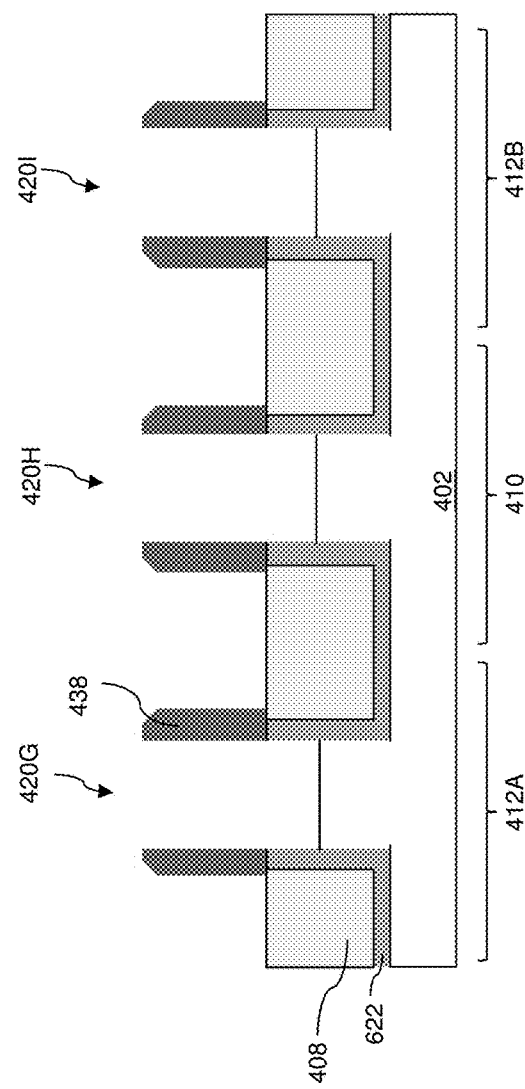
Figure 34:
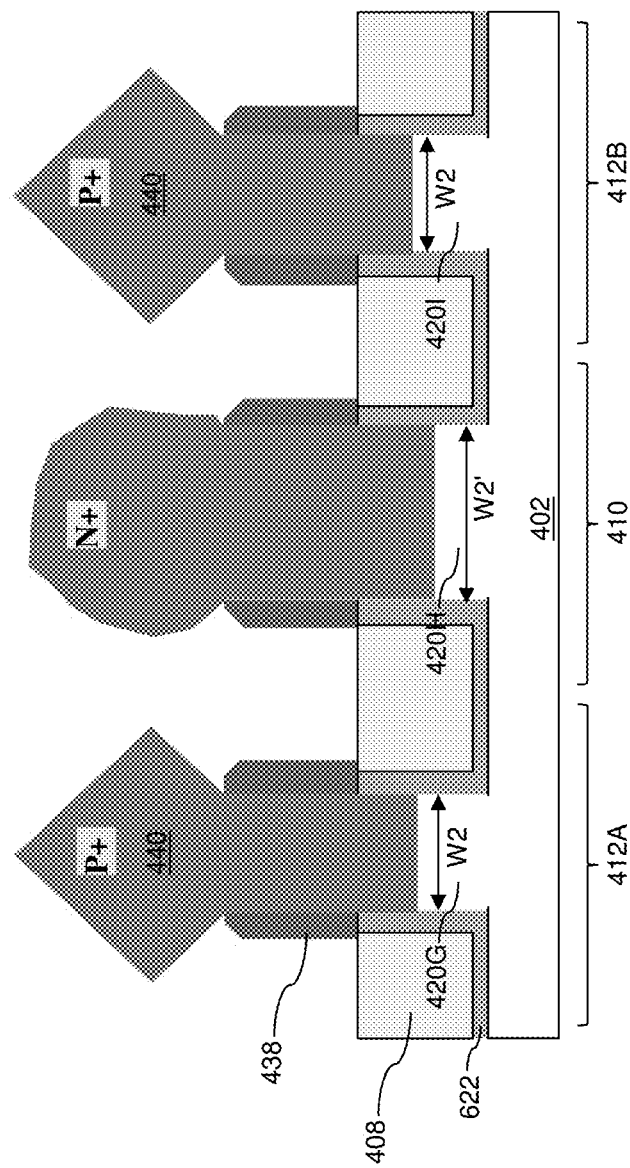

At operation 520, the method 500 (FIG. 5) forms epitaxial S/D features 440 in source/drain regions of fins 420. Referring to FIGS. 32A and 32B, in some embodiments of operation 520, a source/drain etch process is performed prior to the forming of epitaxial S/D features 440. A source/drain etch process is performed to remove portions of fins 420 not covered by the dummy gate stacks (e.g., in source/drain regions). In some embodiments, the source/drain etch process may include a dry etching process, a wet etching process, and/or a combination thereof. Since fins 420A, 420E, 420G, 420H, 420I has larger width than fins 420C, 420D, the recesses over wider fins have larger openings and consequently less etch loading effect during recessing wider fins than narrower fins. Thus, etch rate of fins 420A, 420E, 420G, 420H, 420I is larger than fins 420C, 420D. Accordingly, fins 420A, 420E, 420G, 420H, 420I are recessed faster than fins 420C, 420D. In the illustrated embodiment, top surfaces of fins 420A, 420E, 420G, 420H, 420I are recessed below STI features 408, while top surfaces of fins 420C, 420D are still above STI features 408. In the illustrated embodiment, fins 420A, 420E, 420G, 420H, 420I are recessed in a way such that epitaxial stack 496 is removed from source/drain regions of fins 420A, 420E, 420G, 420H, 420I during operation 520; while epitaxial stack 496 remain in top portions of fins 420A, 420E, 420G, 420H, 420I in respective channel regions. Referring to FIGS. 33A and 33B, in an embodiment of operation 520, epitaxial S/D features 440 are formed in source/drain regions adjacent to and on either side of the dummy gate stacks. For example, epitaxial S/D features 440 may be formed over the exposed top portions of fins 420 and in contact with the adjacent gate spacers 438. In some embodiments, epitaxial S/D features 440 are formed by epitaxially growing a semiconductor material layer in the source/drain regions. In various embodiments, epitaxial S/D features 440 may include Ge, Si, GaAs, AlGaAs, SiGe, GaAsP, SiP, or other suitable material. Epitaxial S/D features 440 may be in-situ doped during the epitaxial process by introducing doping species including: p-type dopants, such as boron or $BF_2$; n-type dopants, such as phosphorus or arsenic; and/or other suitable dopants including combinations thereof. If epitaxial S/D features 440 are not in-situ doped, an implantation process (i.e., a junction implant process) is performed to dope epitaxial S/D features 440. In an exemplary embodiment, epitaxial S/D features 440 over fins 420A, 420E, 420H include n-type dopant, while epitaxial S/D features 440 over fins 420C, 420D, 420G, 420I include p-type dopant. Due to larger fin width and lower fin top surfaces, epitaxial S/D features 440 over fins 420A, 420E, 420G, 420H, 420I generally have larger volume than epitaxial S/D features 440 over fins 420C, 420D. In some embodiments, neighboring epitaxial S/D features 440 may merge, forming a merged epitaxial S/D feature spanning over more than one fin, such as epitaxial S/D features 440 over fins 420C and 420D in the illustrated embodiment. Notably, although cross sections of epitaxial S/D features 440 in FIGS. 33A and 33B are depicted as in rhombus-shape or hexagon-shape, it is not limiting that various other shapes are possible. For example, FIG. 34 illustrates in a well-strap region epitaxial S/D features 440 over fins 420G and 420I have a rhombus-shape, while epitaxial S/D feature 440 over fin 420H has a bar-like shape. Also, epitaxial S/D features 440 over fins 420G and 420I may be higher or lower than epitaxial S/D feature 440 over fin 420H in some embodiments. Further, as illustrated in FIG. 34, a width W2' of fin 420H may be larger than widths W2 of fins 420G and 420I, such as about 10% to about 30% larger, to further reduce strap resistance for n-well 410, which generally has narrower width and accordingly larger well resistance than p-well 412. If the extra width is less than 10%, it may not effectively mitigate the larger well resistance of n-well 410. If the extra width is larger than 30%, it may unnecessarily increase a memory cell width and increase circuit area and fabrication costs. Due to larger width W2', a top surface fin 420H may be lower than top surfaces of fins 420G and 420I after the recess etching.

At operation 522, the method 500 (FIG. 5) perform further processes to finish a functional circuit. The device 400 may undergo further processing to form various features and regions known in the art. For example, the dummy gate stacks may be removed to form gate trenches and epitaxial layers 492 in epitaxial stack 496 are selectively etched from gate trenches thereby exposing channel layers 490. Inner spacers 494 may be formed before high-k metal-gate stacks are deposited in gate trenches wrapping channel layers 490. As a resultant structure, in circuit region 404, GAA transistors are formed on fins 420A and 420E, and FinFETs are formed on fins 420C and 420D. Furthermore, silicidation or germano-silicidation may be formed on the epitaxial S/D features 440. Subsequent processes may form contact openings, contact metal, as well as various contacts/vias/lines and multilayers interconnect features (e.g., metal layers and interlayer dielectrics) on substrate 402, configured to connect the various features to form a functional circuit that may include one or more memory devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Although not intended to be limiting, one or more embodiments of the present disclosure provide many benefits to a semiconductor device and the formation thereof. For example, embodiments of the present disclosure provide reduced well pick-up resistance in well strap regions of a memory macro, by enlarging fin width in fin-based well straps and increasing epitaxial volume in fin-based well straps. Well pick-up resistance reduction in about 1 to 2 orders has be observed by introducing the illustrated improvements in well strap regions. Further, embodiments of the present disclosure can be readily integrated into existing semiconductor manufacturing processes.

In one exemplary aspect, the present disclosure is directed to an integrated circuit device. The integrated circuit device includes a FinFET disposed over a doped region of a first type dopant, wherein the FinFET includes a first fin structure and first source/drain (S/D) features, the first fin structure having a first width; and a fin-based well strap disposed over the doped region of the first type dopant, wherein the fin-based well strap includes a second fin structure and second S/D features, the second fin structure having a second width that is larger than the first width, wherein the fin-based well strap connects the doped region to a voltage. In some embodiments, a ratio between the second width and the first width ranges from about 1.5:1 to about 5:1. In some embodiments, the second fin structure overlaps with an imaginary extend line along a lengthwise direction of the first fin structure. In some embodiments, the first S/D features are doped with a second type dopant and the second S/D features are doped with the first type dopant. In some embodiments, the first type dopant is an n-type dopant and the second type dopant is a p-type dopant. In some embodiments, the first type dopant is a p-type dopant and the second type dopant is an n-type dopant. In some embodiments, the integrated circuit device further includes a fin stub disposed over the doped region, wherein the fin stub connects a bottom portion of the first fin structure with a bottom portion of the second fin structure. In some embodiments, the fin stub has a first portion in proximity to the first fin structure and a second portion in proximity to the second fin structure, and the first portion of the fin stub has the first width and the second portion of the fin stub has the second width. In some embodiments, the FinFET is a first FinFET, the fin-based well strap is a first fin-based well strap, the doped region is a first doped region, and the voltage is a first voltage, the integrated circuit device further includes a second FinFET disposed over a second doped region of a second type dopant, wherein the second FinFET includes a third fin structure and third S/D features, the third fin structure having a third width; and a second fin-based well strap disposed over the second doped region, wherein the second fin-based well strap includes a fourth fin structure and fourth S/D features, the fourth fin structure having a fourth width that is larger than the first width, wherein the second fin-based well strap connects the second doped region to a second voltage that is different from the first voltage. In some embodiments, the fourth width substantially equals the second width, and wherein the third width substantially equals the first width. In some embodiments, each of the third and fourth widths substantially equals the second width.

In another exemplary aspect, the present disclosure is directed to an integrated circuit device. The integrated circuit device includes an n-type well disposed in a substrate, the n-type well being doped with an n-type dopant; a first transistor disposed over the n-type well, wherein the first transistor has a first fin structure and a first gate structure disposed over the first fin structure, such that the first gate structure interposes first source/drain (S/D) features of the first transistor; a first well strap disposed over the n-type well, wherein the first well strap has a second fin structure electrically connected to the n-type well and a second gate structure disposed over the second fin structure, such that the second gate structure interposes second S/D features of the first well strap; a p-type well disposed in the substrate and abut the n-type well, the p-type well being doped with a p-type dopant; a second transistor disposed over the p-type well, wherein the second transistor has a third fin structure and a third gate structure disposed over the third fin structure, such that the third gate structure interposes third S/D features of the second transistor; and a second well strap disposed over the p-type well, wherein the second well strap has a fourth fin structure electrically connected to the p-type well and a fourth gate structure disposed over the fourth fin structure, such that the fourth gate structure interposes fourth S/D features of the second well strap, wherein each of the second and fourth fin structures is wider than the first fin structure. In some embodiments, each of the second and fourth fin structures is wider than the third fin structure. In some embodiments, the second, third, and fourth fin structures have substantially a same width. In some embodiments, the third fin structure is wider than the first fin structure, and wherein the first fin structure includes a plurality of semiconductor channel layers that are vertically stacked. In some embodiments, the second S/D features have larger volume than the first S/D features.

In yet another exemplary aspect, the present disclosure is directed to a method of forming a semiconductor device. The method includes providing a substrate including a well doped with a first type dopant, the well extending lengthwise in a first direction; forming a mandrel over the well, the mandrel extending lengthwise in the first direction; forming spacers on sidewall of the mandrel; removing a first portion of the mandrel that is above a first region of the well, wherein a second portion of the mandrel that is above a second region of the well remains; patterning the substrate using the spacers above the first region of the well and the mandrel above the second region of the well as a patterning mask, thereby forming a fin line over the first and second region; and performing a fin cut process to remove a middle portion of the fin line, thereby forming a first fin above the first region of the well and a second fin above the second region of the well, wherein the second fin is wider than the first fin along a second direction perpendicular to the first direction. In some embodiments, the method further includes forming first source/drain (S/D) features over the first fin and second S/D features over the second fin, wherein the second S/D features have larger volume than the first S/D features; and electrically connecting the second S/D features to a voltage. In some embodiments, the first S/D features are doped with a second type dopant that is different from the first type dopant, and wherein the second S/D features are doped with the first type dopant. In some embodiments, the substrate is provided with a bulk semiconductor material above the first region of the well and a stack of semiconductor layers above the second region of the well, wherein the stack includes the semiconductor layers of first and second types alternatingly disposed in a vertical direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device comprising:
   a first FinFET disposed over a doped region of a first type dopant, wherein the first FinFET includes a first fin structure and first source/drain (S/D) features, the first fin structure having a first width;
   a second FinFET disposed over the doped region, wherein the second FinFET includes a second fin structure and second source/drain (S/D) features, the second fin structure having a second width;
   a fin-based well strap disposed over the doped region, wherein the fin-based well strap includes a third fin structure and third S/D features, the third fin structure having a third width that is larger than either of the first width or the second width, wherein the fin-based well strap is configured to bias the doped region to a bias voltage;
   a first fin stub connecting a bottom portion of the first fin structure with a bottom portion of the third fin structure; and
   a second fin stub connecting a bottom portion of the second fin structure with the bottom portion of the third fin structure.

2. The integrated circuit device of claim 1, wherein a ratio between the third width and the first width ranges from about 1.5:1 to about 5:1.

3. The integrated circuit device of claim 1, wherein the third fin structure overlaps with an imaginary extend line along a lengthwise direction of the first fin structure.

4. The integrated circuit device of claim 1, wherein the first S/D features are doped with a second type dopant and the third S/D features are doped with the first type dopant.

5. The integrated circuit device of claim 4, wherein the first type dopant is an n-type dopant and the second type dopant is a p-type dopant.

6. The integrated circuit device of claim 4, wherein the first type dopant is a p-type dopant and the second type dopant is an n-type dopant.

7. The integrated circuit device of claim 1, wherein the fin-based well strap is a first fin-based well strap, the doped region is a first doped region, and the bias voltage is a first bias voltage, the integrated circuit device further comprising:
   a third FinFET disposed over a second doped region of a second type dopant, wherein the third FinFET includes a fourth fin structure and fourth S/D features, the fourth fin structure having a fourth width; and
   a second fin-based well strap disposed over the second doped region, wherein the second fin-based well strap includes a fifth fin structure and fifth S/D features, the fifth fin structure having a fifth width that is larger than the fourth width, wherein the second fin-based well strap is configured to bias the second doped region to a second bias voltage that is different from the first bias voltage.

8. The integrated circuit device of claim 7, wherein the fourth width substantially equals the second width, and wherein the third width substantially equals the fifth width.

9. The integrated circuit device of claim 7, wherein each of the fourth and fifth widths substantially equals the third width.

10. An integrated circuit device comprising:
    an n-type well disposed in a substrate, the n-type well being continuous and doped with an n-type dopant;

a first transistor disposed over the n-type well, wherein the first transistor has a first fin structure and a first gate structure disposed over the first fin structure, such that the first gate structure interposes first source/drain (S/D) features of the first transistor;
a first well strap disposed over the n-type well, wherein the first well strap has a second fin structure electrically connected to the n-type well and a second gate structure disposed over the second fin structure, such that the second gate structure interposes second S/D features of the first well strap;
a p-type well disposed in the substrate and abut the n-type well, the p-type well being continuous and doped with a p-type dopant;
a second transistor disposed over the p-type well, wherein the second transistor has a third fin structure and a third gate structure disposed over the third fin structure, such that the third gate structure interposes third S/D features of the second transistor; and
a second well strap disposed over the p-type well, wherein the second well strap has a fourth fin structure electrically connected to the p-type well and a fourth gate structure disposed over the fourth fin structure, such that the fourth gate structure interposes fourth S/D features of the second well strap,
wherein a bottom surface of the second S/D features is below a bottom surface of the first S/D features, wherein each of the second and fourth fin structures is wider than the first fin structure, and wherein a center line of the first fin structure is offset and parallel to a center line of the second fin structure.

11. The integrated circuit device of claim 10, wherein each of the second and fourth fin structures is wider than the third fin structure.

12. The integrated circuit device of claim 10, wherein the second, third, and fourth fin structures have substantially a same width.

13. The integrated circuit device of claim 10, wherein the third fin structure is wider than the first fin structure, and wherein the first fin structure includes a plurality of semiconductor channel layers that are vertically stacked.

14. The integrated circuit device of claim 10, wherein the second S/D features have larger volume than the first S/D features.

15. A memory circuit comprising:
a first FinFET disposed over a doped region of a first type dopant, wherein the first FinFET includes a first fin structure and first source/drain (S/D) features disposed on the first fin structure, the first S/D features having a first volume;
a fin-based well strap disposed over the doped region of the first type dopant, wherein the fin-based well strap includes a second fin structure and second S/D features disposed on the second fin structure, the second S/D features having a second volume that is larger than the first volume, wherein the fin-based well strap connects the doped region to a voltage node of the memory circuit, wherein a bottom surface of the second S/D features is below a bottom surface of the first S/D features; and
a second FinFET disposed over the doped region of the first type dopant, wherein the second FinFET includes a third fin structure and third S/D features disposed on the third fin structure, the doped region of the first type dopant is continuous, and a center line of the second fin structure is located between a center line of the first fin structure and a center line of the third fin structure.

16. The memory circuit of claim 15, wherein the first S/D features are doped with a second type dopant opposite to the first type dopant, and wherein the second S/D features are doped with the first type dopant.

17. The memory circuit of claim 15, wherein the first fin structure is connected to the second fin structure through a fin stub.

18. The memory circuit of claim 15, wherein
the third S/D features having a third volume, wherein the third fin structure is parallel to the second fin structure, and wherein the third volume substantially equals the first volume.

19. The integrated circuit device of claim 1, wherein the first width substantially equals the second width.

20. The integrated circuit device of claim 1, wherein a center line of the third fin structure is located between a center line of the first fin structure and a center line of the second fin structure.

* * * * *